US012696614B2

(12) United States Patent
Kang et al.

(10) Patent No.: US 12,696,614 B2
(45) Date of Patent: Jul. 28, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Namsu Kang, Yongin-si (KR); Dongkyu Lee, Yongin-si (KR); Minkyung Kim, Yongin-si (KR); Minho Park, Yongin-si (KR); Huiju Park, Yongin-si (KR); Jongwon Lee, Yongin-si (KR); Hyunshik Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 1119 days.

(21) Appl. No.: 17/393,870

(22) Filed: Aug. 4, 2021

(65) Prior Publication Data

US 2022/0059793 A1 Feb. 24, 2022

(30) Foreign Application Priority Data

Aug. 20, 2020 (KR) ........................ 10-2020-0104812

(51) Int. Cl.
*H10K 50/15* (2023.01)
*C09K 11/02* (2006.01)
(Continued)

(52) U.S. Cl.
CPC ............ *H10K 50/156* (2023.02); *C09K 11/02* (2013.01); *C09K 11/06* (2013.01);
(Continued)

(58) Field of Classification Search
CPC ............. H10K 50/156; H10K 2101/30; H10K 2102/351; H10K 50/13; H10K 59/32; H10K 50/19
See application file for complete search history.

(56) References Cited

U.S. PATENT DOCUMENTS 8,018,144 B2 9/2011 Yang
8,384,070 B2 2/2013 Kishino
(Continued)

FOREIGN PATENT DOCUMENTS

KR 10-2006-0014044 2/2006
KR 10-2008-0086994 9/2008
(Continued)

OTHER PUBLICATIONS

Machine Translation of WO2013032304A2 (Year: 2013).*

*Primary Examiner* — Jenna N Chandhok
(74) *Attorney, Agent, or Firm* — Lerner David LLP

(57) ABSTRACT

A light-emitting device includes a first electrode, a second electrode, m emitting units, and m−1 charge generation layers. The m emitting units each include a hole transport region, an emission layer, and an electron transport region. At least one emission layer of the m emitting units includes a first emission layer and a second emission layer, and at least one hole transport region adjacent to a p-type charge generation layer includes a multi-layered hole transport layer consisting of a first non-doped layer, a doped layer, and a second non-doped layer. The first non-doped layer and the second non-doped layer each independently consist of a hole transport material, the doped layer includes a hole transport material and a p-dopant, and the hole transport region adjacent to the first electrode does not include the multi-layered hole transport layer. An electronic apparatus including the light-emitting device is also provided.

21 Claims, 3 Drawing Sheets

(51) Int. Cl.

| | |
|---|---|
| ***C09K 11/06*** | (2006.01) |
| ***H10K 85/40*** | (2023.01) |
| ***H10K 85/60*** | (2023.01) |
| ***H10K 101/30*** | (2023.01) |
| ***H10K 102/00*** | (2023.01) |

(52) U.S. Cl.

CPC ................. *C09K 2211/1007* (2013.01); *C09K 2211/1011* (2013.01); *C09K 2211/1014* (2013.01); *H10K 85/40* (2023.02); *H10K 85/615* (2023.02); *H10K 85/631* (2023.02); *H10K 85/633* (2023.02); *H10K 2101/30* (2023.02); *H10K 2102/351* (2023.02)

(56) References Cited

U.S. PATENT DOCUMENTS

| | | | | |
|---|---|---|---|---|
| 8,610,109 | B2 | 12/2013 | Yamazaki et al. | |
| 8,853,715 | B2 | 10/2014 | Matsuda | |
| 8,860,013 | B2 | 10/2014 | Okamoto | |
| 9,093,596 | B2 | 7/2015 | Huo et al. | |
| 9,136,495 | B2 | 9/2015 | Hamada | |
| 9,281,487 | B2 | 3/2016 | Kim et al. | |
| 9,425,422 | B2 | 8/2016 | Kim et al. | |
| 9,793,495 | B2 | 10/2017 | Kim et al. | |
| 10,529,939 | B2 | 1/2020 | Kim | |
| 2006/0014044 | A1* | 1/2006 | Ko | H10K 50/19<br>427/66 |
| 2006/0170037 | A1 | 8/2006 | Yamauchi et al. | |
| 2007/0052346 | A1 | 3/2007 | Iwakuma et al. | |
| 2009/0009072 | A1 | 1/2009 | Wellmann et al. | |
| 2009/0091244 | A1 | 4/2009 | Negishi et al. | |
| 2010/0001301 | A1* | 1/2010 | Karg | H10K 59/878<br>257/40 |
| 2011/0101312 | A1* | 5/2011 | LeCloux | C07D 487/04<br>544/212 |
| 2011/0193130 | A1* | 8/2011 | Naijo | H10K 50/131<br>257/E33.059 |
| 2013/0320368 | A1* | 12/2013 | Seo | H10K 50/13<br>257/89 |
| 2014/0070196 | A1* | 3/2014 | Kim | H10K 50/13<br>257/40 |
| 2016/0056334 | A1* | 2/2016 | Jang | H01L 33/145<br>438/45 |
| 2016/0079558 | A1 | 3/2016 | Moon et al. | |
| 2017/0084855 | A1* | 3/2017 | Kam | H10K 59/32 |
| 2017/0098686 | A1 | 4/2017 | Jeong et al. | |

FOREIGN PATENT DOCUMENTS

| | | | |
|---|---|---|---|
| KR | 10-2009-0092051 | 8/2009 | |
| KR | 10-2013-0025854 | 3/2013 | |
| KR | 10-2014-0034686 | 3/2014 | |
| KR | 10-2015-0015647 | 2/2015 | |
| KR | 10-2016-0022236 | 2/2016 | |
| KR | 10-2016-0031131 | 3/2016 | |
| KR | 10-1657222 | 9/2016 | |
| KR | 10-2017-0040418 | 4/2017 | |
| WO | WO-2013032304 A2 * | 3/2013 | C09K 11/06 |

* cited by examiner

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2020-0104812 under 35 U.S.C. § 119, filed on Aug. 20, 2020 in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Light-emitting devices are self-emission devices that have wide viewing angles, high contrast ratios, short response times, and excellent characteristics in terms of luminance, driving voltage, and response speed, and produce full-color images.

In a light-emitting device, a first electrode is disposed on a substrate, and a hole transport region, an emission layer, an electron transport region, and a second electrode are sequentially formed on the first electrode. Holes provided from the first electrode may move toward the emission layer through a non-luminescent exciton transport region, which does not contribute to luminescence, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

Embodiments include a light-emitting device that has high efficiency and a long lifespan and exhibits a low driving voltage, by introducing a hole transport layer including a p-doped layer therein at a specific position.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, m emitting units disposed between the first electrode and the second electrode, and m−1 charge generation layers disposed between two adjacent ones of the m emitting units and each including an n-type charge generation layer and a p-type charge generation layer, wherein m is an integer of 2 or more, each of the m emitting units includes a hole transport region, an emission layer, and an electron transport region that are sequentially disposed, at least one emission layer of the m emitting units includes a first emission layer and a second emission layer that are sequentially disposed between the first electrode and the second electrode, at least one hole transport region adjacent to the p-type charge generation layer of each of the m−1 charge generation layers includes a multi-layered hole transport layer consisting of a first non-doped layer, a doped layer, and a second non-doped layer that are sequentially stacked, the first non-doped layer and the second non-doped layer each independently consist of a hole transport material, the doped layer includes a hole transport material and a p-dopant, and a hole transport region adjacent to the first electrode does not include the multi-layered hole transport layer.

In an embodiment, m may be an integer of 3 or more.

In an embodiment, each hole transport region may include a hole injection layer, a hole transport layer, an emission auxiliary layer, an electron blocking layer, or any combination thereof. Each electron transport region may include a buffer layer, a hole blocking layer, an electron transport layer, an electron injection layer, or any combination thereof. The at least one hole transport region comprising the multi-layered hole transport layer may not include an emission auxiliary layer and an electron blocking layer.

In an embodiment, a highest occupied molecular orbital (HOMO) energy level of the multi-layered hole transport layer may be in a range of about −5.5 eV to about −5.25 eV.

In an embodiment, the multi-layered hole transport layer may be adjacent to an emission layer.

In an embodiment, the emission layer adjacent to the multi-layered hole transport layer may include the first emission layer and the second emission layer.

In an embodiment, an amount of the p-dopant included in the doped layer of the multi-layered hole transport layer may be in a range of about 0.1 wt % to about 20 wt % based on the total weight of the doped layer.

In an embodiment, a thickness of the doped layer of the multi-layered hole transport layer may be less than about 80% of a total thickness of the multi-layered hole transport layer.

In an embodiment, the second non-doped layer of the multi-layered hole transport layer may be adjacent to an emission layer, and a thickness of the second non-doped layer may be equal to or greater than about 20% of a total thickness of the multi-layered hole transport layer.

In an embodiment, the hole transport materials included in the first non-doped layer, the doped layer, and the second non-doped layer may be identical to or different from each other.

In an embodiment, the first emission layer may include a first compound including at least one deuterium, and the second emission layer may include a second compound that may not include deuterium.

In an embodiment, the first emission layer may include a first dopant, the second emission layer may include a second dopant, and the first dopant and the second dopant may be identical to or different from each other.

In an embodiment, a maximum luminescence wavelength of light emitted from at least one emitting unit of the m emitting units may be different from a maximum luminescence wavelength of light emitted from at least one emitting unit of the remaining emitting units.

In an embodiment, light emitted from each of the m emitting units may have the same maximum luminescence wavelength.

In an embodiment, the at least one emission layer of the m emitting units that includes the first emission layer and the second emission layer may emit blue light having a maximum luminescence wavelength in a range of about 440 nm to about 510 nm.

In an embodiment, the emitting unit including the multilayered hole transport layer may emit blue light having a maximum luminescence wavelength in a range of about 440 nm to about 510 nm.

In an embodiment, the light-emitting device may further include at least one of a first capping layer disposed outside the first electrode, and a second capping layer disposed outside the second electrode. At least one of the first capping layer and the second capping layer may have a refractive index of greater than or equal to about 1.6 at a wavelength of 589 nm.

According to embodiments, an electronic apparatus may include the light-emitting device.

In an embodiment, the electronic apparatus may further include a sealing portion disposed on the light-emitting device, and a touch screen layer, a polarizing layer, a color filter, a color conversion layer, or any combination thereof, disposed on the sealing portion.

In an embodiment, the electronic apparatus may further include quantum dots or an optical member including the quantum dots. The quantum dots or the optical member comprising the quantum dots may be disposed on at least one traveling direction of light emitted from the light-emitting device.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
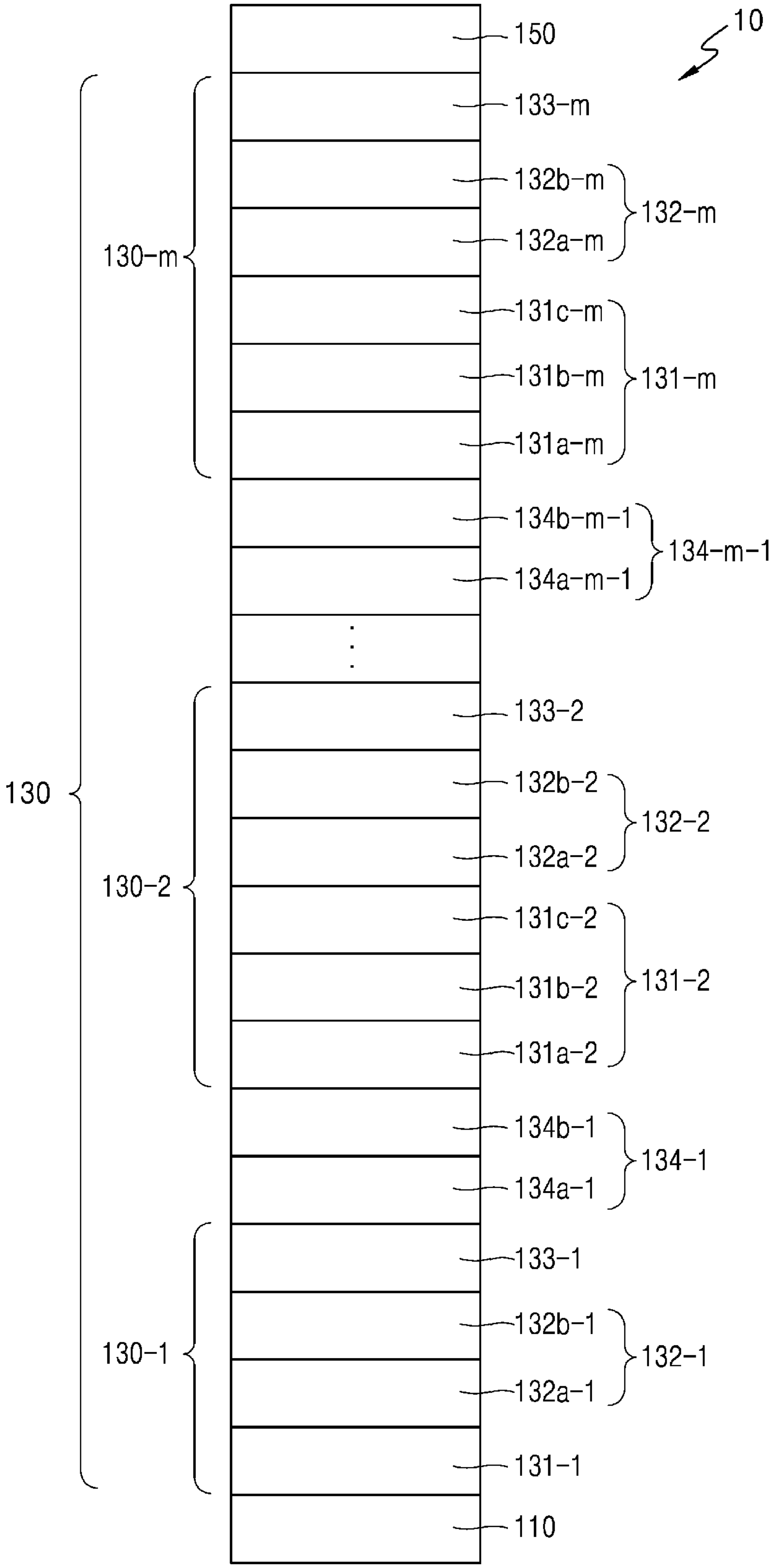
FIG. 1 is a schematic cross-sectional view of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein.

Accordingly, the embodiments are merely described below, by referring to the figures, to explain aspects of the description.

Sizes of elements in the drawings may be exaggerated for convenience of explanation. Therefore, as the sizes and thicknesses of components in the drawings may be arbitrarily illustrated for convenience of explanation, the following embodiments of the disclosure are not limited thereto.

As used herein, the expressions used in the singular such as “a,” “an,” and “the” are intended to include the plural forms as well, unless the context clearly indicates otherwise.

It should be understood that the terms “comprises,” “comprising,” “includes,” “including,” “have,” “having,” “contains,” “containing,” and the like are intended to specify the presence of stated features, integers, steps, operations, elements, components, or combinations thereof in the disclosure, but do not preclude the presence or addition of one or more other features, integers, steps, operations, elements, components, or combinations thereof.

In the description, it will be understood that when an element (a region, a layer, a section, or the like) is referred to as being “on”, “connected to” or “coupled to” another element, it can be directly on, connected or coupled to the other element, or one or more intervening elements may be disposed therebetween.

As used herein, the term “and/or” includes any and all combinations of one or more of the associated listed items. For example, “A and/or B” may be understood to mean “A, B, or A and B.” The terms “and” and “or” may be used in the conjunctive or disjunctive sense and may be understood to be equivalent to “and/or”.

The term “at least one of” is intended to include the meaning of “at least one selected from” for the purpose of its meaning and interpretation. For example, “at least one of A and B” may be understood to mean “A, B, or A and B.” When preceding a list of elements, the term, “at least one of,” modifies the entire list of elements and does not modify the individual elements of the list.

It will be understood that, although the terms “first”, “second”, etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms “below,” “lower,” “above,” “upper,” and the like are used to describe the relationship of the configurations shown in the drawings. The terms are used as a relative concept and are described with reference to the direction indicated in the drawings.

The terms “about” or “approximately” as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, “about” may mean within one or more standard deviations, or within ±20%, 10%, or ±5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification, a method of measuring a highest occupied molecular orbital (HOMO) energy level will be described below, but the method is not limited thereto.

The HOMO energy level is measured by using a cyclic voltammetry device, such as a ZIVE SP2 available from Wonatech. Each sample solution and an electrolyte solution used herein are as follows, ferrocene may be used as a standard material, and $(Bu)_4NPF_6$ is used as an electrolyte:

Sample solution of a compound to be measured: $5\times10^{-3}$ M dichloromethane solution Ferrocene sample solution: $5\times10^{-3}$ M dichloromethane solution $(Bu)_4NPF_6$ electrolyte solution: 0.1 M acetonitrile solution.

An $E_{we}$-I relationship graph of the compound to be measured and the standard material is drawn first, and each tangent line is drawn from points at which current is drastically increased, and voltages of points at which the tangent lines contact an x-axis is recorded. A HOMO energy level of the compound to be measured is calculated by setting a HOMO energy level of ferrocene at −4.8 eV.

An aspect of the disclosure provides a light-emitting device which may include a first electrode, a second electrode facing the first electrode, m emitting units disposed between the first electrode and the second electrode, and m−1 charge generation layers disposed between two adjacent emitting units among the m emitting units and each including an n-type charge generation layer and a p-type charge generation layer, wherein m may be an integer of 2 or more. Each of the m emitting units may include a hole transport region, an emission layer, and an electron transport region, and at least one emission layer of the m emitting units may include a first emission layer and a second emission layer that are sequentially disposed between the first electrode and the second electrode. At least one hole transport region adjacent to the p-type charge generation layer of each of the m−1 charge generation layers may include a multi-layered hole transport layer consisting of a first non-doped layer, a doped layer, and a second non-doped layer that are sequentially stacked. The first non-doped layer and the second non-doped layer may each independently consist of a hole transport material, and the doped layer may include a hole transport material and a p-dopant, wherein a hole transport region adjacent to the first electrode may not include the multi-layered hole transport layer.

FIG. 1 is a schematic cross-sectional view of a light-emitting device 10 according to an embodiment. As shown in FIG. 1, the light-emitting device 10 according to an embodiment includes a first electrode 110, a second electrode 150 facing the first electrode, m emitting units 130-1, 130-2, . . . **130-*m* disposed between the first electrode 110 and the second electrode 150, and m−1 charge generation layers 134-1 . . . 134-*m*−1 disposed between two adjacent emitting units among the m emitting units 130-1, 130-2, . . . 130-*m* and including an n-type charge generation layer 134*a*-1 . . . or 134*a*-*m*−1 and a p-type charge generation layer 134*b*-1 . . . or 134*b*-*m*−1**.

The emitting unit is not particularly limited as long as it is a unit having a function capable of emitting light. In an embodiment, the emitting unit may include at least one emission layer. In embodiments, the emitting unit may further include an organic layer other than an emission layer.

The light-emitting device 10 includes stacked emitting units 130-1, 130-2, . . . **130-*m* in the number of m, wherein m is an integer of 2 or more. For example, m may be an integer of 3 or more. The number of the emitting units, which is m, may be chosen as needed, and the upper limit of the number is not particularly limited. For example, the light-emitting device 10** may include 2, 3, 4, 5, or 6 emitting units.

The light-emitting device 10 includes charge generation layers 134-1 . . . **134-*m*−1 disposed between two adjacent emitting units among the m emitting units 130-1, 130-2, . . . 130-*m***. Here, the expression "adjacent" as used herein refers to an arrangement relationship of the closest layers among the layers mentioned as adjacent layers. For example, the term "two adjacent emitting units" as used herein refers to an arrangement relationship of two emitting units located closest to each other among multiple emitting units. The expression "adjacent" as used herein refers to a case where two layers are physically in contact with each other, and a case where another layer, not mentioned, may be located between the two layers. For example, an emitting unit adjacent to a second electrode refers to an emitting unit located closest to the second electrode among the m emitting units. Here, the second electrode and the emitting unit adjacent thereto may be physically in contact with each other, but layers other than the emitting unit may be located between the second electrode and the emitting unit adjacent thereto. For example, an electron transport layer may be located between the second electrode and the emitting unit adjacent thereto. However, between two adjacent emitting units, a charge generation layer may be located.

The term "charge generation layer" as used herein refers to a layer that serves as a cathode by generating electrons with respect to one of the two adjacent emitting units and that also serves as an anode by generating holes with respect to the other emitting units. The charge generation layer is not directly connected to an electrode, but separates adjacent emitting units. The light-emitting device 10 including m emitting units includes m−1 charge generation layers.

The charge generation layers 134-1 . . . **134-*m*−1 may each include an n-type charge generation layer 134*a*-1 . . . or 134*a*-*m*−1 and a p-type charge generation layer 134*b*-1 . . . or 134*b*-*m*−1. Here, the n-type charge generation layer 134*a*-1 . . . or 134*a*-*m*−1 and the p-type charge generation layer 134*b*-1 . . . or 134*b*-*m*−1 may directly contact each other to form an NP junction. By the NP junction, electrons and holes may be simultaneously generated between the n-type charge generation layer 134*a*-1 . . . or 134*a*-*m*−1 and the p-type charge generation layer 134*b*-1 . . . or 134*b*-*m*−1. The generated electrons may be transferred to one of two adjacent emitting units through the n-type charge generation layer 134*a*-1 . . . or 134*a*-*m*−1. The generated holes may be transferred to the other of the two adjacent emitting units through the p-type charge generation layer 134*b*-1 . . . or 134*b*-*m*−1. The charge generation layers 134-1 . . . 134-*m*−1 each include one n-type charge generation layer 134*a*-1 . . . or 134*a*-*m*−1 and one p-type charge generation layer 134*b*-1 . . . or 134*b*-*m*−1, and in this regard, the light-emitting device 10 including m−1 charge generation layers 134-1 . . . 134-*m*−1 includes m−1 n-type charge generation layers 134*a*-1 . . . or 134*a*-*m*−1 and m−1 p-type charge generation layers 134*b*-1 . . . or 134*b*-*m*−1**.

The n-type refers to n-type semiconductor characteristics, for example, the characteristics of injecting or transporting electrons. The p-type refers to p-type semiconductor characteristics, for example, the characteristics of injecting or transporting holes.

An n-type charge generation material included in the n-type charge generation layer **134*a*-1 . . . or 134*a*-*m*−1 may be a same material as described in connection with the electron transport regions 133-1, 133-2, . . . 133-*m*, and a p-type charge generation material included in the p-type charge generation layer 134*b*-1 . . . or 134*b*-*m*−1 may be a same material as described in connection with the hole transport regions 131-1, 131-2, . . . 131-*m***.

The m emitting units 130-1, 130-2, . . . **130-*m* may each include a hole transport region 131-1, 131-2, . . . or 131-*m*, an emission layer 132-1, 132-2, . . . or 132-*m*, and an electron transport region 133-1, 133-2, . . . or 133-*m* that are sequentially located, wherein m hole transport regions 131-1, 131-2, . . . 131-*m* included in the m emitting units 130-1, 130-2, . . . 130-*m* may each include a hole transport material, and m electron transport regions 133-1, 133-2, . . . 133-*m* included in the m emitting units 130-1, 130-2, . . . 130-*m*** may each include an electron transport material.

The hole transport materials included in the m hole transport regions 131-1, 131-2, . . . **131-*m* may be identical to or different from each other. The electron transport materials included in the m electron transport regions 133-1, 133-2, . . . 133-*m*** may be identical to or different from each other.

At least one of the hole transport regions 131-2 . . . **131-*m* that are respectively adjacent to the m−1 p-type charge generation layers 134*b*-1 . . . 134*b*-*m*−1 may include a multi-layered hole transport layer 131*a*-2 to 131*c*-2, . . . 131*a*-*m* to 131*c*-*m* consisting of a first non-doped layer 131*a*-2 . . . 131*a*-*m*, a doped layer 131*b*-2 . . . 131*b*-*m*, and a second non-doped layer 131*c*-2 . . . 131*c*-*m*** that are sequentially stacked.

The first non-doped layer **131*a*-2 . . . or 131*a*-*m* and the second non-doped layer 131*c*-2 . . . or 131*c*-*m* may each independently consist of a hole transport material, and the doped layer 131*b*-2 . . . or 131*b*-*m* may include a hole transport material and a p-dopant. The first hole transport region 131-1 adjacent to the first electrode 110** does not include the multi-layered hole transport layer.

The hole transport material and the p-dopant will be described below.

In an embodiment, the hole transport regions 131-1, 131-2, . . . **131-*m* may each include a hole injection layer, a hole transport layer, an emission auxiliary layer, an electron blocking layer, or any combination thereof, the electron transport regions 133-1, 133-2, . . . or 133-*m* may each include a buffer layer, a hole blocking layer, an electron transport layer, an electron injection layer, or any combination thereof, and the hole transport region 131-2 . . . or 131-*m*** including the multi-layered hole transport layer may not include an emission auxiliary layer and an electron blocking layer.

In an embodiment, the multi-layered hole transport layer **131*a*-2 to 131*c*-2 . . . or 131*a*-*m* to 131*c*-*m*** may have a highest occupied molecular orbital (HOMO) energy level in a range of about −5.5 eV to about −5.25 eV.

In embodiments, the hole transport region 131-1 not including the multi-layered hole transport layer may have a HOMO energy level in a range of about −4.8 eV to about −5.25 eV.

In an embodiment, the multi-layered hole transport layer **131*a*-2 to 131*c*-2 . . . 131*a*-*m* to 131*c*-*m* may be adjacent to an emission layer 132-2 . . . 132-*m***.

In embodiments, the emission layer 132-2 . . . **132-*m* adjacent to the multi-layered hole transport layer 131*a*-2 to 131*c*-2 . . . 131*a*-*m* to 131*c*-*m* may include a first emission layer 132*a*-2 . . . 132*a*-*m* and a second emission layer 132*b*-2 . . . 132*b*-*m***.

In an embodiment, an amount of the p-dopant included in the doped layer **131*b*-2 . . . or 131*b*-*m* of the multi-layered hole transport layer may be in a range of about 0.1 wt % to about 20 wt % based on the total weight of the doped layer 131*b*-2 . . . or 131*b*-*m***, respectively.

In an embodiment, a thickness of the doped layer **131*b*-2 . . . or 131*b*-*m* of the multi-layered hole transport layer may each be less than about 80% of a total thickness of the multi-layered hole transport layer 131*a*-2 to 131*c*-2 . . . or 131*a*-*m* to 131*c*-*m***, respectively.

In an embodiment, the second non-doped layer **131*c*-2 . . . or 131*c*-*m* of the multi-layered hole transport layer may be adjacent to an emission layer 132-2 . . . or 132-*m*, respectively, and a thickness of the second non-doped layer 131*c*-2 . . . or 131*c*-*m* may each be about 20% or more of a total thickness of the multi-layered hole transport layer 131*a*-2 to 131*c*-2 . . . or 131*a*-*m* to 131*c*-*m***, respectively.

In an embodiment, the hole transport materials included in the first non-doped layer **131*a*-2 . . . or 131*a*-*m*, the doped layer 131*b*-2 . . . or 131*b*-*m*, and the second non-doped layer 131*c*-2 . . . or 131*c*-*m*** may be identical to or different from each other.

In an embodiment, the hole transport material may include a compound represented by Formula 201, a compound represented by Formula 202, or any combination thereof:

[Formula 201]

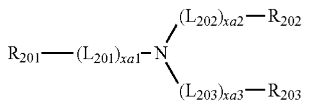

[Formula 202]

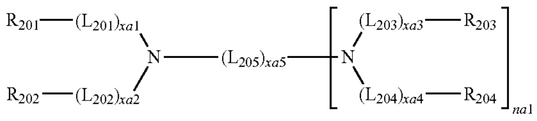

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer of 0 to 5, xa5 may be an integer of 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group) unsubstituted or substituted with at least one $R_{10a}$, $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer of 1 to 4.

In embodiments, the hole transport material may include a compound represented by Formula 211:

$$[Ar_{211}]_{xa11}\text{-}[(L_{211})_{xa6}\text{-}R_{211}]_{xa21}$$ [Formula 211]

wherein, in Formula 211, $Ar_{211}$ and $L_{211}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xa11 may be 1, 2, or 3, xa6 may be an integer of 0 to 5, $R_{211}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{211}$)($Q_{212}$)($Q_{213}$), —N($Q_{211}$)($Q_{212}$), —B($Q_{211}$)($Q_{212}$), —C(=O)($Q_{211}$), —S(=O)$_2$($Q_{211}$), or —P(=O)($Q_{211}$)($Q_{212}$), xa21 may be an integer of 1 to 5, and $Q_{211}$ to $Q_{213}$ may each be the same as described in connection with $Q_1$.

In embodiments, when xa11 in Formula 211 is 2 or more, two or more of $Ar_{211}$(s) may be linked to each other via a single bond.

The hole transport material may be the same as described above.

In embodiments, the hole transport material may be selected from Compounds 101 to 115:

101

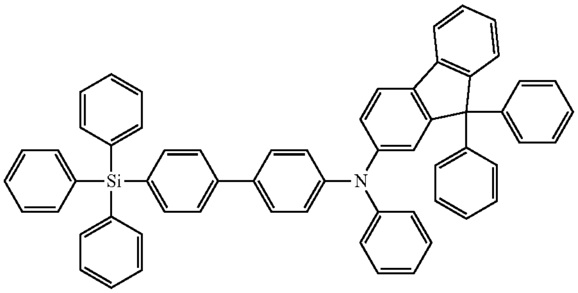

102

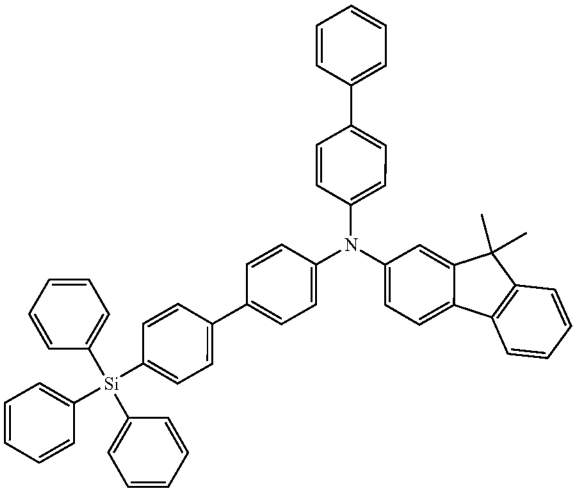

-continued

103

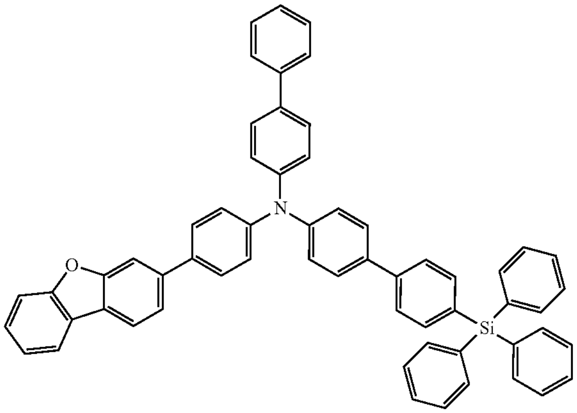

104

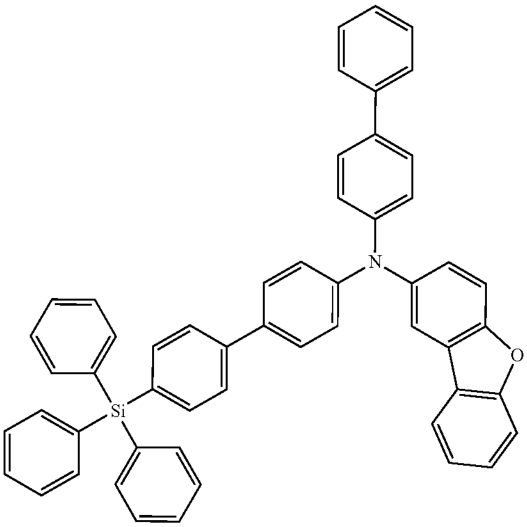

105

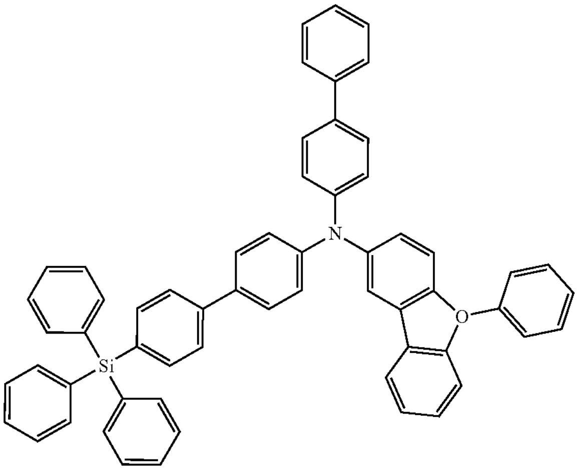

-continued
106
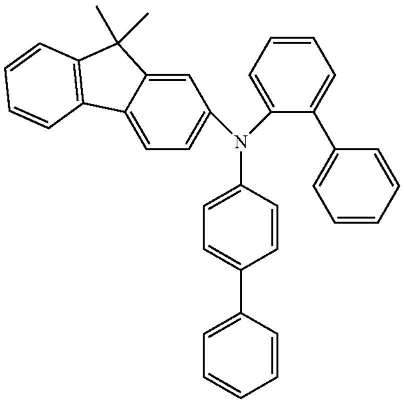
107
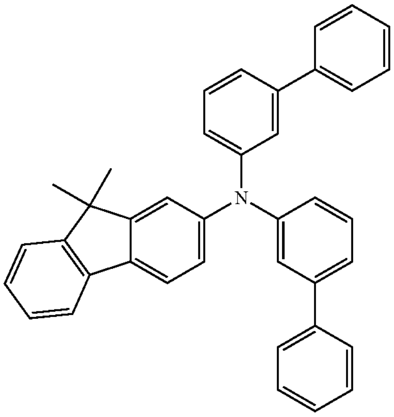
108
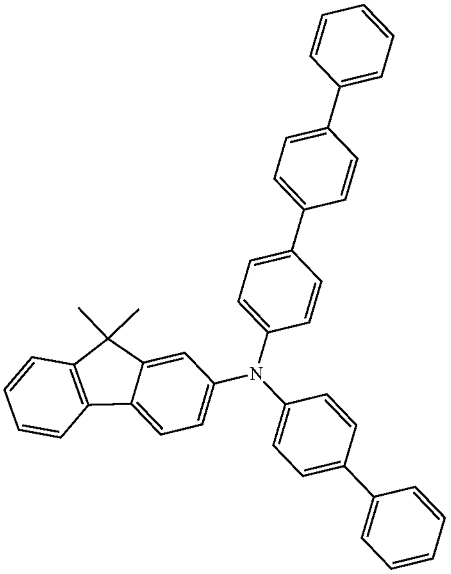
-continued
109
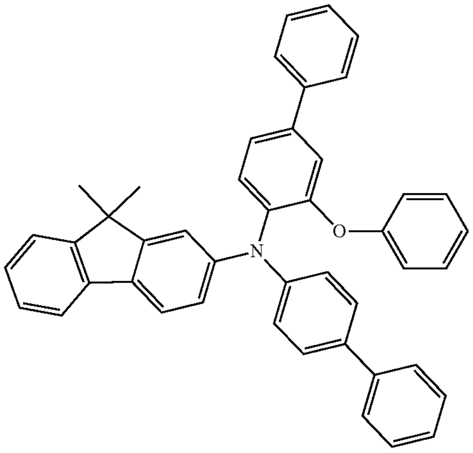
110
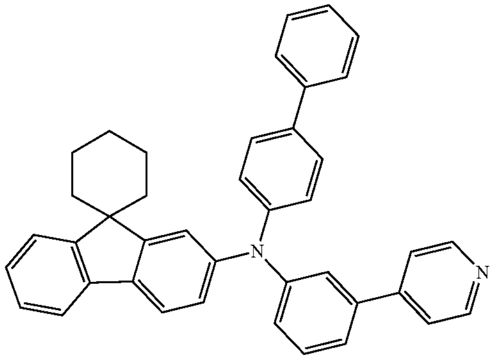
111
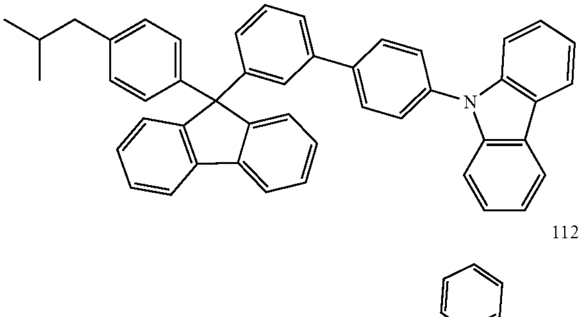
112
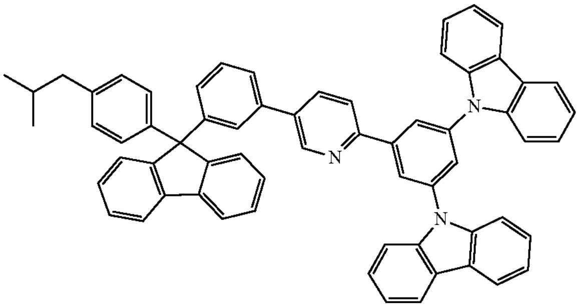

-continued

113

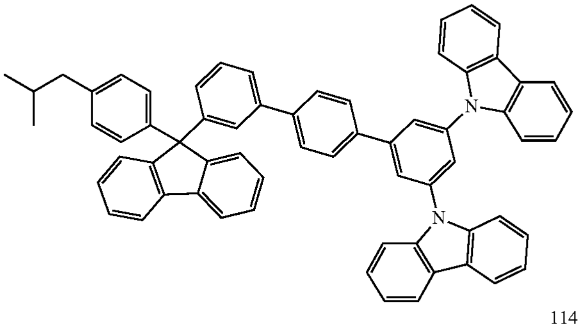

114

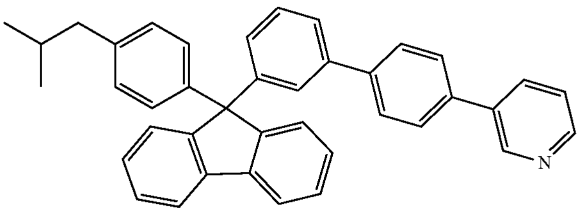

115

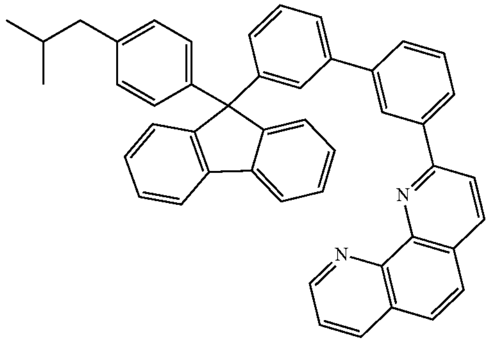

At least one of the m emission layers 132-1, 132-2, . . . **132-*m* may include the first emission layer 132*a*-1, 132*a*-2, . . . or 132*a*-*m* and the second emission layer 132*b*-1, 132*b*-2, . . . or 132*b*-*m***.

In an embodiment, the first emission layer **132*a*-1, 132*a*-2, . . . or 132*a*-*m* may include a first compound, the second emission layer 132*b*-1, 132*b*-2, . . . or 132*b*-*m*** may include a second compound, wherein the first compound may include at least one deuterium, and the second compound may not include deuterium.

In embodiments, the first emission layer **132*a*-1, 132*a*-2, . . . or 132*a*-*m* may include a second compound, and the second emission layer 132*b*-1, 132*b*-2, . . . or 132*b*-*m*** may include a first compound.

In an embodiment, the first compound may be represented by Formula 1:

$$[Ar_1]_{b1}\text{-}[(L_1)_{a1}\text{-}R_1]_{c1} \qquad \text{[Formula 1]}$$

wherein, in Formula 1, $Ar_1$ and $L_1$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b1 may be 1, 2, or 3, a1 may be an integer of 0 to 5, $R_1$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, c1 may be an integer of 0 to 5, $R_{10a}$ may be: deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_6$ alkoxy group, a phenyl group, a biphenyl group, or any combination thereof, and Formula 1 may include at least one deuterium.

For example, in Formula 1, at least one of $Ar_1$, $L_1$, and $R_1$ may be a $C_3$-$C_{60}$ carbocyclic group, and at least one of the $C_3$-$C_{60}$ carbocyclic groups may be substituted with at least one deuterium.

For example, in Formula 1, at least one of $Ar_1$, $L_1$, and $R_1$ may be a benzene group, a naphthalene group, a phenanthrene group, or an anthracene group, and at least one of the benzene group, the naphthalene group, the phenanthrene group, and the anthracene group may be substituted with at least one deuterium.

In embodiments, the first compound may include two or more deuterium. For example, the first compound may include three or more deuterium, and for example, the first compound may include four or more deuterium.

For example, the first compound may be selected from Compounds 1 to 10, but embodiments of the disclosure are not limited thereto:

-continued
1
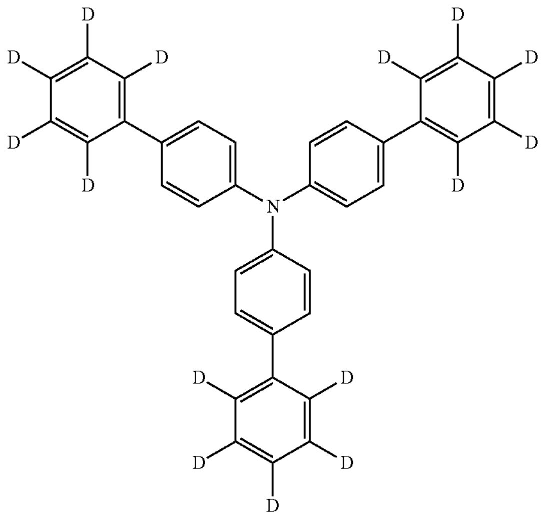
2
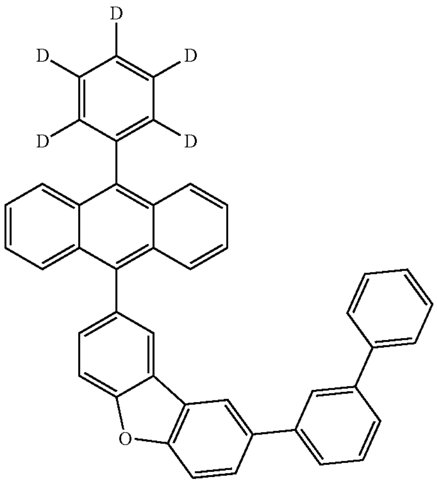
3
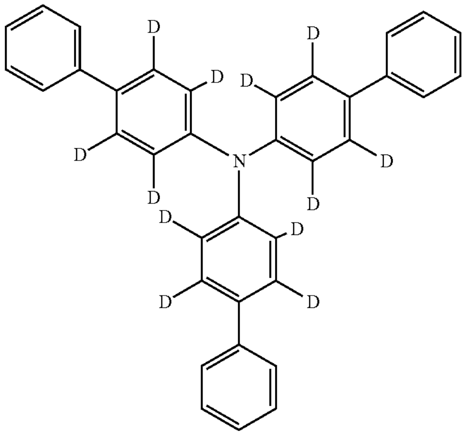
4
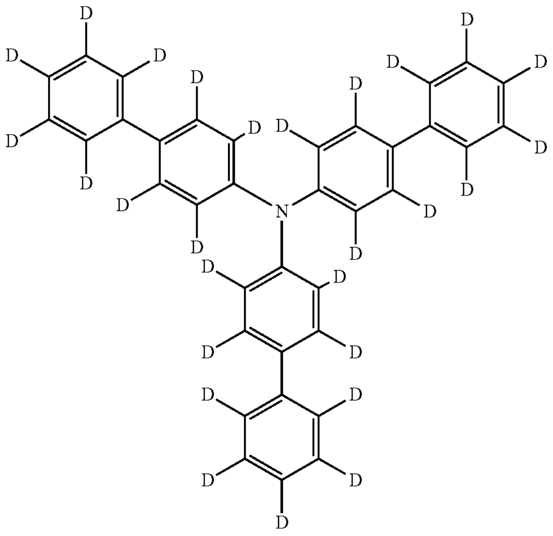
5
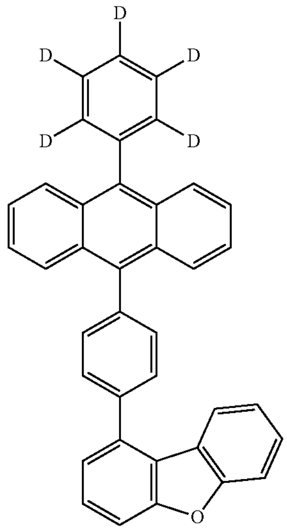
6
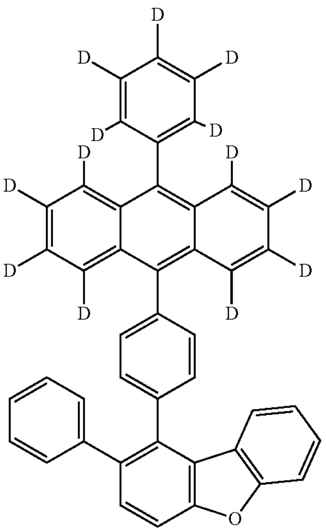

-continued

7

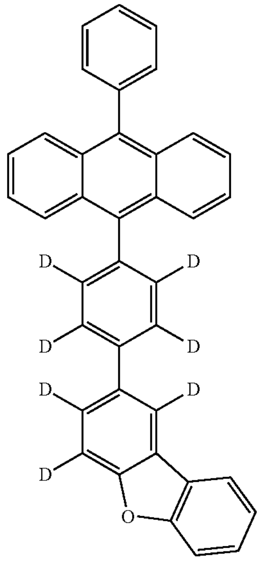

8

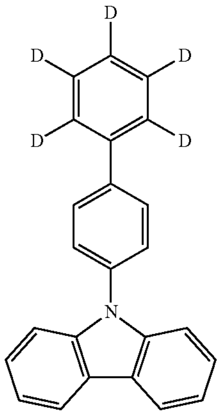

9

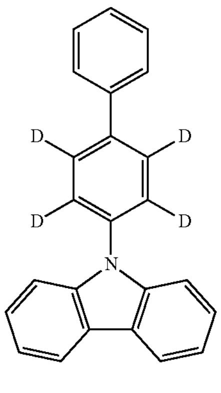

-continued

10

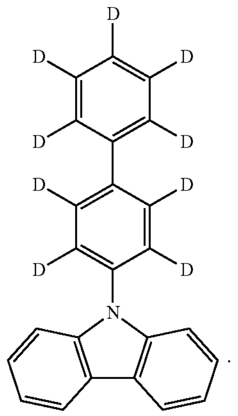

In an embodiment, the second compound may be represented by Formula 2:

$[Ar_2]_{b2}\text{-}[(L_2)_{a2}\text{-}R_2]_{c2}$ [Formula 2]

wherein, in Formula 2, $Ar_2$ and $L_2$ may each independently be a $C_3$-$C_{60}$ carbocyclic group unsubstituted or substituted with at least one $R_{20a}$ or a $C_1$-$C_{60}$ heterocyclic group unsubstituted or substituted with at least one $R_{20a}$, b2 may be 1, 2, or 3, a2 may be an integer of 0 to 5, $R_2$ may be hydrogen, deuterium, —F, —Cl, —Br, —I, a hydroxyl group, a cyano group, a nitro group, a $C_1$-$C_{60}$ alkyl group unsubstituted or substituted with at least one $R_{20a}$, a $C_2$-$C_{60}$ alkenyl group unsubstituted or substituted with at least one $R_{20a}$, a $C_2$-$C_{60}$ alkynyl group unsubstituted or substituted with at least one $R_{20a}$, a $C_1$-$C_{60}$ alkoxy group unsubstituted or substituted with at least one $R_{20a}$, a $C_3$-$C_{60}$ carbocyclic group unsubstituted or substituted with at least one $R_{20a}$, a $C_1$-$C_{60}$ heterocyclic group unsubstituted or substituted with at least one $R_{20a}$, —Si($Q_{41}$)($Q_{42}$)($Q_{43}$), —N($Q_{41}$)($Q_{42}$), —B($Q_{41}$)($Q_{42}$), —C(═O)($Q_{41}$), —S(═O)$_2$($Q_{41}$), or —P(═O)($Q_{41}$)($Q_{42}$), c2 may be an integer of 0 to 5, $R_{20a}$ may be: —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{51}$)($Q_{52}$)($Q_{53}$), —N($Q_{51}$)($Q_{52}$), —B($Q_{51}$)($Q_{52}$), —C(═O)($Q_{51}$), —S(═O)$_2$($Q_{51}$), —P(═O)($Q_{51}$)($Q_{52}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-Cocarbocyclic group, a $C_1$-$C_{60}$ heterocyclic group, a $C_6$-$C_{60}$ aryloxy group, a $C_6$-$C_{60}$ arylthio group, —Si($Q_{61}$)($Q_{62}$)($Q_{63}$), —N($Q_{61}$)($Q_{62}$), —B($Q_{61}$)($Q_{62}$), —C(═O)($Q_{61}$), —S(═O)$_2$($Q_{61}$), —P(═O)($Q_{61}$)($Q_{62}$), or any combination thereof; or —Si($Q_{71}$)($Q_{72}$)($Q_{73}$), —N($Q_{71}$)($Q_{72}$), —B($Q_{71}$)($Q_{72}$), —C(═O)($Q_{71}$), —S(═O)$_2$($Q_{71}$), or —P(═O)($Q_{71}$)($Q_{72}$), $Q_{41}$ to $Q_{43}$, $Q_{51}$ to $Q_{53}$, $Q_{61}$ to $Q_{63}$, and $Q_{71}$ to $Q_{73}$ may each independently be: hydrogen; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with —F, a cyano group, a $C_1$-$C_{60}$ alkyl group, a $C_1$-$C_{60}$ alkoxy group, a phenyl group, a biphenyl group, or any combination thereof, and Formula 2 does not include deuterium.

For example, the second compound may be selected from Compounds A to C, but embodiments of the disclosure are not limited thereto:

A

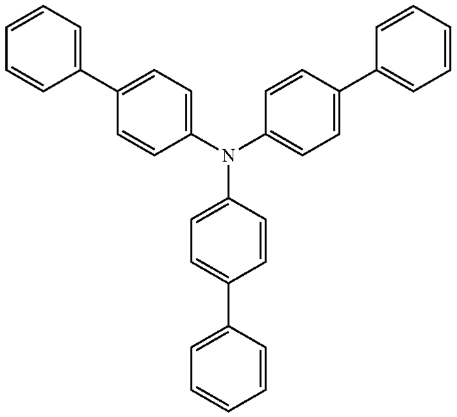

B

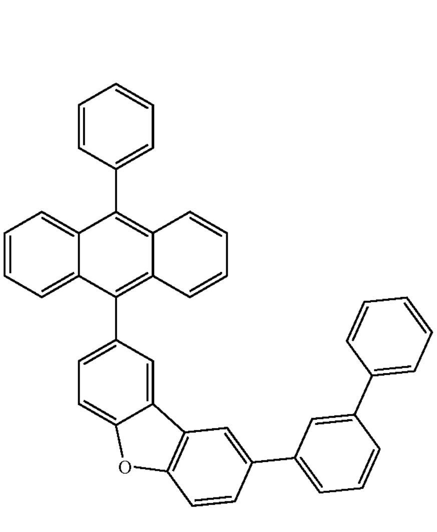

-continued

C

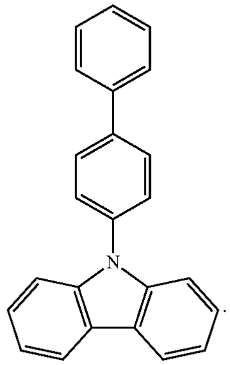

In an embodiment, the first compound may have a structure in which at least one deuterium is substituted on the second compound.

In embodiments, the first compound may be different from the structure in which at least one deuterium is substituted on the second compound.

Although not shown in FIG. 1, the stacking order of the first emission layer 132*a*-1, 132*a*-2, . . . or 132*a*-*m* and the second emission layer 132*b*-1, 132*b*-2, . . . or 132*b*-*m* may be changed. For example, the second emission layer 132*b*-1, 132*b*-2, . . . or 132*b*-*m* may be located close to the first electrode 110, and the first emission layer 132*a*-1, 132*a*-2, . . . or 132*a*-*m* may be located close to the second electrode 150.

For example, among the emission layers 132-1, 132-2, . . . 132-*m*, at least one emission layer including the first emission layer 132*a*-1, 132*a*-2, . . . or 132*a*-*m* and the second emission layer 132*b*-1, 132*b*-2, . . . or 132*b*-*m* may include the first emission layer 132*a*-1, 132*a*-2, . . . or 132*a*-*m* located between the first electrode 110 and the second electrode 150 and the second emission layer 132*b*-1, 132*b*-2, . . . or 132*b*-*m* located between the first emission layer 132*a*-1, 132*a*-2, . . . or 132*a*-*m* and the second electrode 150 (see FIG. 1), or may include the first emission layer located between the first electrode 110 and the second electrode 150 and the second emission layer located between the first electrode 110 and the first emission layer (not shown).

In an embodiment, the first emission layer 132*a*-1, 132*a*-2, . . . or 132*a*-*m* may include a first dopant, the second emission layer 132*b*-1, 132*b*-2, . . . or 132*b*-*m* may include a second dopant, and the first dopant and the second dopant may be identical to or different from each other.

In an embodiment, m may be an integer of 3 or more.

In an embodiment, among the emission layers 132-1, 132-2, . . . 132-*m*, two or more emission layers may each include the first emission layer 132*a*-1, 132*a*-2, . . . or 132*a*-*m* and the second emission layer 132*b*-1, 132*b*-2, . . . or 132*b*-*m*, wherein the two or more emission layers may each independently include:

the first emission layer 132*a*-1, 132*a*-2, . . . or 132*a*-*m* located between the first electrode 110 and the second electrode 150 and the second emission layer 132*b*-1, 132*b*-2, . . . or 132*b*-*m* located between the first emission layer 132*a*-1, 132*a*-2, . . . or 132*a*-*m* and the second electrode 150, or the first emission layer located between the first electrode 110 and the second electrode 150 and the second emission layer located between the first electrode 110 and the first emission layer (not shown).

In an embodiment, among the m emitting units 130-1, 130-2, . . . **130-*m* in the light-emitting device 10, only one emitting unit may include the first emission layer 132*a*-1, 132*a*-2, . . . or 132*a*-*m* and the second emission layer 132*b*-1, 132*b*-2, . . . or 132*b*-*m***.

In embodiments, the emission layer 132-1 of the emitting unit 130-1 adjacent to the first electrode 110 may include the first emission layer **132*a*-1 and the second emission layer 132*b*-1**.

In embodiments, the emission layer 132-2 of the emitting unit 130-2 that is not adjacent to the first electrode 110 and to the second electrode 150 may include the first emission layer **132*a*-2 and the second emission layer 132*b*-2**.

In embodiments, the emission layer **132-*m* of the emitting unit 130-*m* adjacent to the second electrode 150 may include the first emission layer 132*a*-*m* and the second emission layer 132*b*-*m***.

In embodiments, all the m emitting units 130-1, 130-2, . . . **130-*m* in the light-emitting device 10 may include the first emission layer 132*a*-1, 132*a*-2, . . . or 132*a*-*m* and the second emission layer 132*b*-1, 132*b*-2, . . . or 132*b*-*m***.

In the light-emitting device 10, m may be 3 or 4.

In an embodiment, the first electrode 110 may be an anode and the second electrode 150 may be a cathode.

In an embodiment, a maximum luminescence wavelength of light emitted from the m emitting units 130-1, 130-2, . . . **130-*m*** may all be the same.

In embodiments, the m emitting units 130-1, 130-2, . . . **130-*m*** may emit blue light having a maximum luminescence wavelength of about 440 nm or more and about 510 nm or less based on the wavelength of the front peak.

In embodiments, among the m emitting units 130-1, 130-2, . . . **130-*m*, the emitting unit 130-2 . . . 130-*m* including the hole transport regions 131-2 . . . 131-*m* including the multi-layered hole transport layer 131*a*-2 to 131*c*-2 . . . or 131*a*-*m* to 131*c*-*m*** may emit blue light having a maximum luminescence wavelength in a range of about 440 nm to about 510 nm.

In embodiments, the m emitting units 130-1, 130-2, . . . **130-*m* that may include the at least one emission layer 132-1, 132-2, . . . or 132-*m* which includes the first emission layer 132*a*-1, 132*a*-2, . . . or 132*a*-*m* and the second emission layer 132*b*-1, 132*b*-2, . . . or 132*b*-*m*** may emit blue light having a maximum luminescence wavelength in a range of about 440 nm to about 510 nm.

In embodiments, among the m emitting units 130-1, 130-2, . . . **130-*m*, a maximum luminescence wavelength of light emitted from at least one emitting unit may be different from the maximum luminescence wavelength of light emitted from at least one emitting unit of the remaining emitting units. In embodiments, in the organic light-emitting device 10 in which a first emitting unit and a second emitting unit are stacked, the maximum luminescence wavelength of light emitted from the first emitting unit may be different from the maximum luminescence wavelength of light emitted from the second emitting unit. An emission layer of the first emitting unit and an emission layer of the second emitting unit may each independently have i) a single-layered structure consisting of a single layer consisting of a single material, ii) a single-layer structure consisting of a single layer consisting of different materials, or iii) a multi-layered structure having multiple layers consisting of different materials. Accordingly, light emitted from the first emitting unit or the second emitting unit may be single-color light or mixed-color light. In embodiments, in the organic light-emitting device 10** in which a first emitting unit, a second emitting unit, and a third emitting unit are stacked, the maximum luminescence wavelength of light emitted from the first emitting unit may be the same as the maximum luminescence wavelength of light emitted from the second emitting unit, but different from the maximum luminescence wavelength of light emitted from the third emitting unit. In embodiments, the maximum luminescence wavelength of light emitted from the first emitting unit, the maximum luminescence wavelength of light emitted from the second emitting unit, and the maximum luminescence wavelength of light emitted from the third emitting unit may be different from one another.

In an embodiment, the m emission layers 132-1, 132-2, . . . **132-*m* included in the m emitting units 130-1, 130-2, . . . 130-*m***, respectively, may each independently include a phosphorescent dopant, a fluorescent dopant, a delayed fluorescence material, or any combination thereof.

In embodiments, all the m emission layers 132-1, 132-2, . . . **132-*m*** may include a phosphorescent dopant, a fluorescent dopant, or a delayed fluorescence material.

In embodiments, among the m emission layers 132-1, 132-2, . . . **132-*m***, at least one emission layer may include a phosphorescent dopant, and the remaining emission layers may include a fluorescent dopant; at least one emission layer may include a phosphorescent dopant, and the remaining emission layers may include a delayed fluorescence material; or at least one emission layer may include a fluorescent dopant, and the remaining emission layers may include a delayed fluorescence material.

In embodiments, among the m emission layers 132-1, 132-2, . . . **132-*m***, at least one emission layer may include a phosphorescent dopant, at least one emission layer may include a fluorescent dopant, and the remaining emission layers may include a delayed fluorescence material.

In embodiments, all the dopants included in the m emission layers 132-1, 132-2, . . . **132-*m*** may be identical to or different from each other.

In a device of the related art, a single-type host material may be used. Since an existing host has stronger electron transport characteristics than hole transport characteristics, a recombination zone where holes and electrons meet occurred at the interface between an electron blocking layer and an emission layer. Accordingly, there is a problem in that the electron blocking layer is deteriorated due to excitons generated by the holes and the electrons.

To solve such a problem, the light-emitting device of the disclosure introduced an emission layer having a double-layered structure to move the recombination zone to the interface between two emission layers, thereby preventing deterioration of the device.

By forming a narrow triplet-triplet fusion (TTF) zone at the interface between the two emission layers, high efficiency and a long lifespan may be achieved.

By introducing a multi-layered hole transport layer having a doped layer therein, hole injection characteristics may be improved, thereby significantly improving driving voltage and progressive driving voltage characteristics of the light-emitting device. The term "progressive driving voltage ($\Delta V$)" as used herein refers to the amount of change in driving voltage compared to the initial driving voltage while the organic light-emitting device is operated by applying a constant current to the organic light-emitting device.

By optionally using a deuterium-substituted host in at least one of the emission layers, a long lifespan may be achieved.

The light-emitting device of the disclosure includes the multi-layered hole transport layer only in the emitting unit that is not adjacent to the anode. In this regard, compared to the structure in which the emitting unit adjacent to the anode includes the multi-layered hole transport layer, the light-emitting device of the disclosure may have selective hole injection characteristics due to the tunneling effect, and according to this principle, charge balance characteristics in the emission layer may be improved to exhibit stable driving characteristics.

Furthermore, the light-emitting device of the disclosure may have a HOMO energy level in a range of about −5.25 eV to about −5.5 eV without introducing a conventionally used electron blocking layer between the emission layer and the multi-layered hole transport layer. The light-emitting device of the disclosure may use a double-layered emission layer to move the emission zone from the interface between the electron blocking layer and the emission layers to the interface between the two emission layers of the double-layered emission layer, so that effective blue fluorescence may be emitted only by controlling the hole injection characteristics without a layer having electron blocking characteristics.

By limiting the amount of the p-dopant in the doped layer of the multi-layered hole transport layer in a range of about 0.1 wt % to about 20 wt % based on the total weight of the doped layer, the hole movement characteristics may be controlled, and based on the characteristics of such control, an effect of selectively controlling the charge balance inside the emission layer may be exhibited.

By limiting the thickness of the doped layer in the multi-layered hole transport layer to less than about 80% of a total thickness of the multi-layered hole transport layer, the hole movement characteristics may be controlled by the total thickness, and based on the characteristics of such control, an effect of selectively controlling the charge balance inside the emission layer may be exhibited.

By limiting a thickness of the second non-doped layer in the multi-layered hole transport layer to about 20% or more of a total thickness of the multi-layered hole transport layer, the gap with the doped layer may be separated by an appropriate distance, thereby preventing exciton quenching caused by the dopant included in the doped layer.

Another aspect of the disclosure provides an electronic apparatus which may include the light-emitting device.

In an embodiment, the electronic apparatus may further include: a sealing portion disposed on the light-emitting device; and a touch screen layer, a polarizing layer, a color filter, a color conversion layer, or any combination thereof, disposed on the sealing portion.

In embodiments, the electronic apparatus may include quantum dots or an optical member including the quantum dots, disposed on at least one traveling direction of light emitted from the light-emitting device.

The term “interlayer” as used herein refers to a single layer or all layers between the first electrode and the second electrode of the light-emitting device. A material included in the “interlayer” is not limited to an organic material.

Hereinafter, the structure of the light-emitting device 10 according to an embodiment and a method of manufacturing the light-emitting device 10 will be described in connection with FIG. 1.

[First Electrode 110]

In FIG. 1, a substrate may be additionally located under the first electrode 110 or above the second electrode 150. In an embodiment, the substrate may be a glass substrate or a plastic substrate. In embodiments, the substrate may be a flexible substrate. For example, the substrate may include plastics with excellent heat resistance and durability, such as polyimide, polyethylene terephthalate (PET), polycarbonate, polyethylene naphthalate, polyarylate (PAR), polyetherimide, or a combination thereof.

The first electrode 110 may be formed by, for example, depositing or sputtering a material for forming the first electrode 110 on the substrate. When the first electrode 110 is an anode, a high work function material that can easily inject holes may be used as the material for forming the first electrode 110.

The first electrode 110 may be a reflective electrode, a semi-transmissive electrode, or a transmissive electrode. In an embodiment, when the first electrode 110 is a transmissive electrode, the material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, the material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure consisting of a single layer or a multi-layered structure including multiple layers. For example, the first electrode 110 may have a three-layered structure of ITO/Ag/ITO.

[Interlayer 130]

The interlayer 130 is located on the first electrode 110. The interlayer 130 may include the emission layers 132-1, 132-2, . . . **132-*m***.

The interlayer 130 may further include the hole transport region 131-1, 131-2, . . . or **131-*m* located between the first electrode 110 and the emission layer 132-1, 132-2, . . . or 132-*m* and the electron transport region 133-1, 133-2, or 133-*m* located between the emission layer 132-1, 132-2, . . . or 132-*m* and the second electrode 150**.

The interlayer 130 may further include metal-containing compounds such as organometallic compounds, inorganic materials such as quantum dots, and the like, in addition to various organic materials.

The interlayer 130 may include, as described above, i) two or more emitting units sequentially stacked between the first electrode 110 and the second electrode 150 and ii) a charge generation layer located between the two emitting units. When the interlayer 130 includes the emitting units and the charge generation layer as described above, the light-emitting device 10 may be a tandem light-emitting device (see FIG. 1).

[Hole Transport Region 131-1, 131-2, . . . Or **131-*m* in Interlayer 130**]

The hole transport region 131-1, 131-2, . . . or **131-*m*** may each have: i) a single-layered structure consisting of a single layer consisting of a single material, ii) a single-layered structure consisting of a single layer consisting of different materials, or iii) a multi-layered structure including multiple layers including different materials.

The multi-layered hole transport layer **131*a*-2 to 131*c*-2 . . . or 131*a*-*m* to 131*c*-*m* included in the hole transport region 131-2, . . . or 131-*m*** may have a layer configuration as described above.

The hole transport region 131-1 that does not include the multi-layered hole transport layer **131*a*-2 to 131*c*-2 . . . or 131*a*-*m* to 131*c*-*m*** may include a hole injection layer, a hole transport layer, an emission auxiliary layer, an electron blocking layer, or any combination thereof.

For example, the hole transport region 131-1 that does not include the multi-layered hole transport layer **131*a*-2** to

131*c*-2 . . . or 131*a-m* to 131*c-m* may have a multi-layered structure, such as a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, for each structure, layers are sequentially stacked on the first electrode 110.

The hole transport region 131-1, 131-2, . . . or 131-*m* may include a compound represented by Formula 201, a compound represented by Formula 202, or any combination thereof:

[Formula 201]

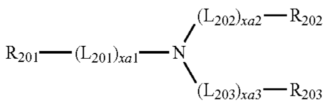

[Formula 202]

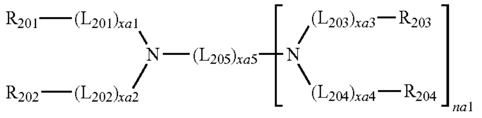

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer of 0 to 5, xa5 may be an integer of 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group or the like) (for example, see Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer of 1 to 4.

In an embodiment, Formulae 201 and 202 may each include at least one of groups represented by Formulae CY201 to CY217:

CY201

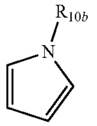

CY202

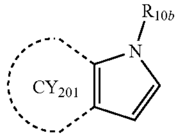

CY203

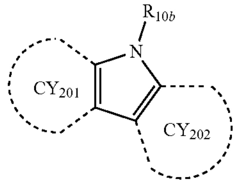

CY204

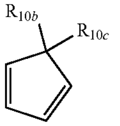

CY205

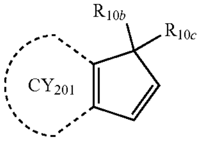

CY206

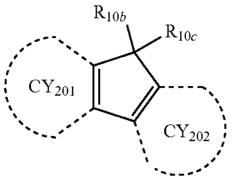

CY207

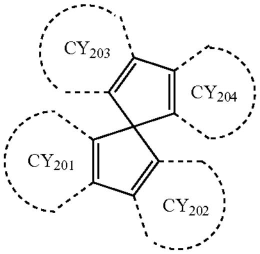

CY208

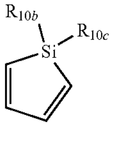

CY209

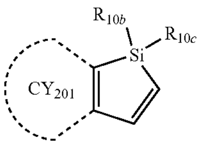

-continued

CY210

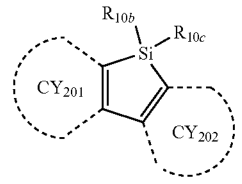

CY211

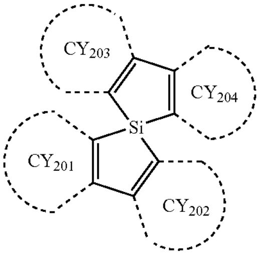

CY212

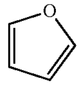

CY213

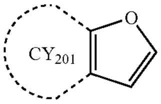

CY214

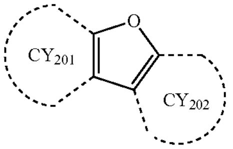

CY215

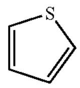

CY216

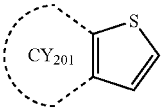

CY217

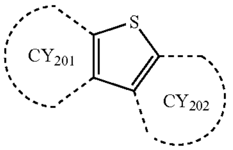

wherein, in Formulae CY201 to CY217, $R_{10b}$ and $R_{10c}$ may each be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be substituted with at least one $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In embodiments, Formulae 201 and 202 may each include at least one of the groups represented by Formulae CY201 to CY203.

In embodiments, Formula 201 may include at least one of the groups represented by Formulae CY201 to CY203 and at least one of the groups represented by Formulae CY204 to CY217.

In embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include the groups represented by Formulae CY201 to CY203.

In embodiments, each of Formulae 201 and 202 may not include the groups represented by Formulae CY201 to CY203, and may include at least one of the groups represented by Formulae CY204 to CY217.

In embodiments, each of Formulae 201 and 202 may not include the groups represented by Formulae CY201 to CY217.

For example, the hole transport region 131-1, 131-2, . . . or **131-*m*** may include, in addition to Compounds 101 to 115 above, one of Compounds HT1 to HT46, m-MTDATA, TDATA, 2-TNATA, NPB(NPD), p-NPB, TPD, spiro-TPD, spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

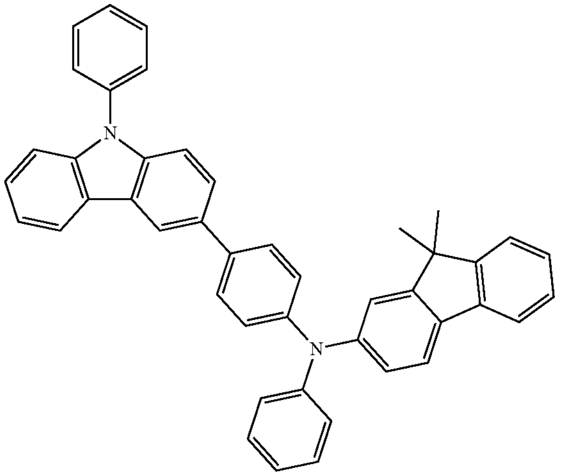

-continued
HT2
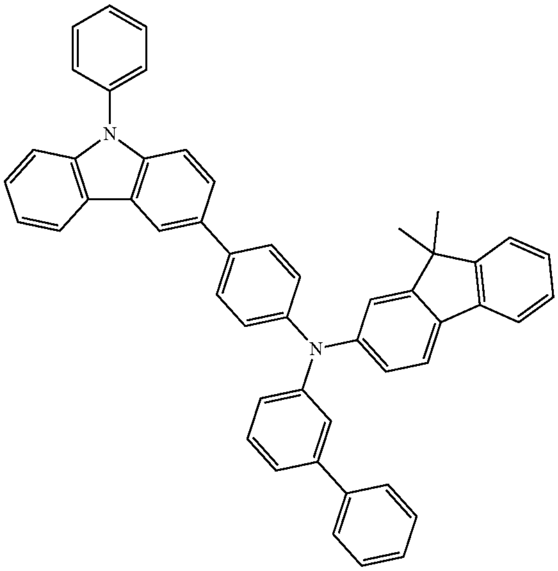
HT3
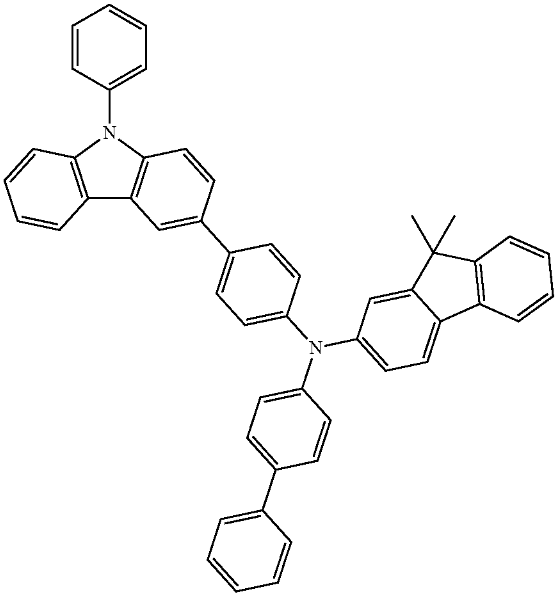
-continued
HT4
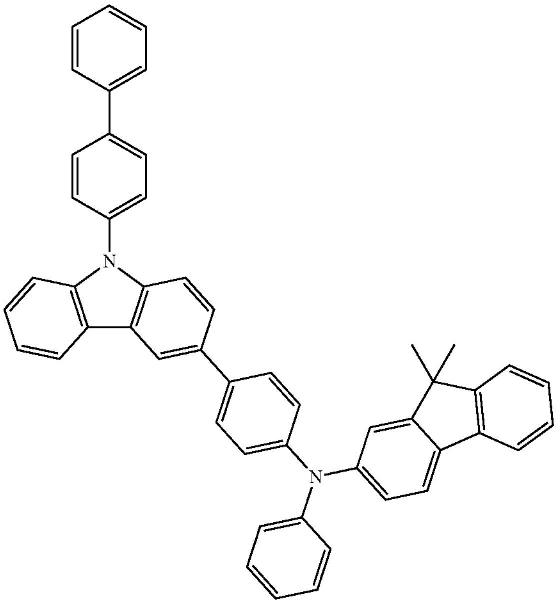
HT5
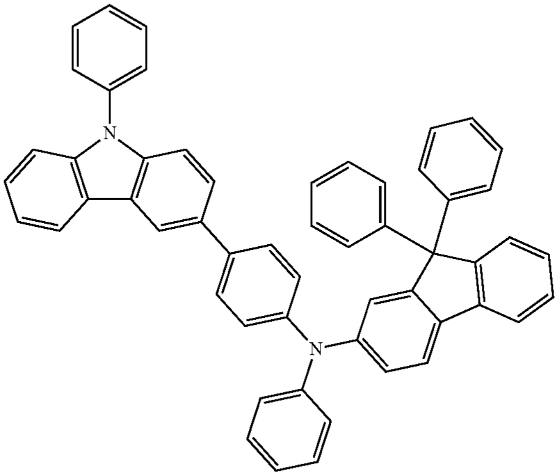

-continued
HT6
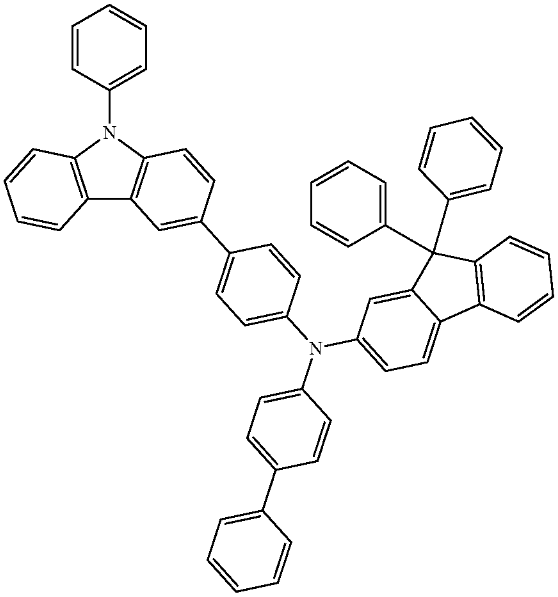
HT7
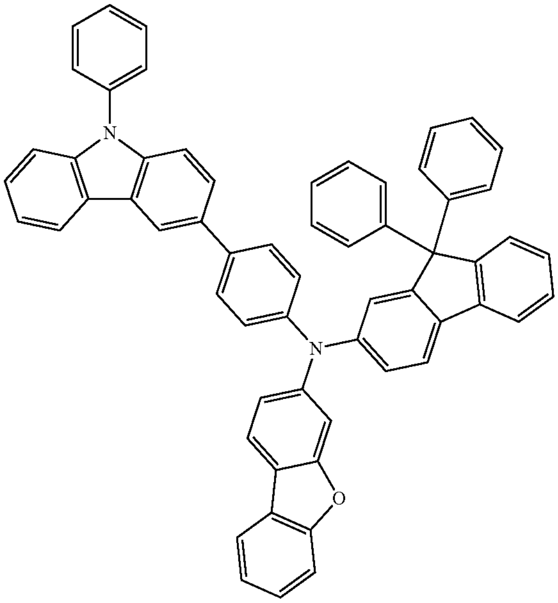
-continued
HT8
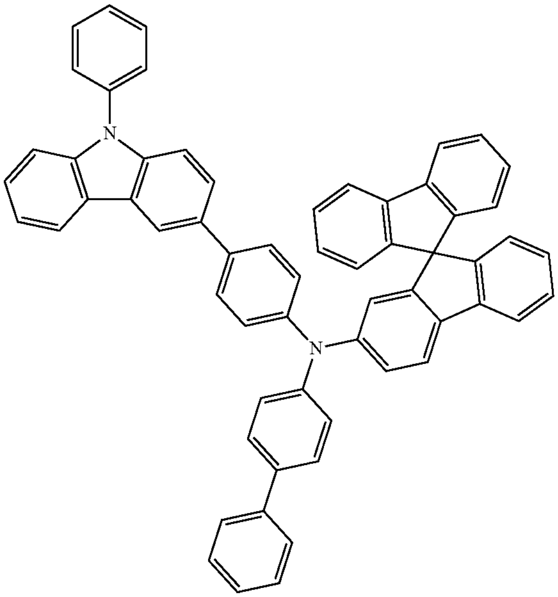
HT9
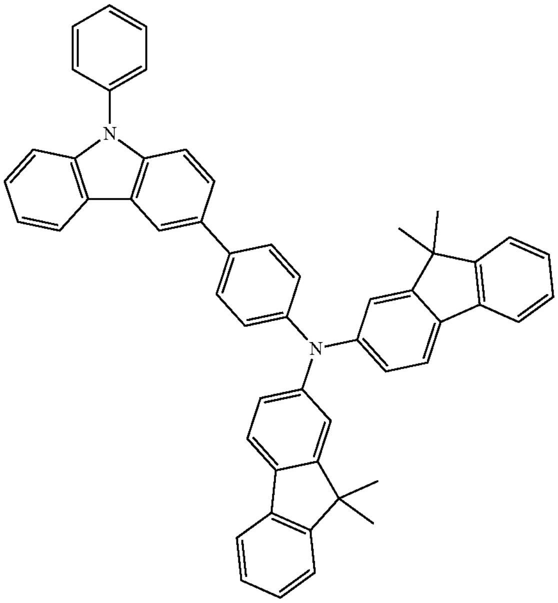

-continued
HT10
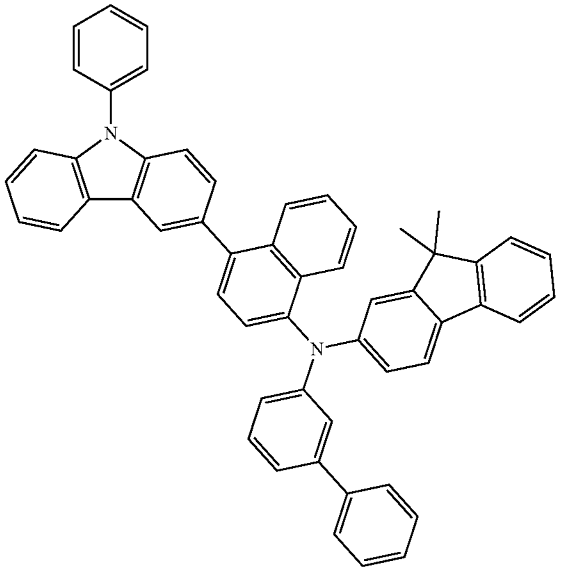
HT11
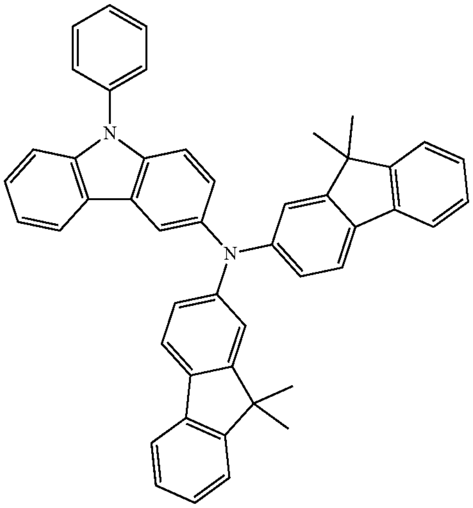
HT12
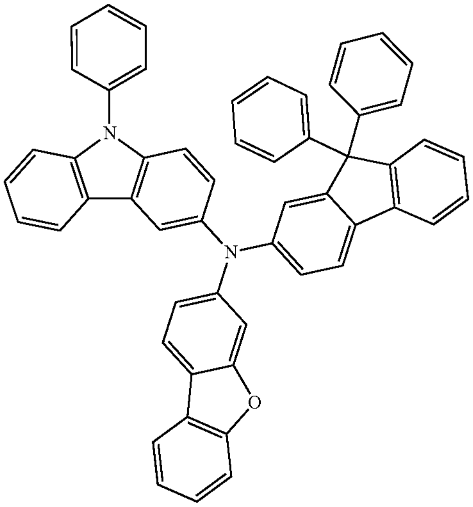
-continued
HT13
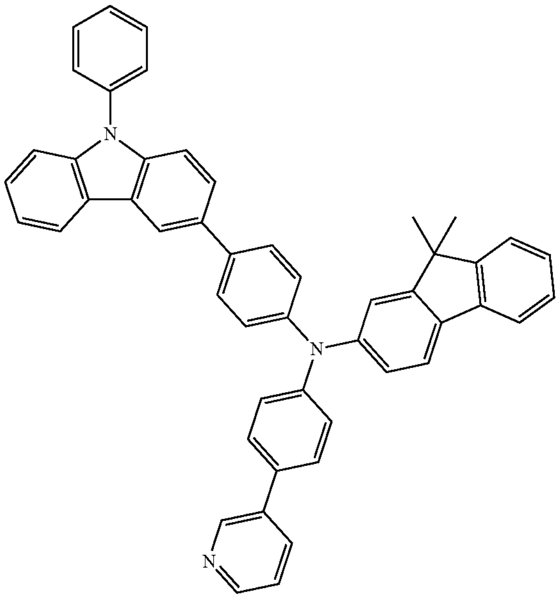
HT14
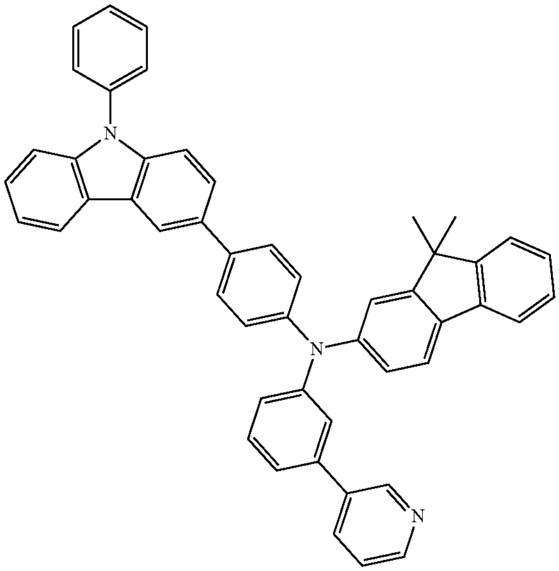

-continued
HT15
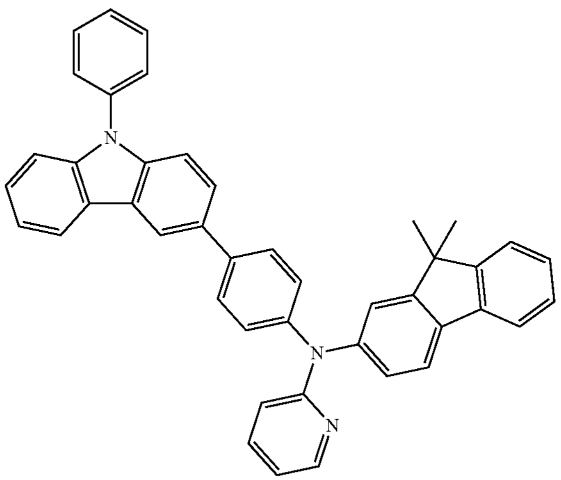
HT16
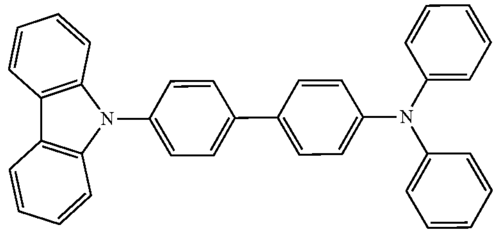
HT17
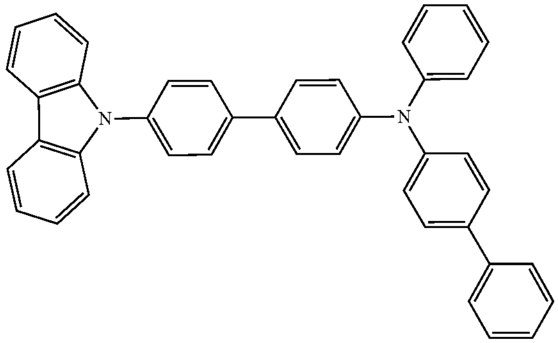
HT18
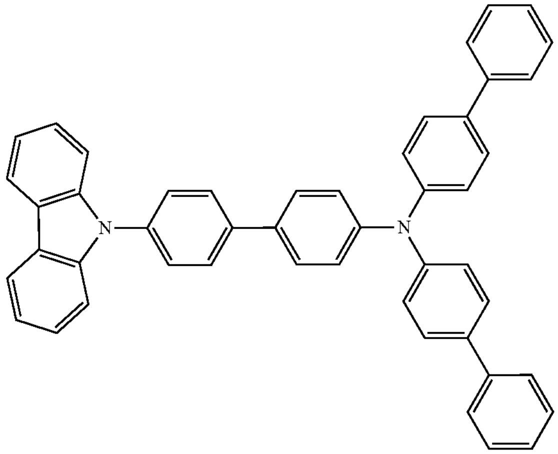
-continued
HT19
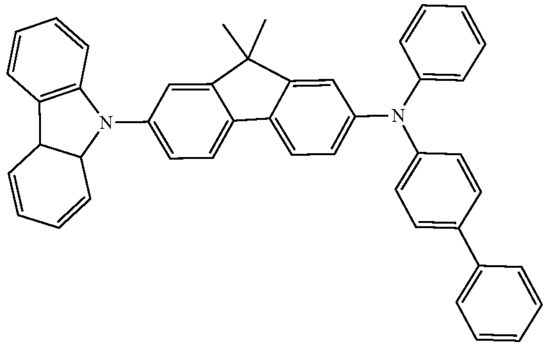
HT20
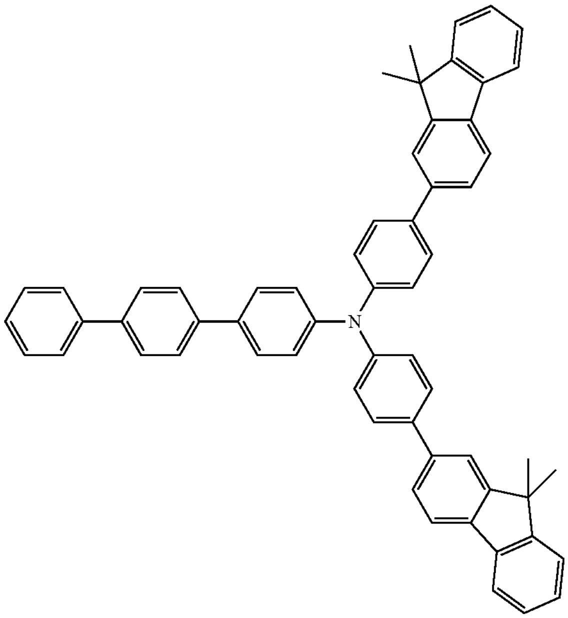
HT21
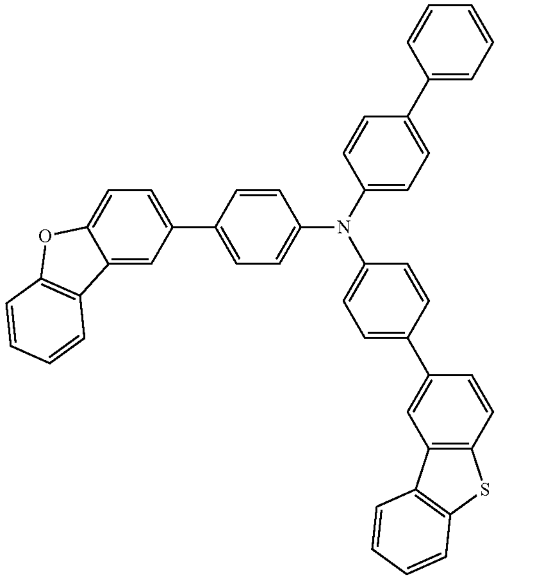

-continued
HT22
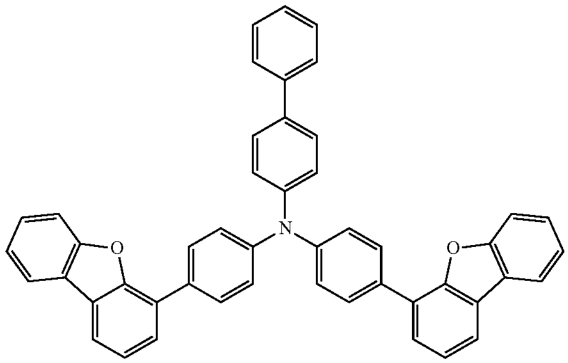
HT23
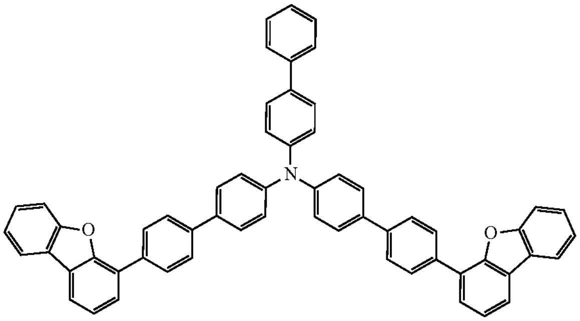
HT24
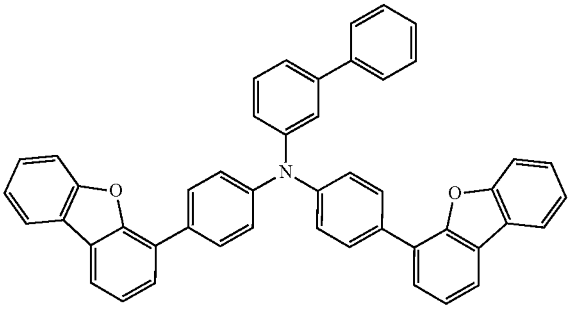
HT25
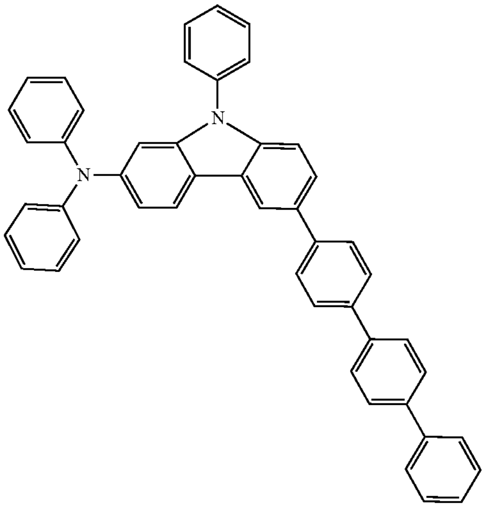
-continued
HT26
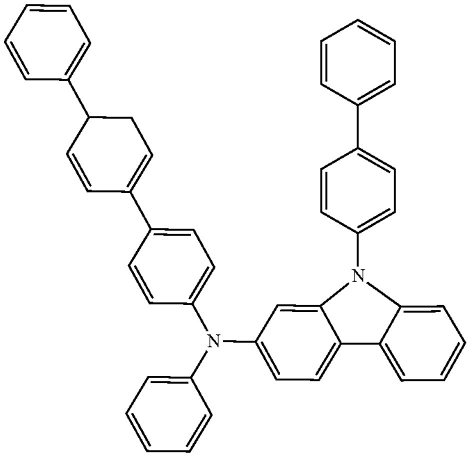
HT27
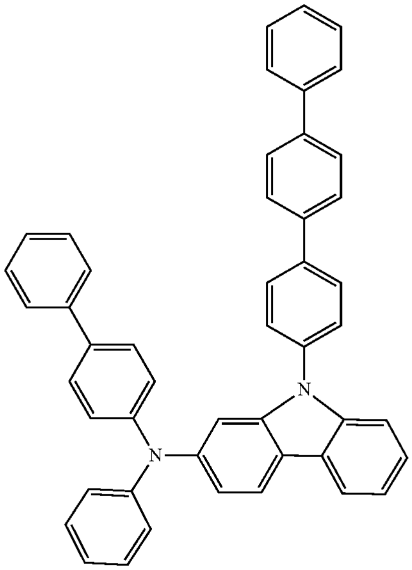
HT28
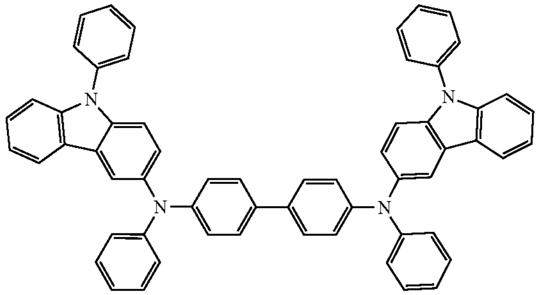

-continued
HT29
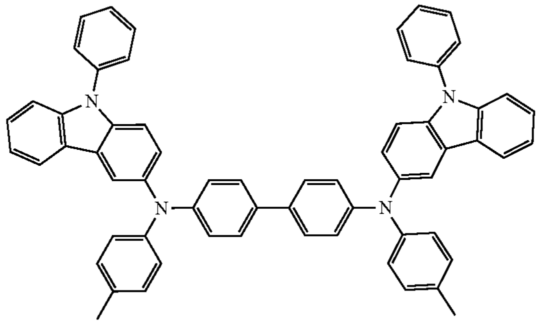
HT30
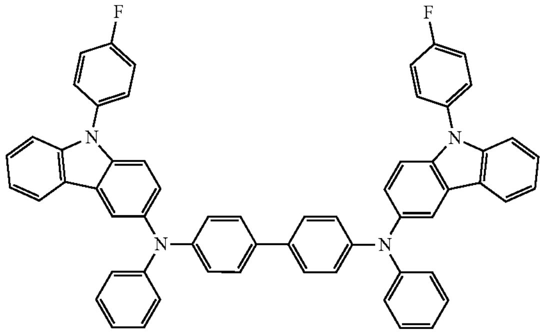
HT31
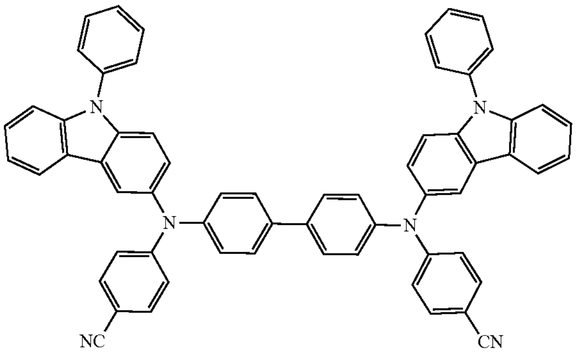
HT32
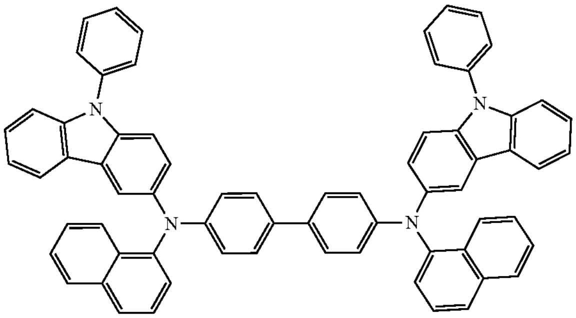
-continued
HT33
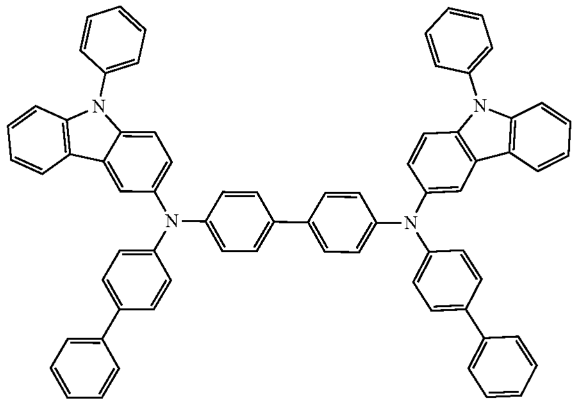
HT34
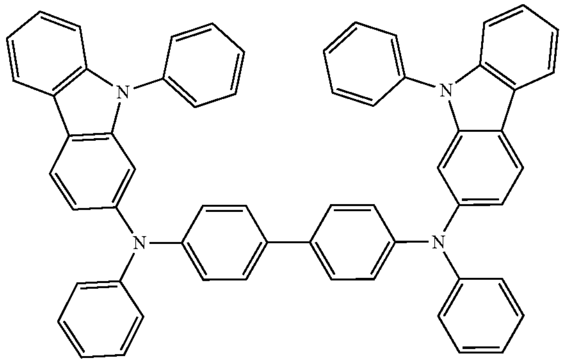
HT35
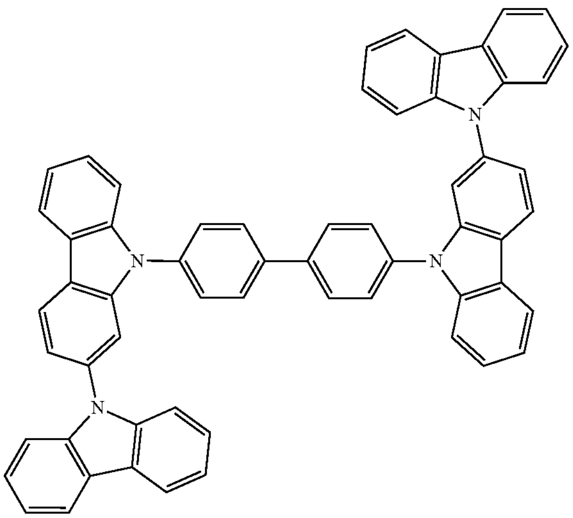

-continued
HT36
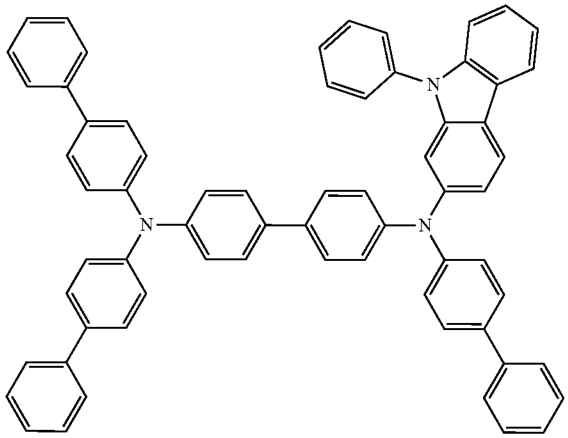
HT37
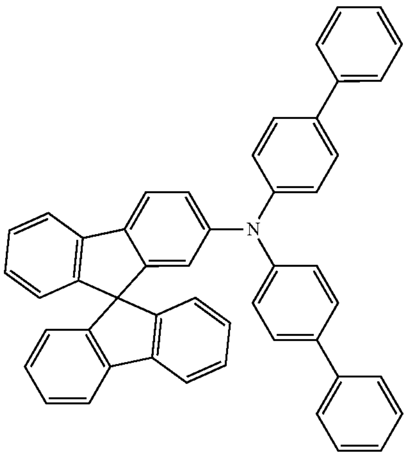
HT38
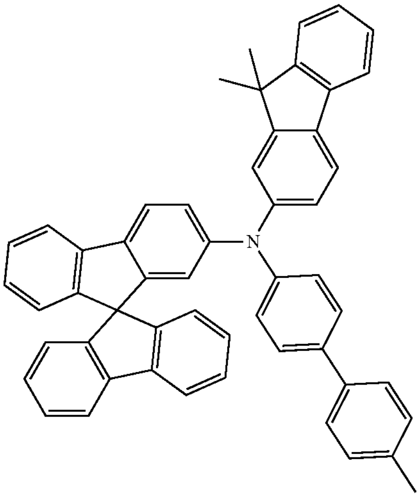
-continued
HT39
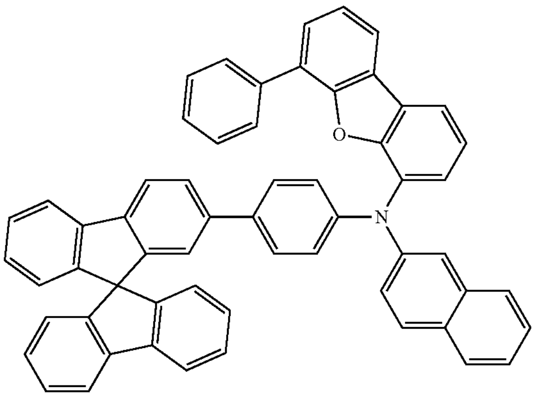
HT40
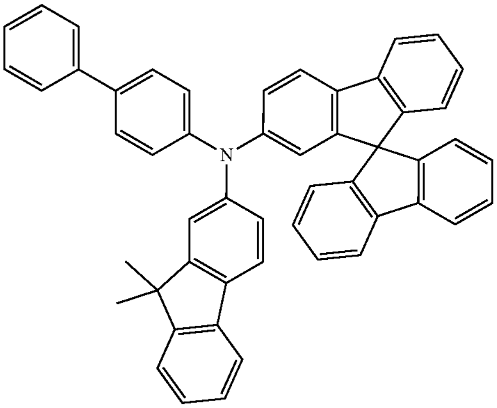
HT41
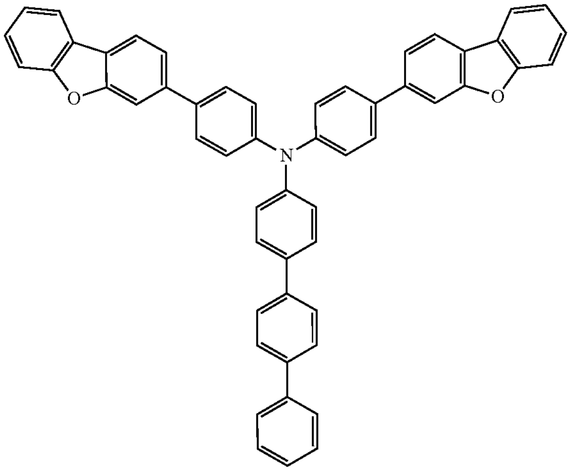
HT42
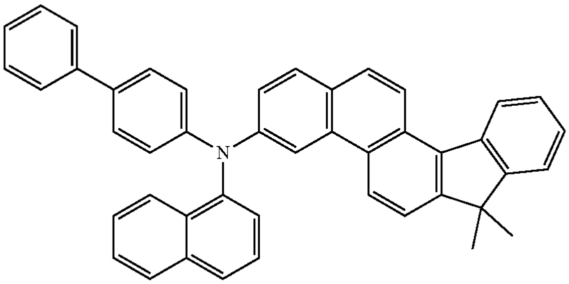

-continued
HT43
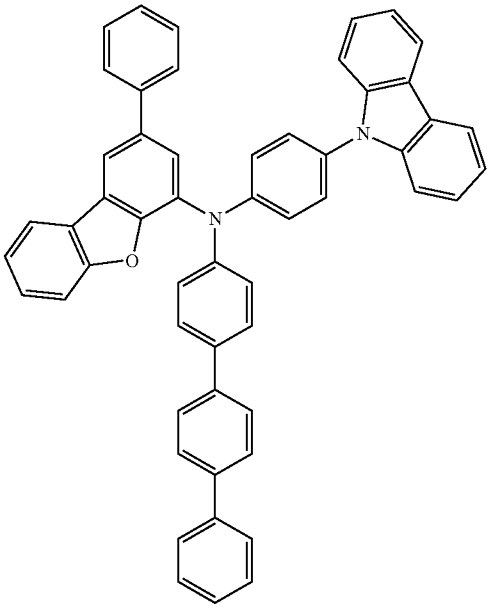
HT44
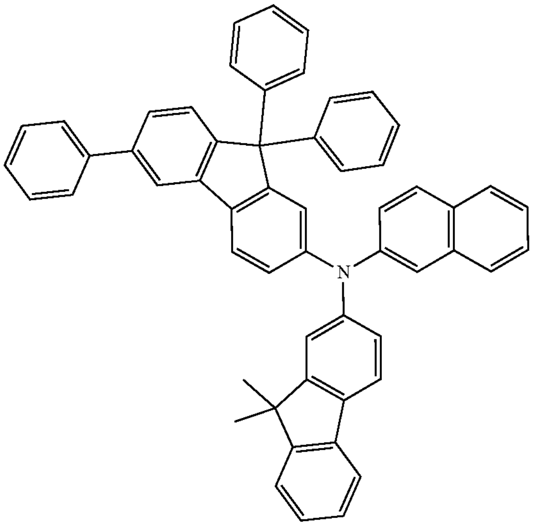
HT45
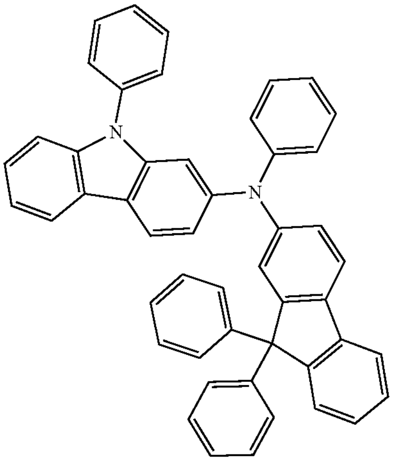
-continued
HT46
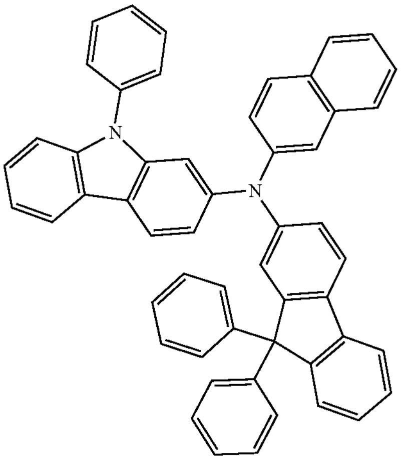
m-MTDATA
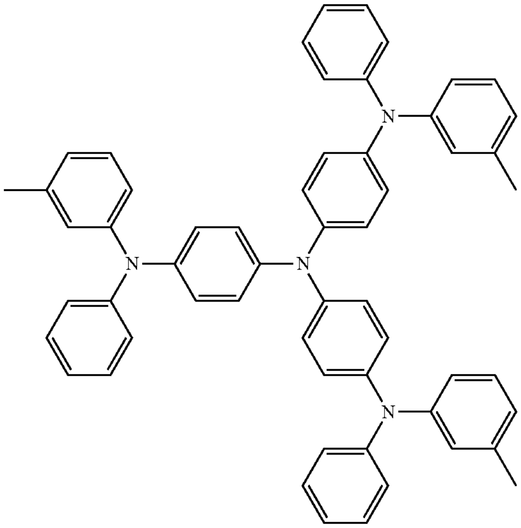
TDATA
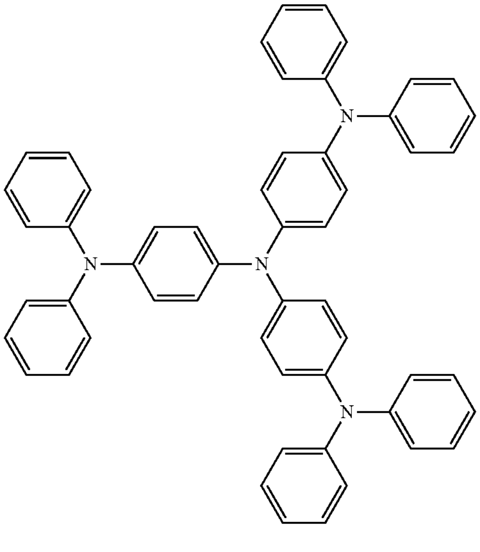

-continued
2-TNATA
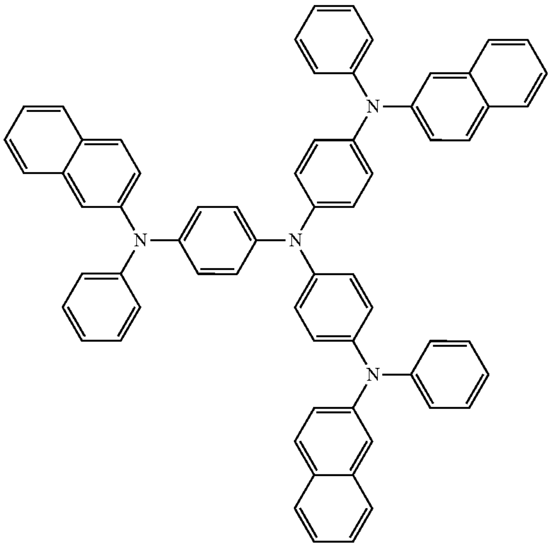
NPB
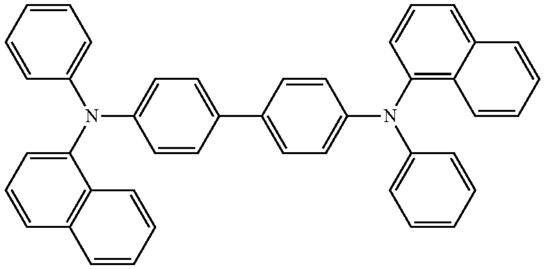
β-NPB
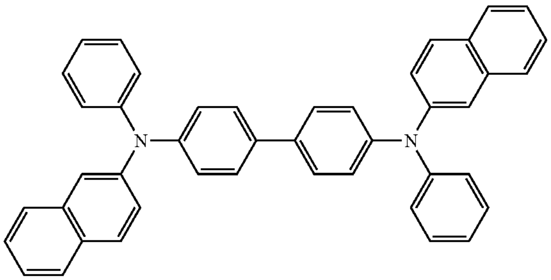
TPD
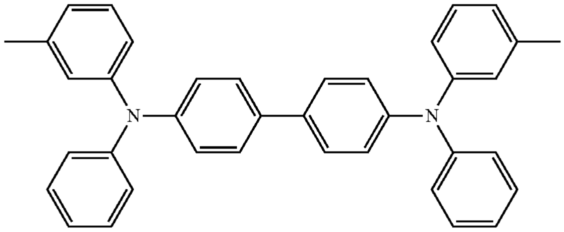
-continued
Spiro-TPD
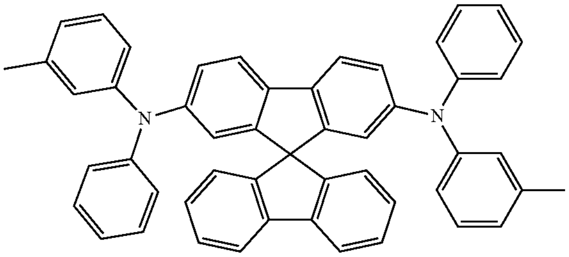
Spiro-NPB
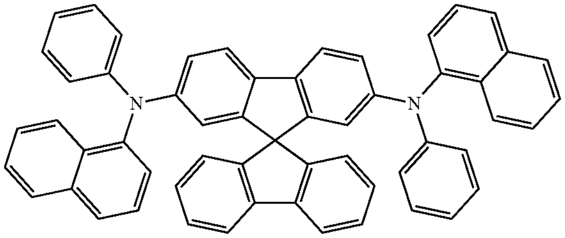
methylated-NPB
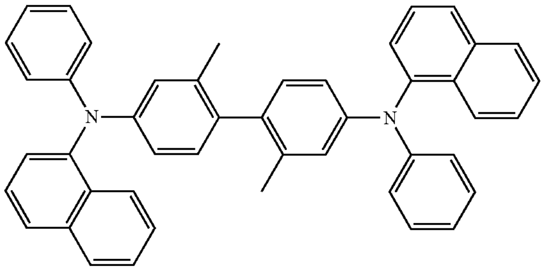
TAPC
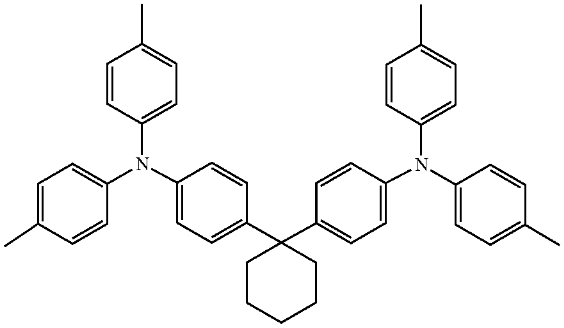
HMTPD
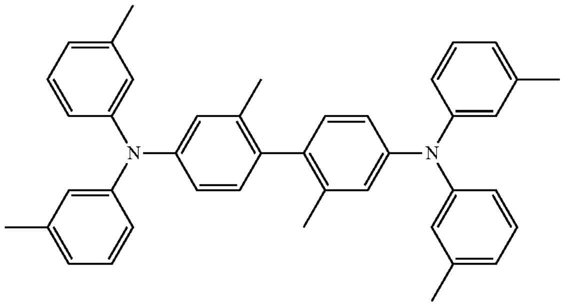
A thickness of the hole transport region 131-1, 131-2, . . . or 131-*m* may each be in a range of about 50 Å to about 10,000 Å. For example, the thickness of the hole transport region 131-1, 131-2, . . . or 131-*m* may each be in a range of about 100 Å to about 4,000 Å. When the hole transport region 131-1, 131-2, . . . or 131-*m* includes a hole injection layer, a hole transport layer, or any combination thereof, a thickness of the hole injection layer may each be in a range of about 100 Å to about 9,000 Å, and a thickness of the hole transport layer may each be in a range of about 50 Å to about 2,000 Å. For example, the thickness of the hole injection layer may each be in a range of about 100 Å to about 1,000 Å. For example, the thickness of the hole transport layer may each be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light emission efficiency by compensating for an optical resonance distance according to the wavelength of light emitted by the emission layer, and the electron blocking layer may block the flow of electrons from the electron transport region. The emission auxiliary layer and the electron blocking layer may include the materials as described above.

[P-Dopant]

The hole transport region 131-1, 131-2, . . . or 131-*m* may include, in addition to the materials above, a charge generation material to improve conductivity. The charge generation material may be uniformly or non-uniformly dispersed in the hole transport region 131-1, 131-2, . . . or 131-*m* (for example, in a single-layered form consisting of a charge generation material).

The charge generation material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative are TCNQ and F4-TCNQ.

Examples of the cyano group-containing compound are HAT-CN and a compound represented by Formula 221:

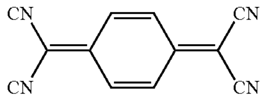

TCNQ

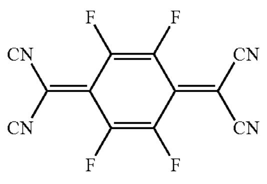

F4-TCNQ

-continued

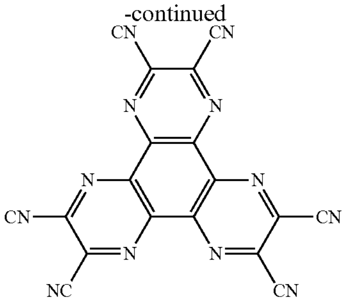

HAT-CN

[Formula 221]

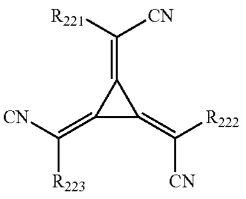

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

The cyano group-containing compound may be, for example, Compound P-D1:

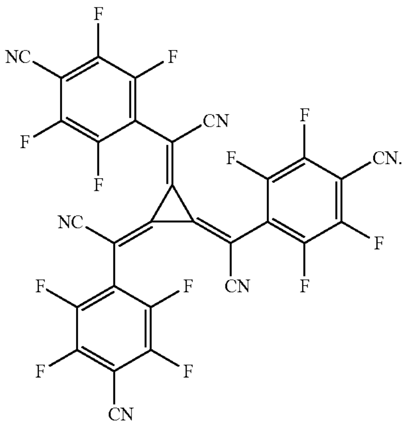

P-D1

Regarding the compound containing element EL1 and element EL2, element EL1 may be metal, metalloid, or a combination thereof, and element EL2 may be a non-metal, metalloid, or a combination thereof.

Examples of the metal are: an alkali metal (for example, lithium (Li), sodium (Na), potassium (K), rubidium (Rb), cesium (Cs), or the like); alkaline earth metal (for example, beryllium (Be), magnesium (Mg), calcium (Ca), strontium (Sr), barium (Ba), or the like); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metals (for example, zinc (Zn), indium (In), tin (Sn), or the like); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like).

Examples of the metalloid are silicon (Si), antimony (Sb), and tellurium (Te).

Examples of the non-metal are oxygen (O) and halogen (for example, F, Cl, Br, I, etc.).

Examples of the compound containing element EL1 and element EL2 are metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or any combination thereof.

Examples of the metal oxide are tungsten oxide (for example, WO, $W_2O_3$, $WO_2$, $WO_3$, or $W_2O_5$), vanadium oxide (for example, VO, $V_2O_3$, $VO_2$, or $V_2O_5$), molybdenum oxide (for example, MoO, $Mo_2O_3$, $MoO_2$, $MoO_3$, or $Mo_2O_5$), and rhenium oxide (for example, $ReO_3$).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, or $TiI_4$), zirconium halide (for example, $ZrF_4$, $ZrCl_4$, $ZrBr_4$, or $ZrI_4$), hafnium halide (for example, $HfF_4$, $HfCl_4$, $HfBr_4$, or $HfI_4$), vanadium halide (for example, $VF_3$, $VCl_3$, $VBr_3$, or $VI_3$), niobium halide (for example, $NbF_3$, $NbCl_3$, $NbBr_3$, or $NbI_3$), tantalum halide (for example, $TaF_3$, $TaCl_3$, $TaBr_3$, or $TaI_3$), chromium halide (for example, $CrF_3$, $CrCl_3$, $CrBr_3$, or $CrI_3$), molybdenum halide (for example, $MoF_3$, $MoCl_3$, $MoBr_3$, or $MoI_3$), tungsten halide (for example, $WF_3$, $WCl_3$, $WBr_3$, or $WI_3$), manganese halide (for example, $MnF_2$, $MnCl_2$, $MnBr_2$, or $MnI_2$), technetium halide (for example, $TcF_2$, $TcCl_2$, $TcBr_2$, or $TcI_2$), rhenium halide (for example, $ReF_2$, $ReCl_2$, $ReBr_2$, or $ReI_2$), iron halide (for example, $FeF_2$, $FeCl_2$, $FeBr_2$, or $FeI_2$), ruthenium halide (for example, $RuF_2$, $RuCl_2$, $RuBr_2$, or $RuI_2$), osmium halide (for example, $OsF_2$, $OsCl_2$, $OsBr_2$, or $OsI_2$), cobalt halide (for example, $CoF_2$, $CoCl_2$, $CoBr_2$, or $CoI_2$), rhodium halide (for example, $RhF_2$, $RhCl_2$, $RhBr_2$, or $RhI_2$), iridium halide (for example, $IrF_2$, $IrCl_2$, $IrBr_2$, or $IrI_2$), nickel halide (for example, $NiF_2$, $NiCl_2$, $NiBr_2$, or $NiI_2$), palladium halide (for example, $PdF_2$, $PdCl_2$, $PdBr_2$, or $PdI_2$), platinum halide (for example, $PtF_2$, $PtCl_2$, $PtBr_2$, or $PtI_2$), copper halide (for example, CuF, CuCl, CuBr, or CuI), silver halide (for example, AgF, AgCl, AgBr, or AgI), and gold halide (for example, AuF, AuCl, AuBr, or AuI).

Examples of the post-transition metal halide are zinc halide (for example, $ZnF_2$, $ZnCl_2$, $ZnBr_2$, or $ZnI_2$), indium halide (for example, $InI_3$), and tin halide (for example, $SnI_2$).

Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

An example of the metalloid halide is antimony halide (for example, $SbCl_5$).

Examples of the metal telluride are an alkali metal telluride (for example, $Li_2Te$, $Na_2Te$, $K_2Te$, $Rb_2Te$, or $Cs_2Te$), alkaline earth metal telluride (for example, BeTe, MgTe, CaTe, SrTe, or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), post-transition metal telluride (for example, ZnTe), and lanthanide metal telluride (for example, LaTe, CeTe, PrTe, NdTe, PmTe, EuTe, GdTe, TbTe, DyTe, HoTe, ErTe, TmTe, YbTe, or LuTe).

[Emission Layer 132-1, 132-2, . . . Or **132-*m* in Interlayer 130**]

In an embodiment, when the organic light-emitting device 10 is a full-color organic light-emitting device, the emission layer 132-1, 132-2, . . . or **132-*m* may each be patterned into a red emission layer, a green emission layer, and/or a blue emission layer, according to a subpixel. In embodiments, the emission layer 132-1, 132-2, . . . or 132-*m* may each have a stacked structure of two or more layers among a red emission layer, a green emission layer, and a blue emission layer, in which the two or more layers contact each other or are separated from each other. In embodiments, the emission layer 132-1, 132-2, . . . or 132-*m*** may each include two or more materials among a red light-emitting material, a green light-emitting material, and a blue light-emitting material, in which the two or more materials are mixed with each other in a single layer to emit white light.

The emission layer 132-1, 132-2, . . . or **132-*m*** may be the same as described above.

In an embodiment, the emission layer 132-1, 132-2, . . . or **132-*m*** may include a dopant and a host, and an amount of the dopant may be in a range of about 0.01 parts by weight to about 15 parts by weight based on 100 parts by weight of the host.

In embodiments, the emission layer 132-1, 132-2, . . . or **132-*m*** may include quantum dots.

In embodiments, the emission layer 132-1, 132-2, . . . or **132-*m* may include a delayed fluorescence material. The delayed fluorescence material may serve as a host or a dopant in the emission layer 132-1, 132-2, . . . or 132-*m***.

A thickness of the emission layer 132-1, 132-2, . . . or **132-*m* may each be in a range of about 100 Å to about 1,000 Å. For example, the thickness of the emission layer 132-1, 132-2, . . . or 132-*m* may each be in a range of about 200 Å to about 600 Å. When the thickness of the emission layer 132-1, 132-2, . . . or 132-*m*** is within these ranges, excellent light-emission characteristics may be obtained without a substantial increase in driving voltage.

[Host]

The host may be the same as described in connection with a first compound and a second compound.

The host may further include a compound represented by Formula 301 within a range that satisfies the conditions defined with respect to the first emission layer and the second emission layer:

$$[Ar_{301}]_{xb11}\text{-}[(L_{301})_{xb1}\text{-}R_{301}]_{xb21} \qquad \text{[Formula 301]}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer of 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer of 1 to 5, and $Q_{301}$ to $Q_{303}$ may each be the same as described in connection with $Q_1$.

In an embodiment, when xb11 in Formula 301 is 2 or more, two or more of $Ar_{301}$(s) may be linked to each other via a single bond.

In embodiments, the host may include a compound represented by Formula 301-1, a compound represented by Formula 301-2, or any combination thereof:

[Formula 301-1]

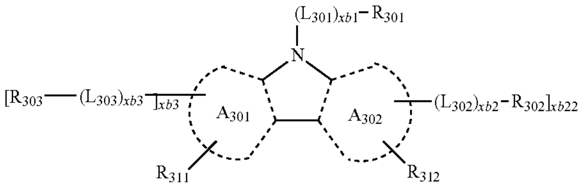

[Formula 301-2]

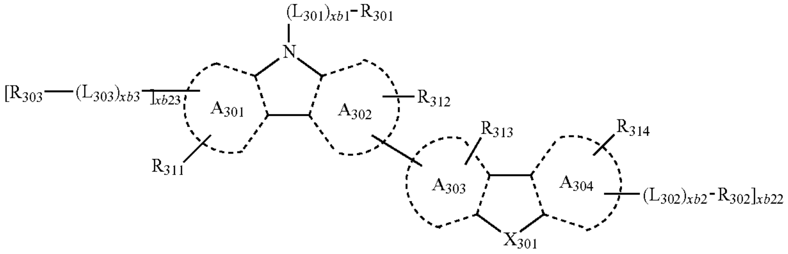

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, $N[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described above, $L_{302}$ to $L_{304}$ may each independently be the same as described in connection with $L_{301}$, xb2 to xb4 may each independently be the same as described in connection with xb1, and $R_{302}$ to $R_{305}$ and R311 to $R_3$14 may each be the same as described in connection with $R_{301}$.

In embodiments, the host may include an alkaline earth metal complex. In embodiments, the host may be a Be complex (for example, Compound H55), a Mg complex, a Zn complex, or any combination thereof.

In embodiments, the host may include one of Compounds H1 to H125, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di(N-carbazolyl)benzene (mCP), 1,3,5-tri(carbazol-9-yl)benzene (TCP), 2,2',2''-(1,3,5-benzinetriyl)-tris(1-phenyl-1H-benzimidazole) (TPBi), or any combination thereof, but embodiments of the disclosure are not limited thereto:

H1

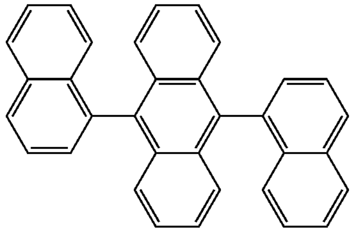

-continued

H2

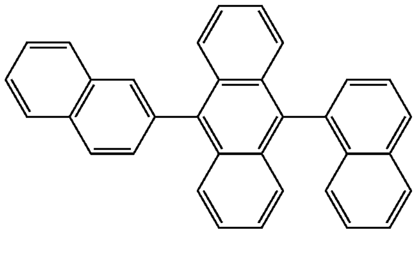

-continued
H3
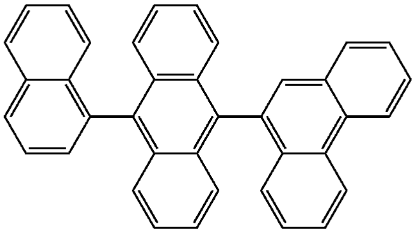
H4
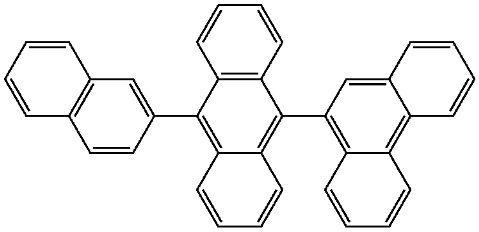
H5
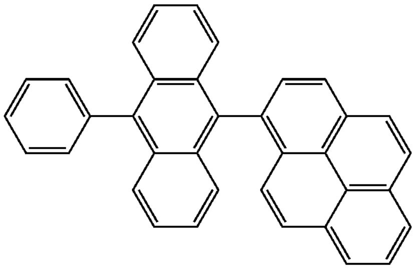
H6
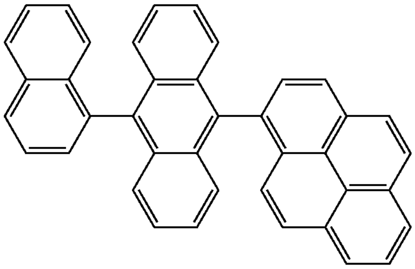
H7
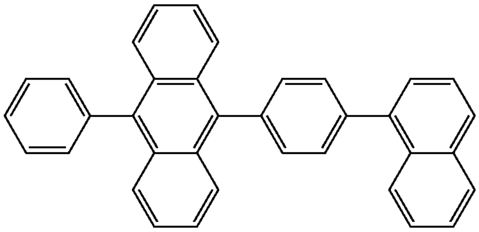
H8
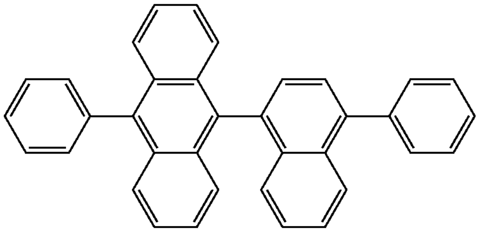
-continued
H9
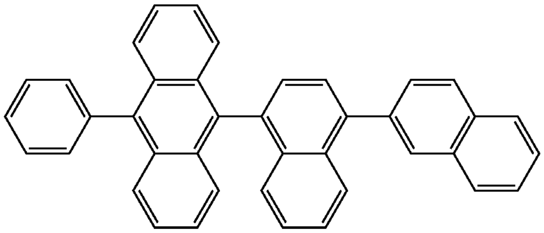
H10
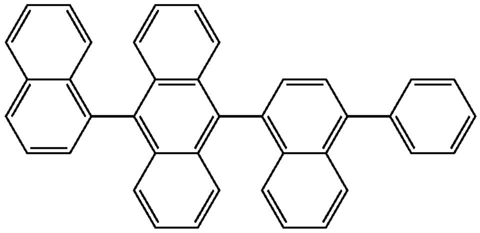
H11
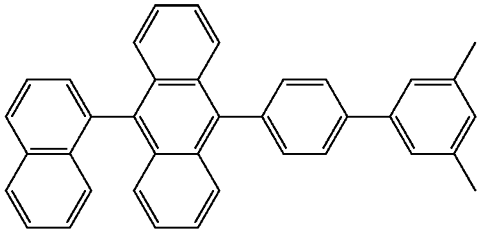
H12
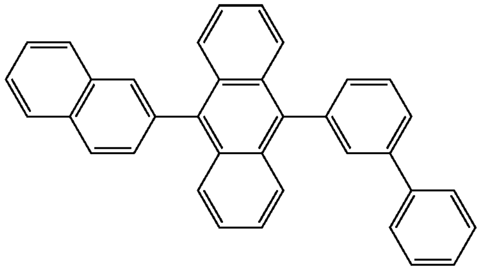
H13
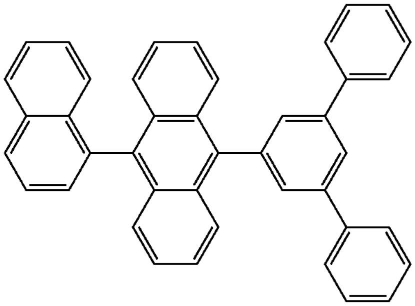

-continued
H14
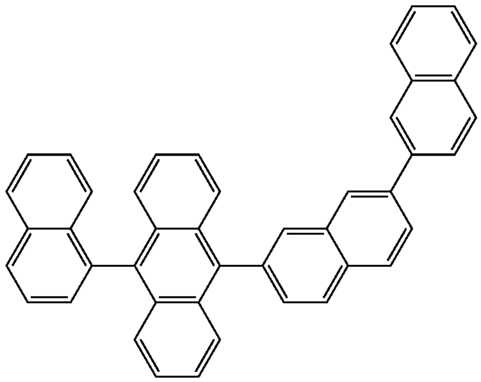
H15
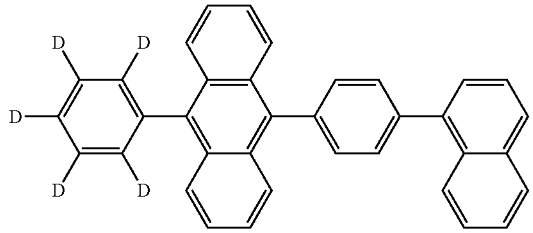
H16
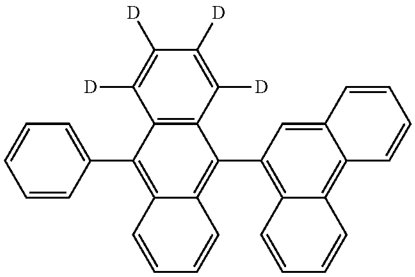
H17
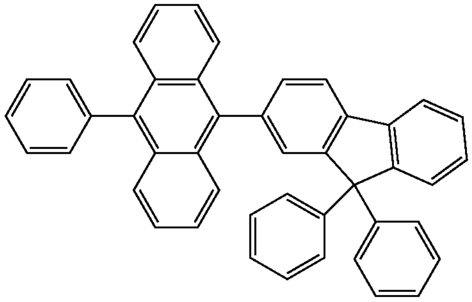
H18
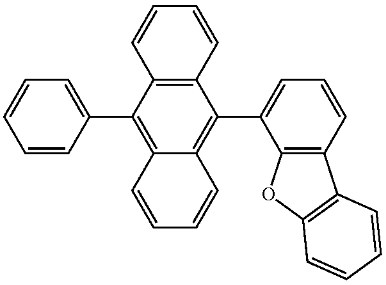
-continued
H19
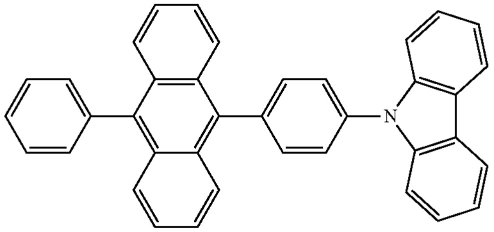
H20
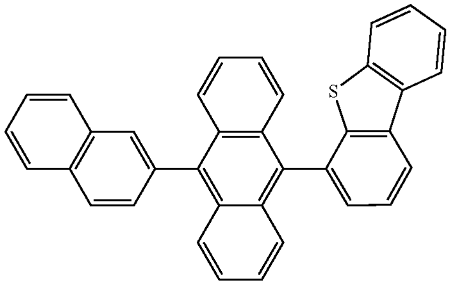
H21
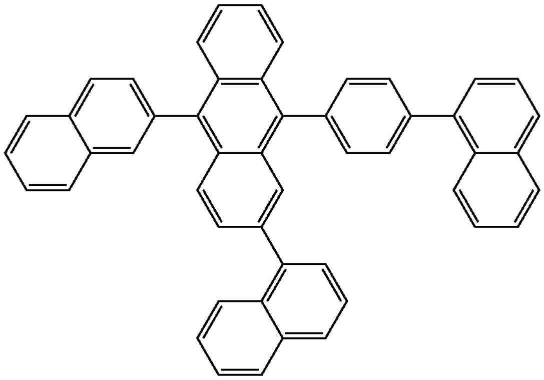
H22
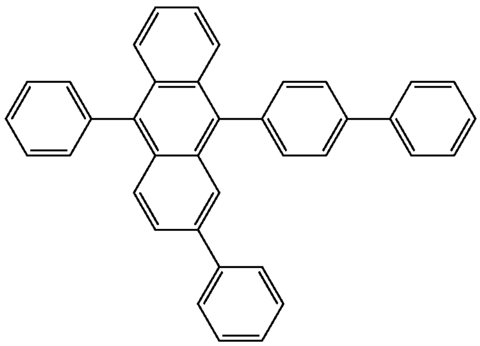

-continued
H23
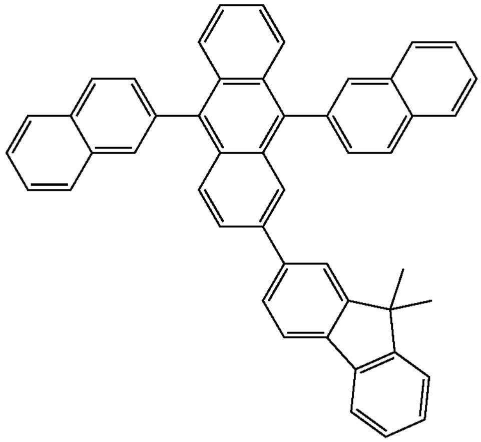
H24
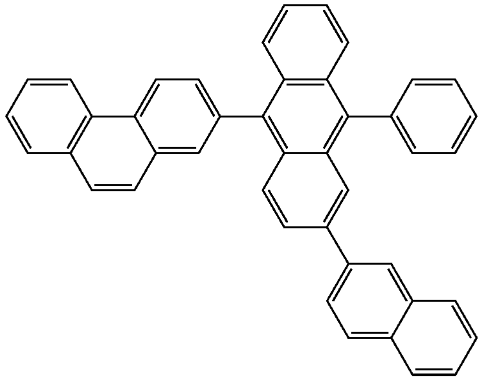
H25
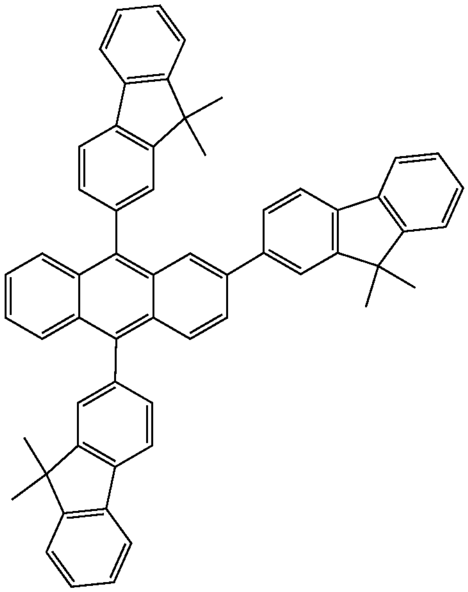
-continued
H26
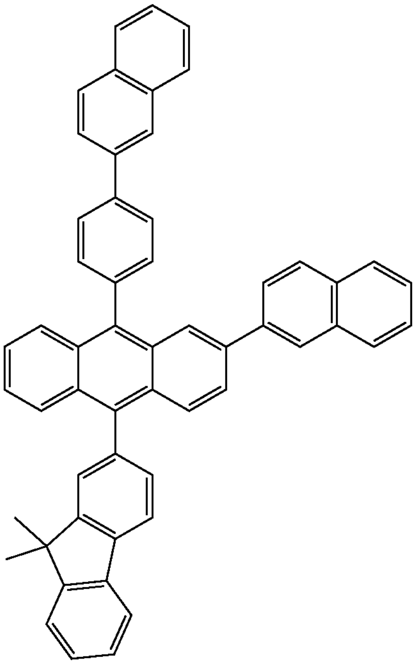
H27
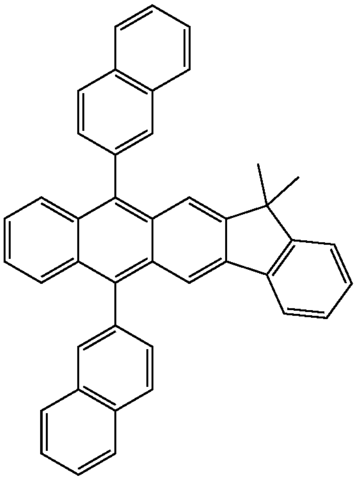
H28
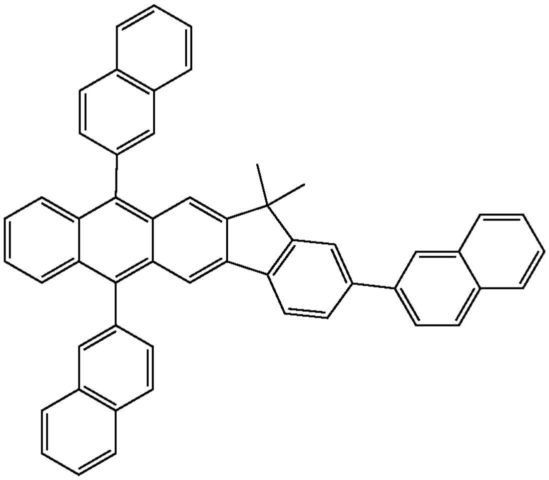

-continued
H29
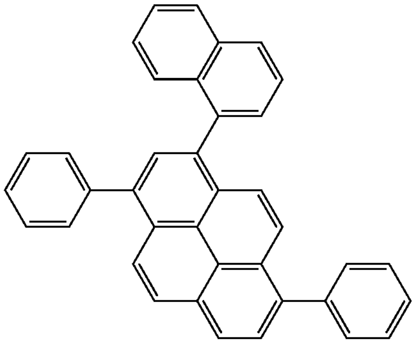
H30
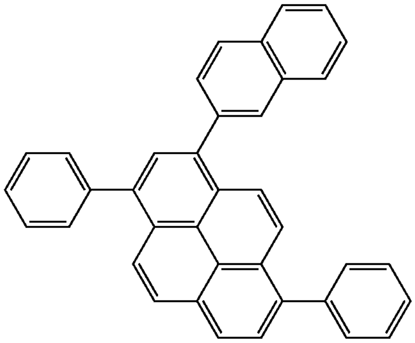
H31
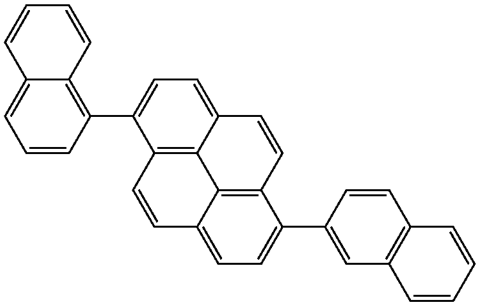
H32
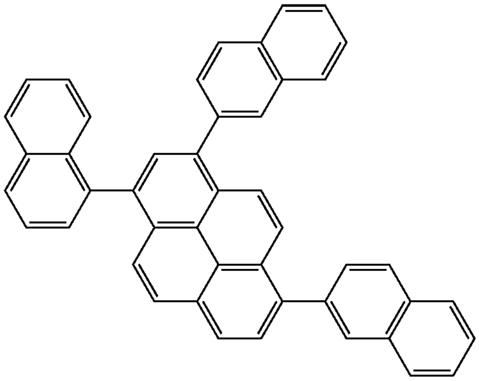
H33
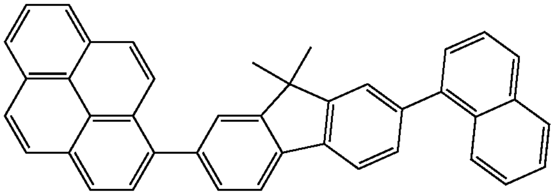
-continued
H34
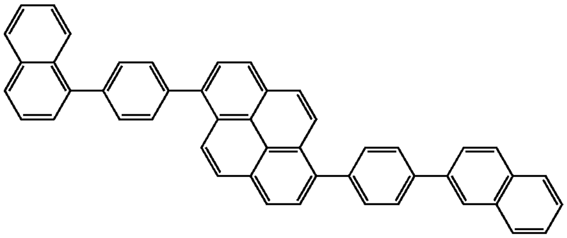
H35
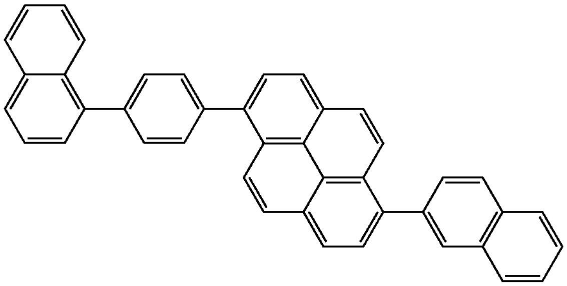
H36
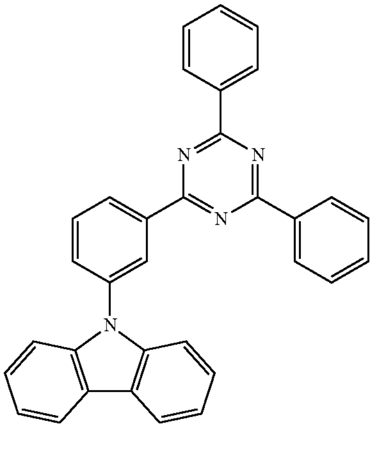
H37
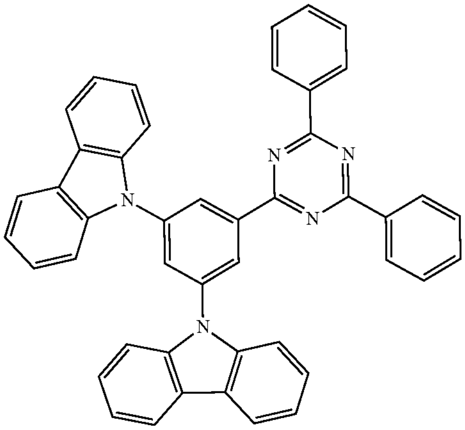

-continued
H38
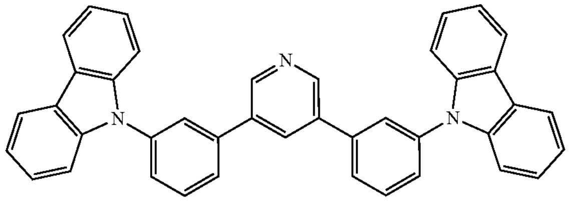
H39
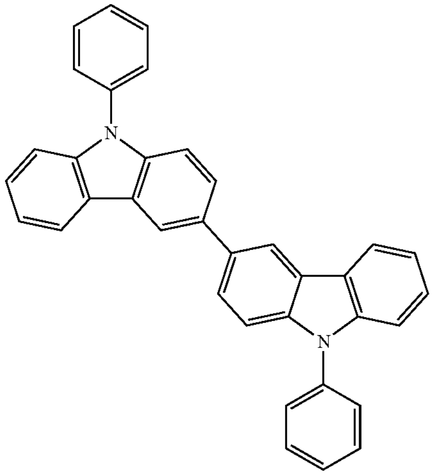
H40
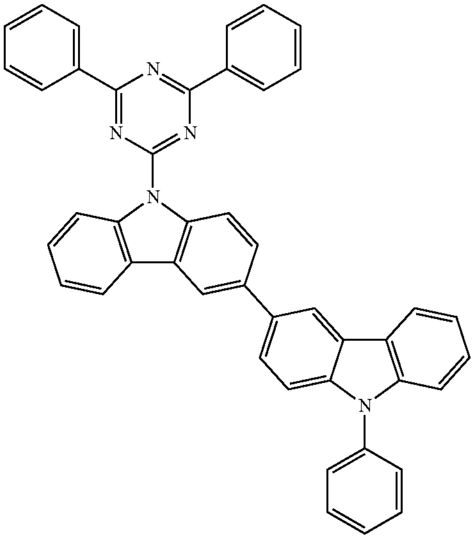
-continued
H41
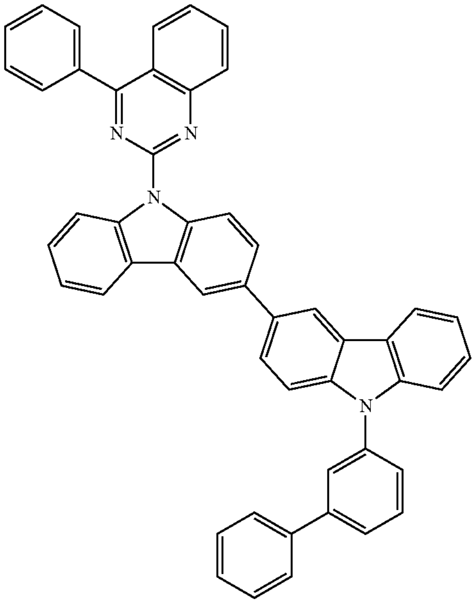
H42
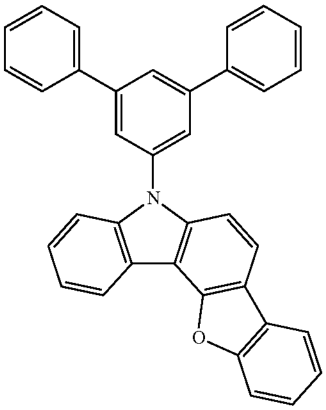
H43
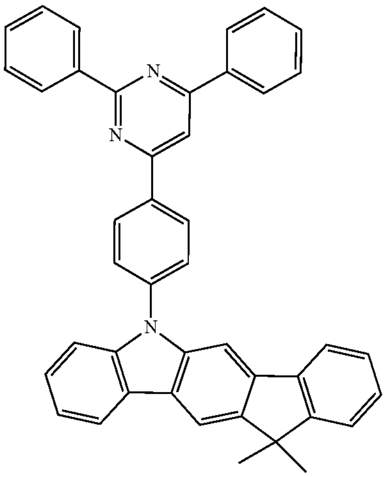

-continued
H44
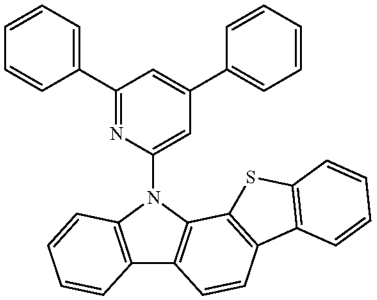
H45
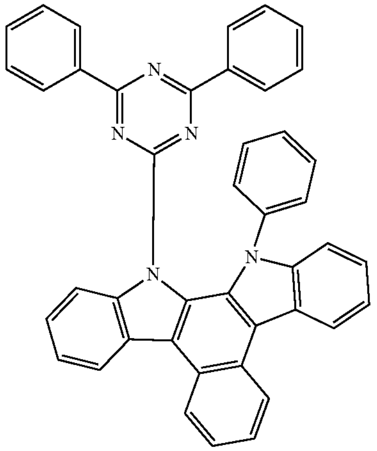
H46
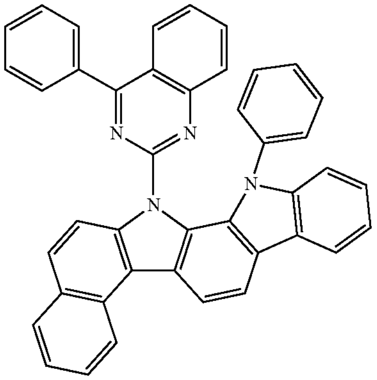
H47
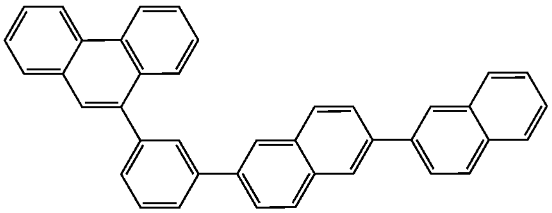
H48
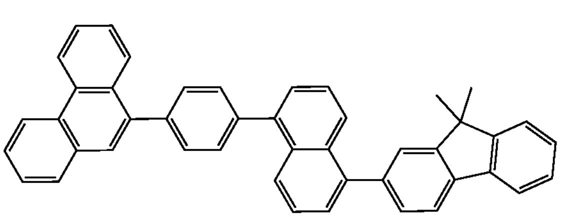
-continued
H49
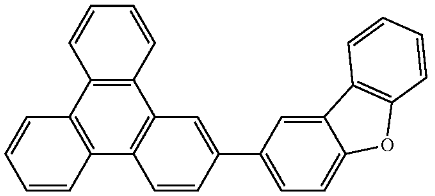
H50
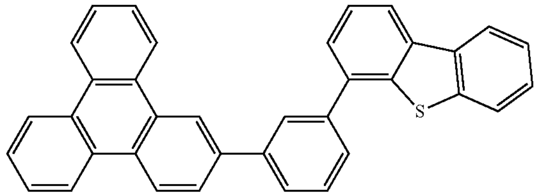
H51
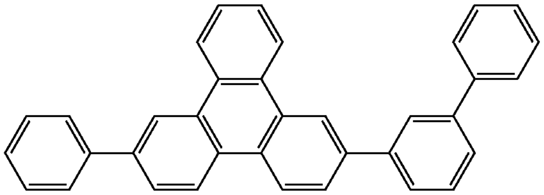
H52
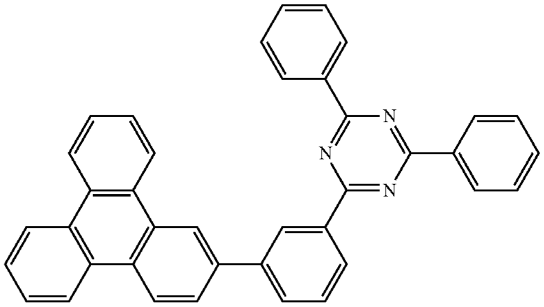
H53
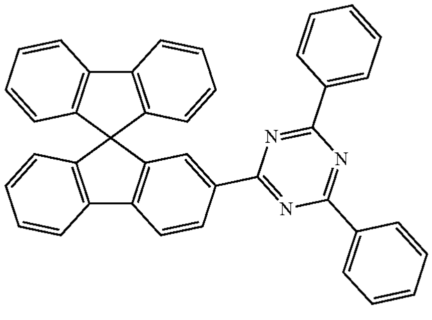

-continued
H54
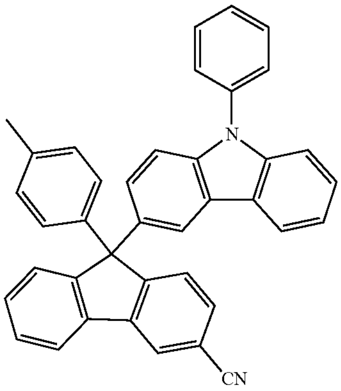
H55
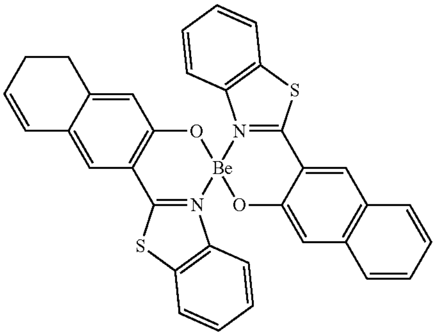
H56
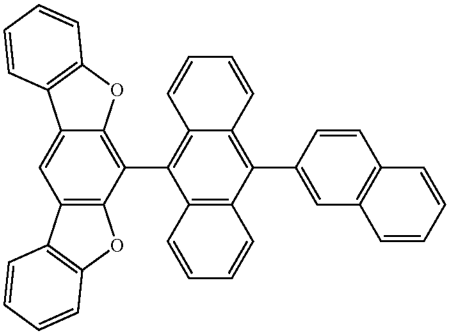
H57
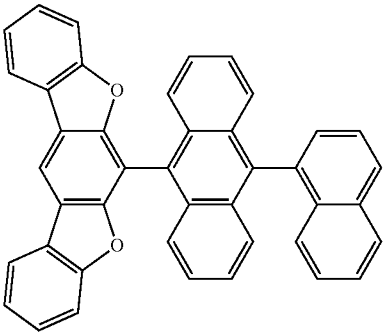
-continued
H58
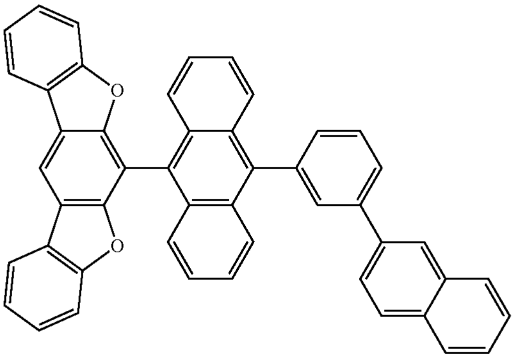
H59
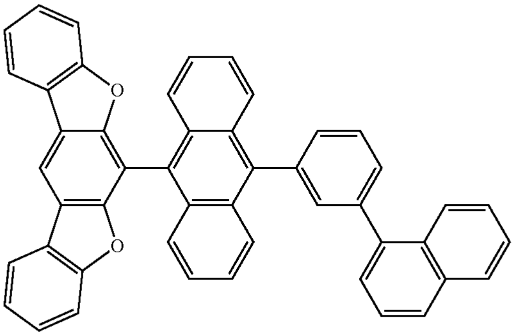
H60
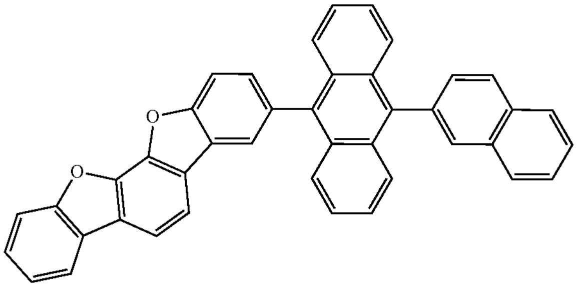
H61
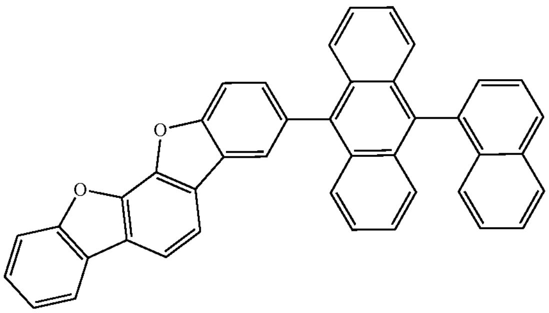

-continued
H62
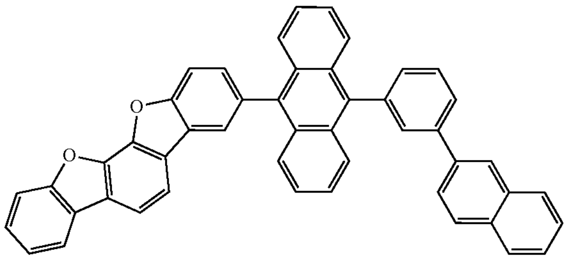
H63
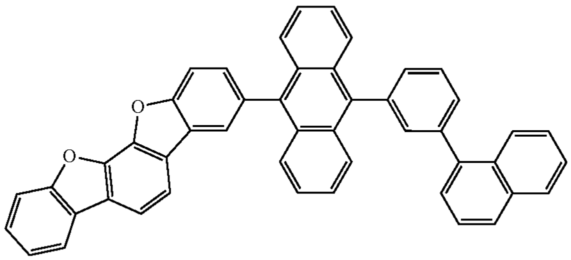
H64
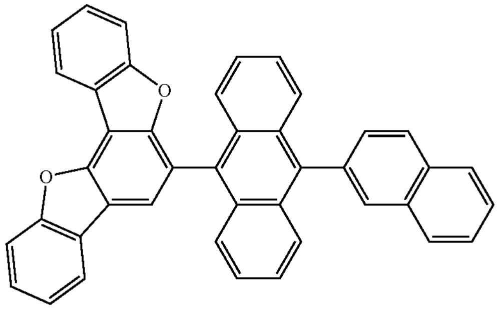
H65
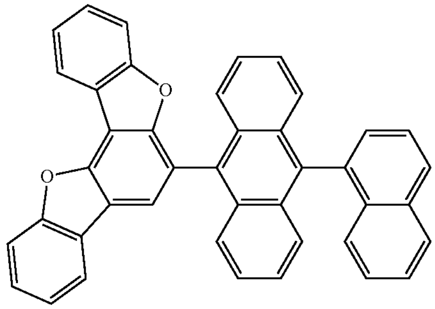
H66
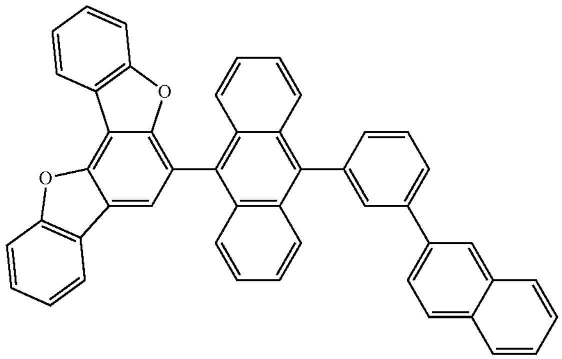
-continued
H67
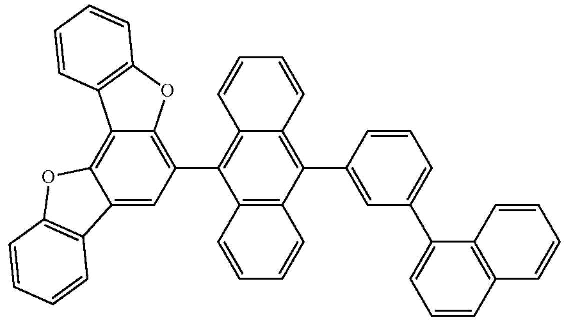
H68
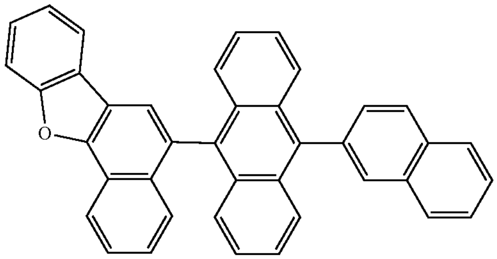
H69
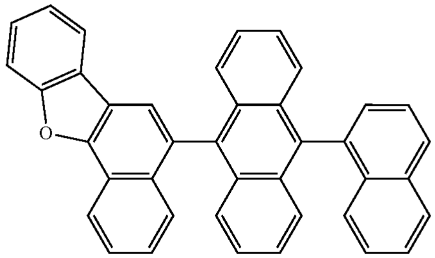
H70
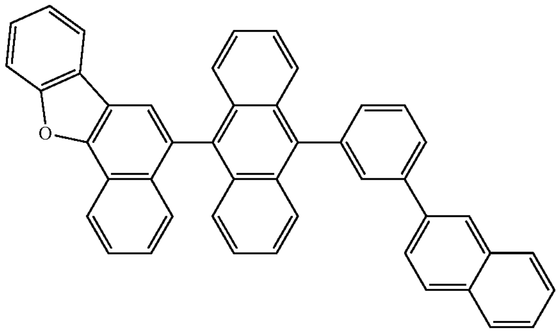
H71
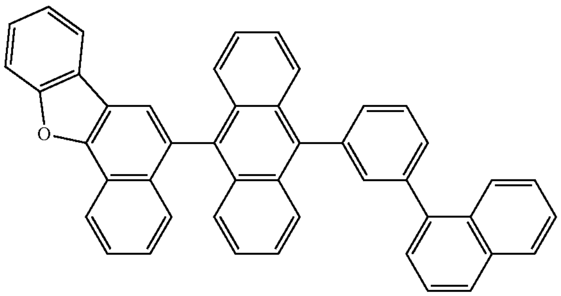

-continued
H72
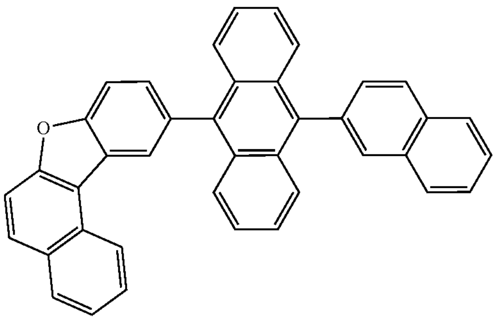
H73
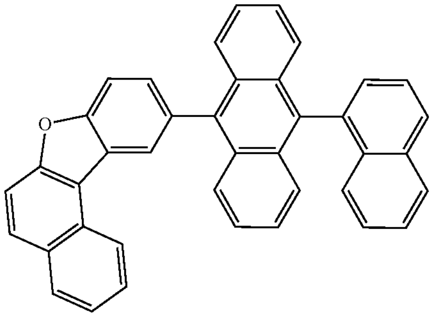
H74
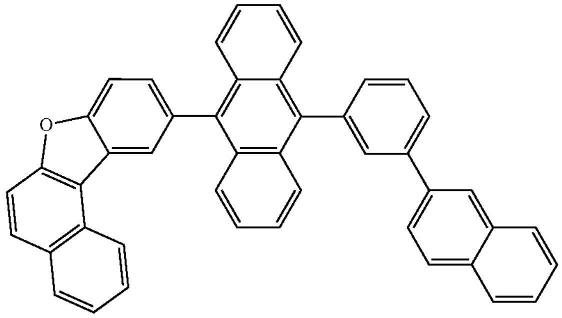
H75
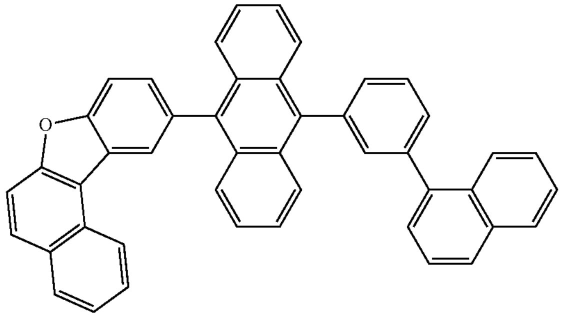
H76
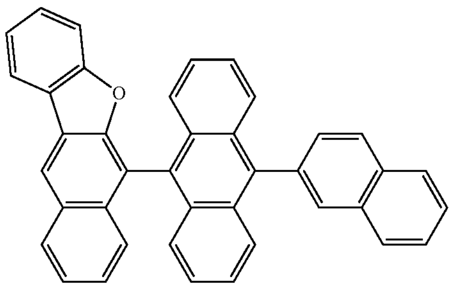
-continued
H77
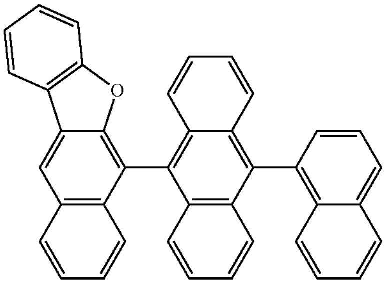
H78
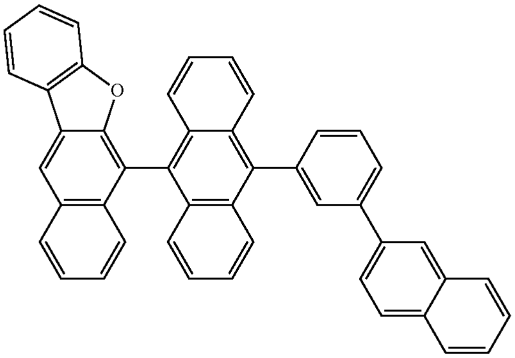
H79
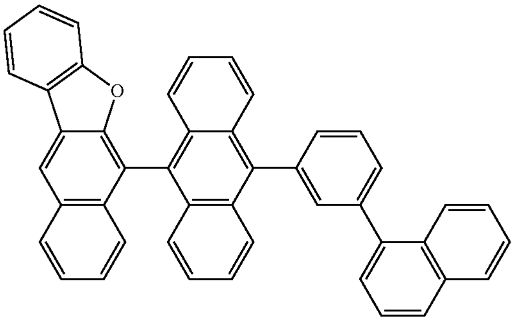
H80
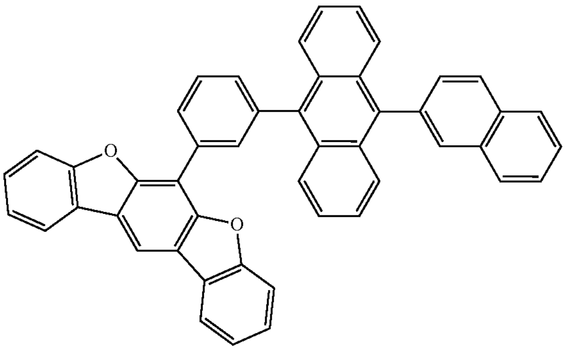

-continued
H81
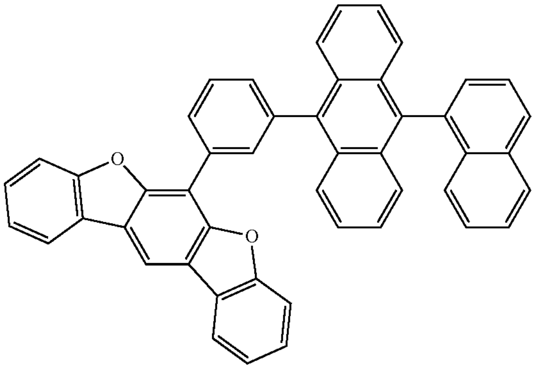
H82
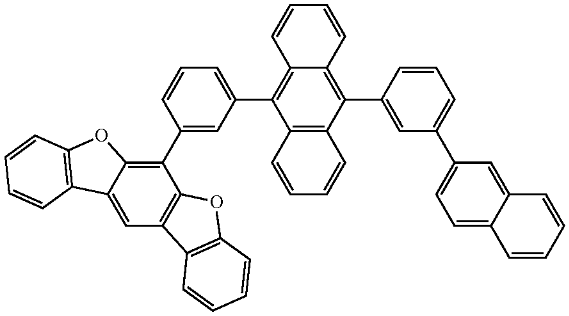
H83
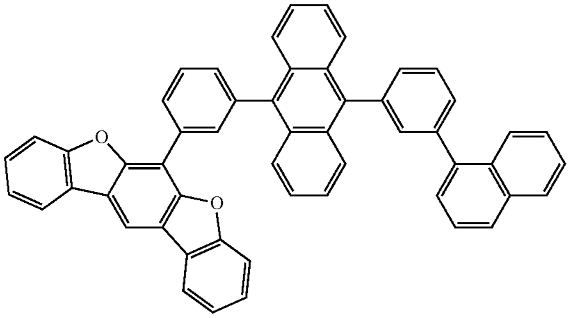
H84
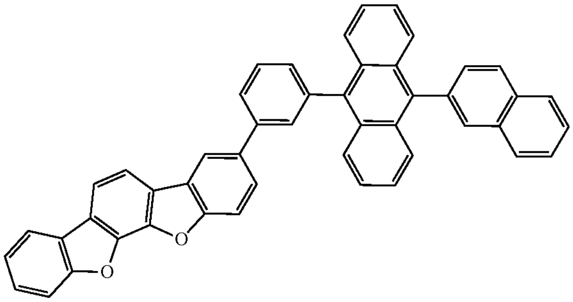
-continued
H85
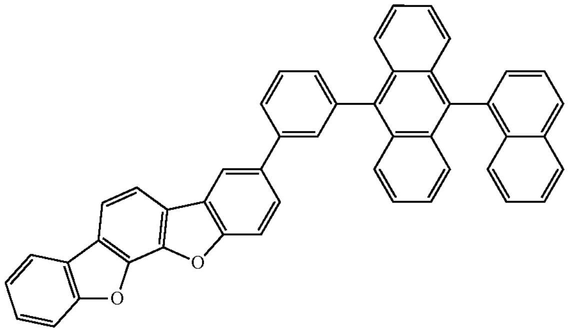
H86
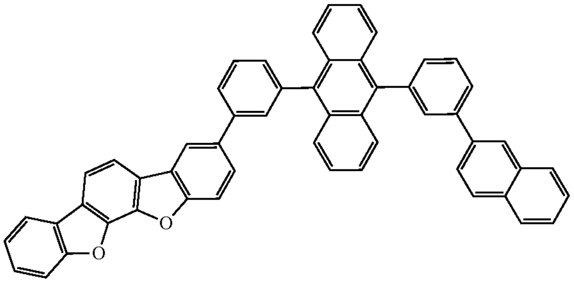
H87
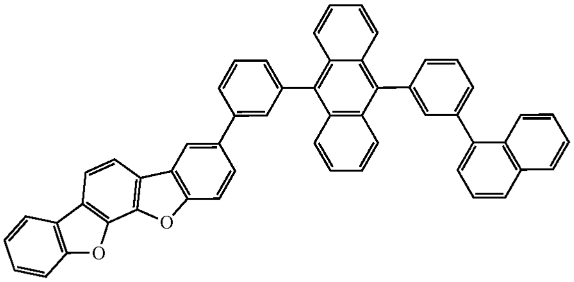
H88
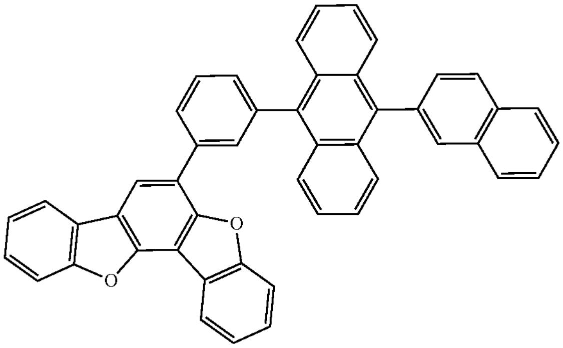

-continued
H89
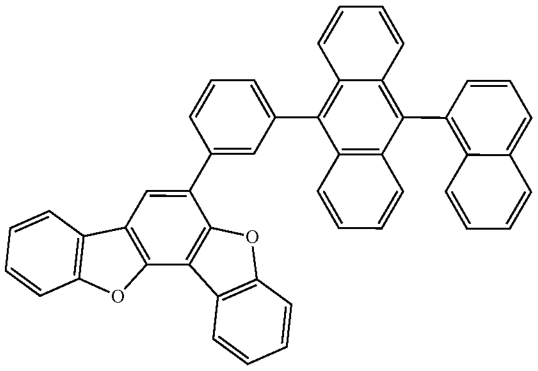
H90
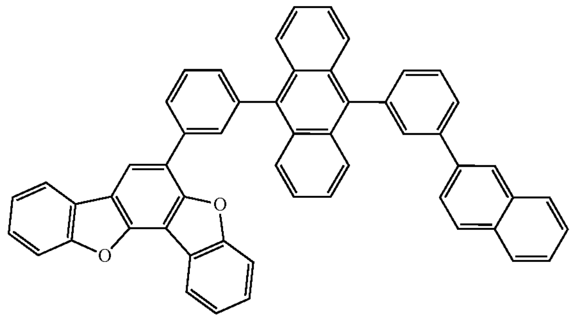
H91
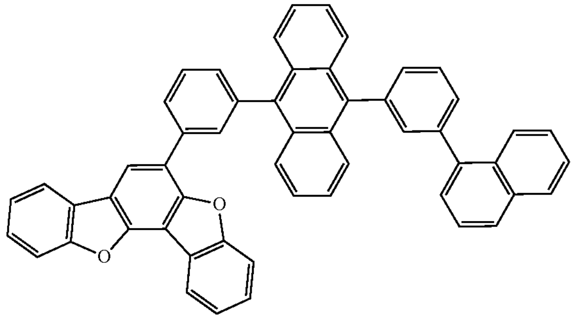
H92
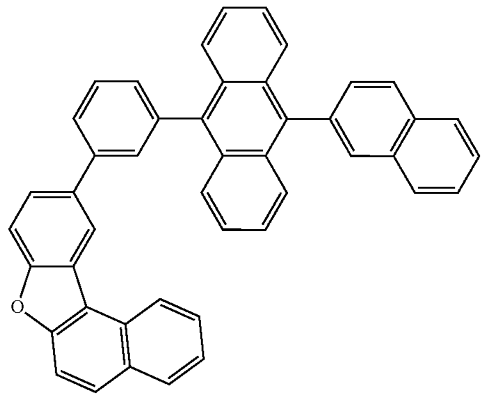
-continued
H93
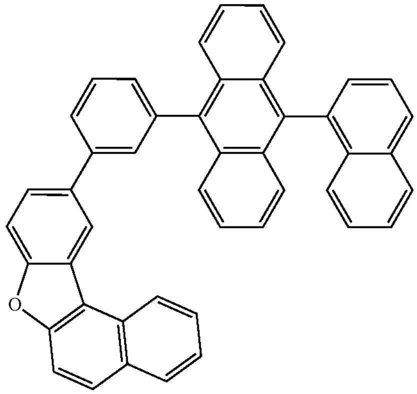
H94
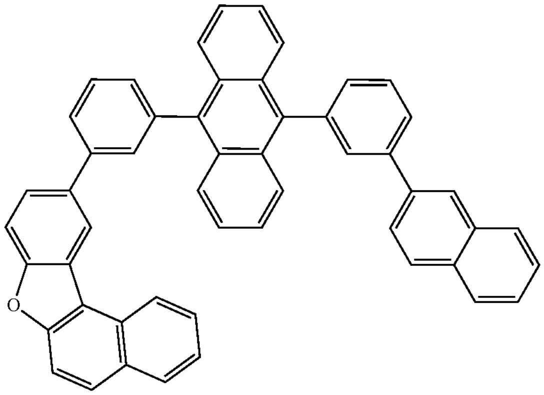
H95
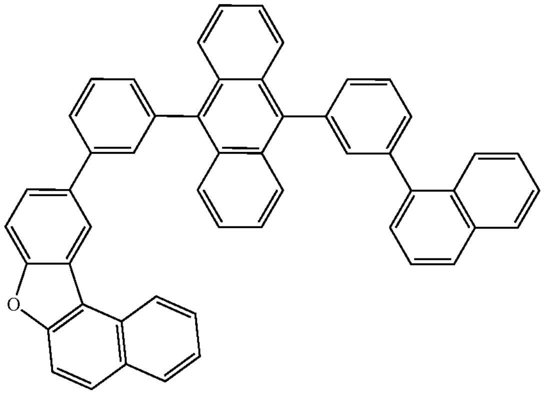
H96
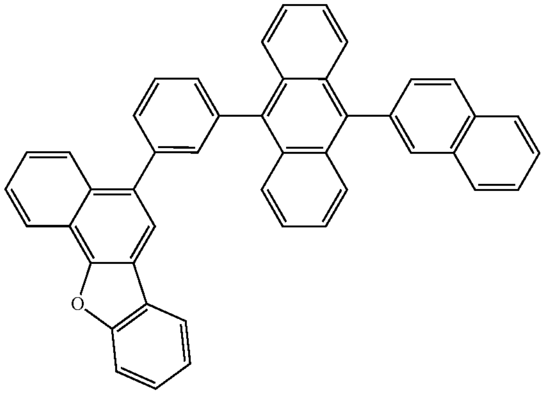

-continued
H97
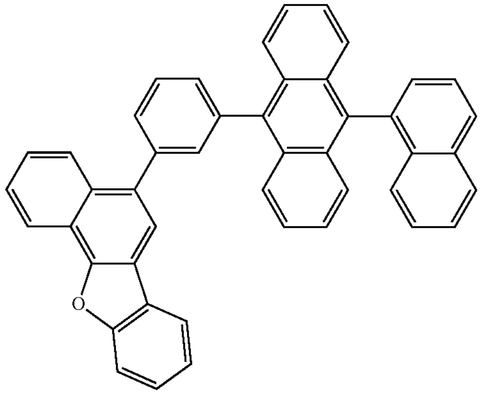
H98
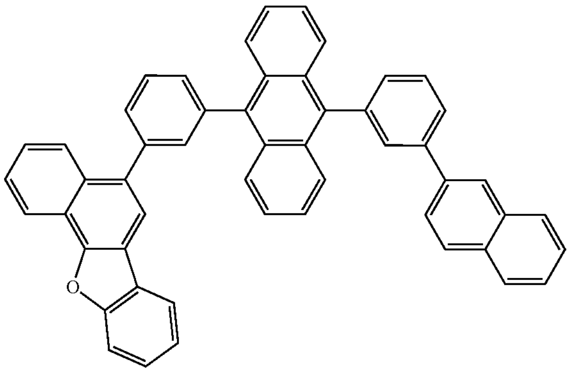
H99
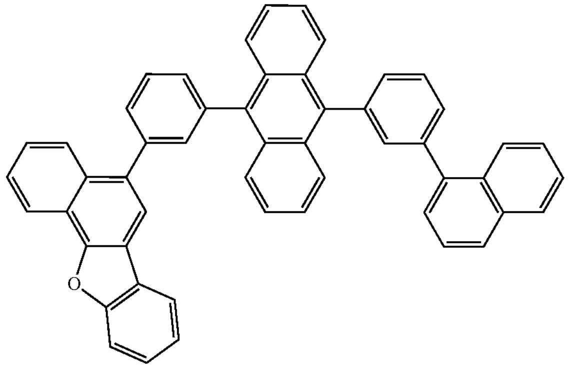
H100
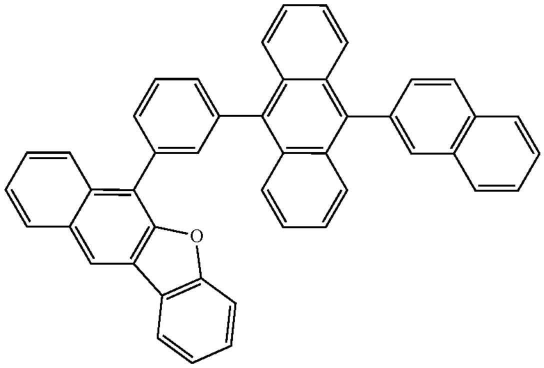
-continued
H101
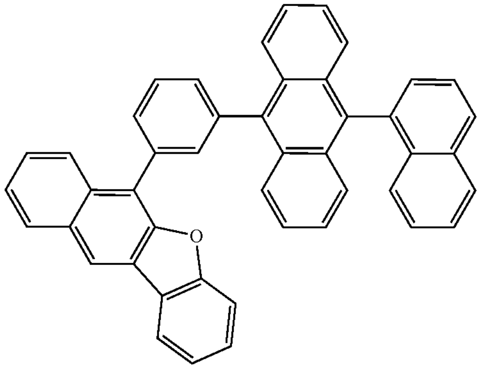
H102
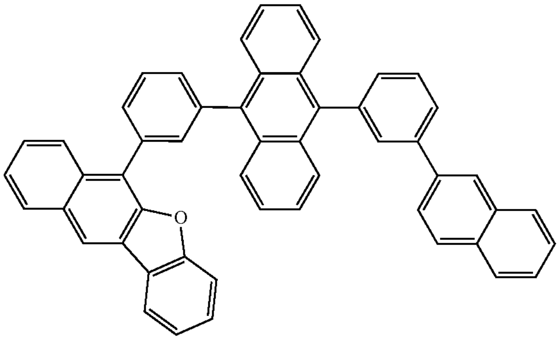
H103
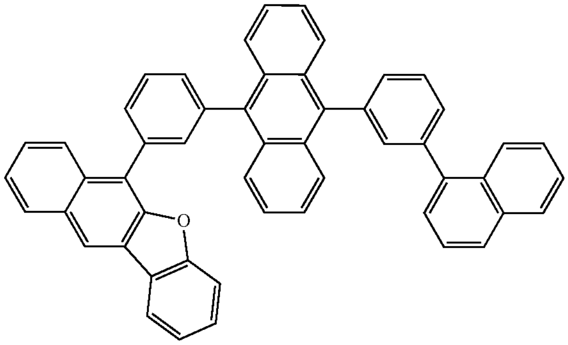
H104
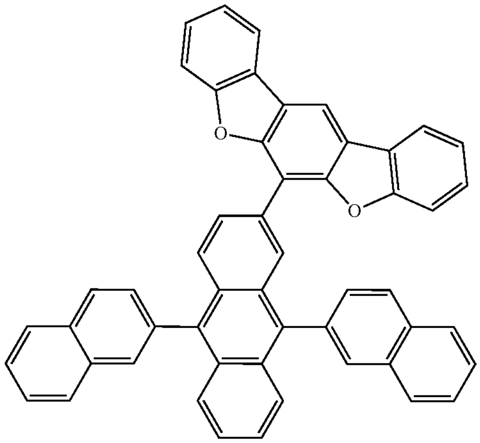

-continued
H105
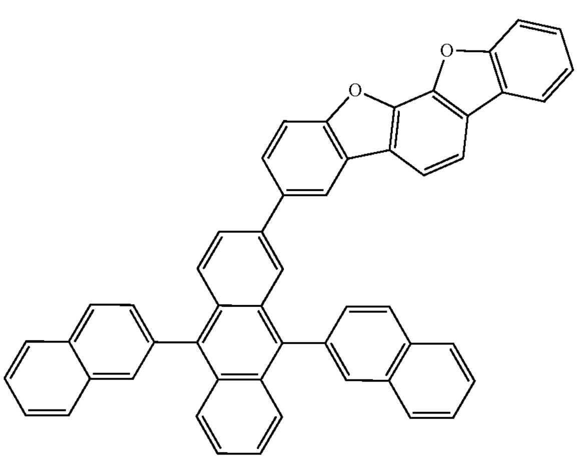
H106
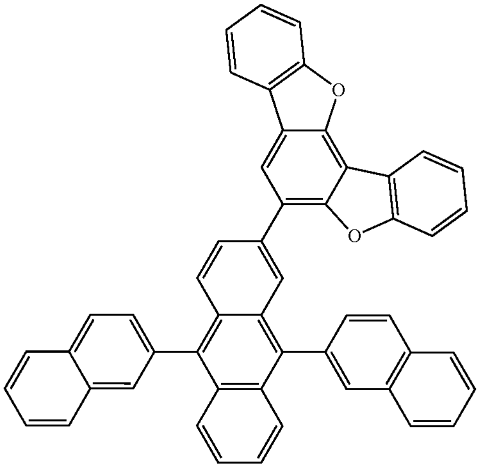
H107
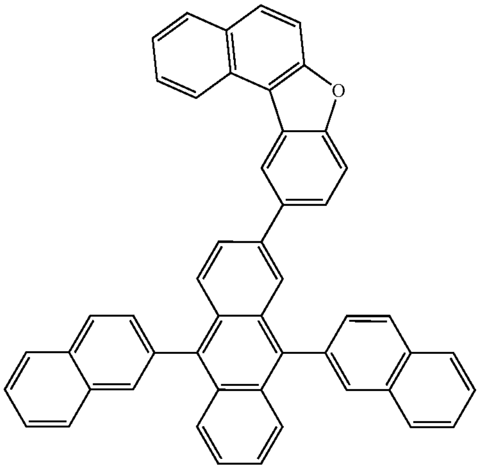
H108
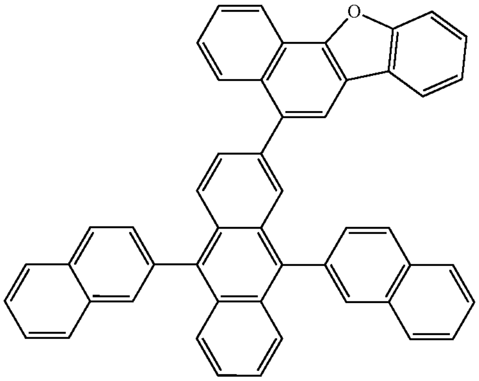
H109
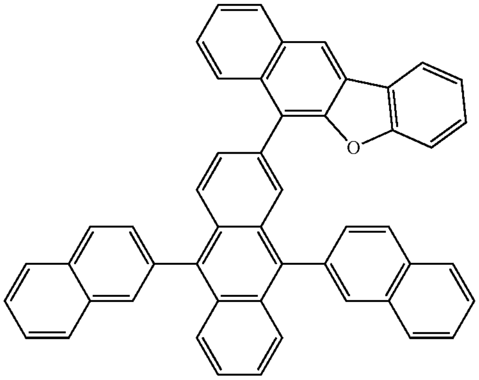
H110
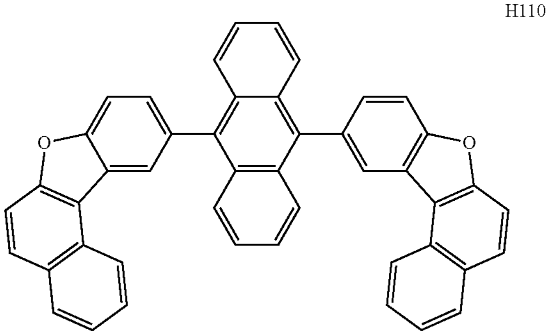
H111
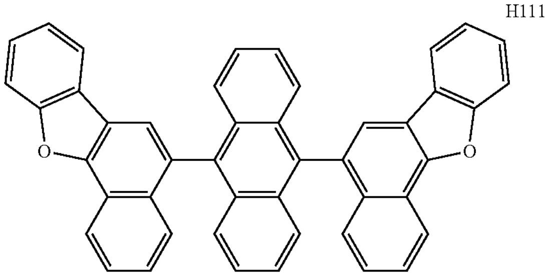
H112
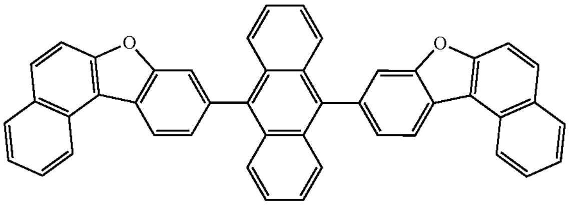

-continued
H113
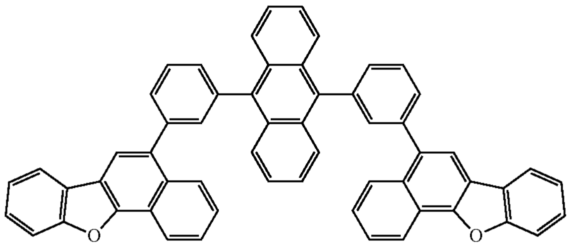
H114
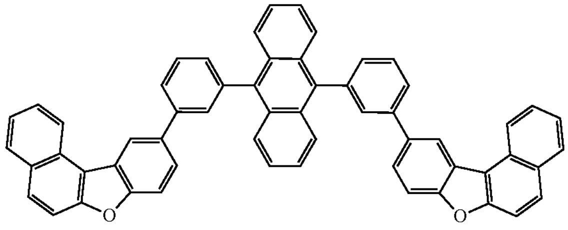
H115
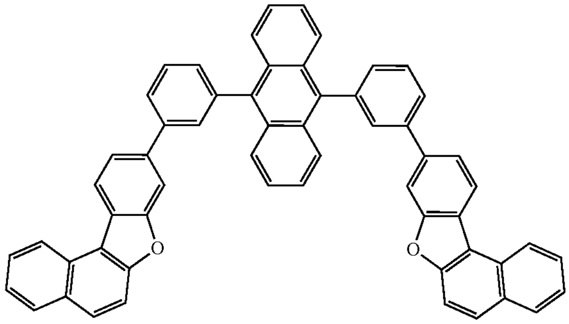
H116
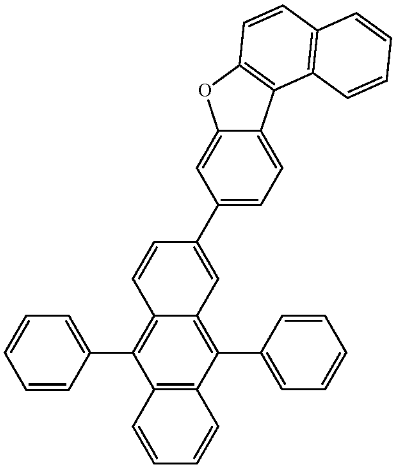
-continued
H117
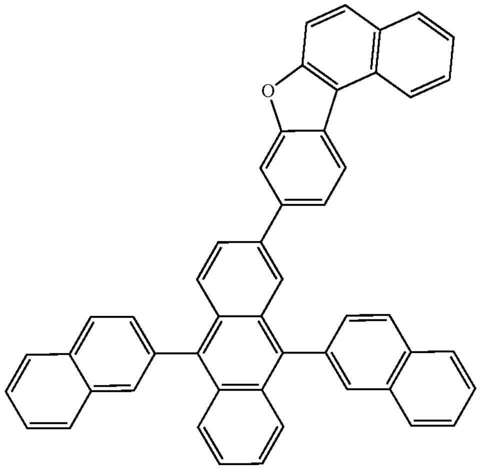
H118
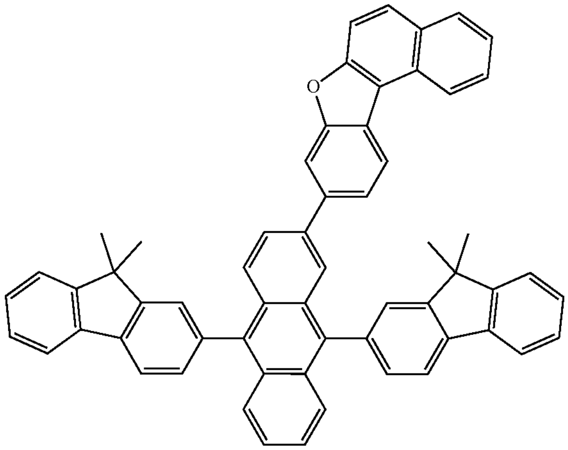
H119
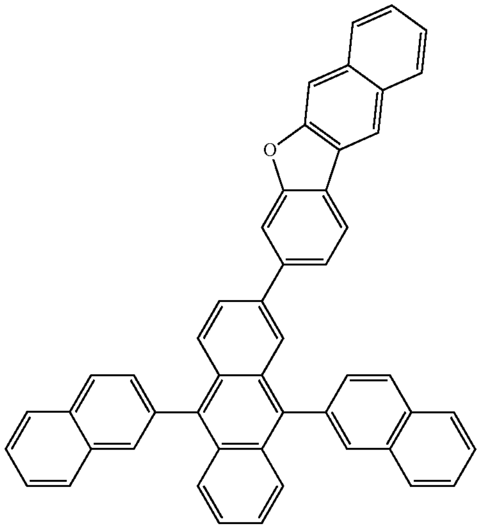

-continued

H120

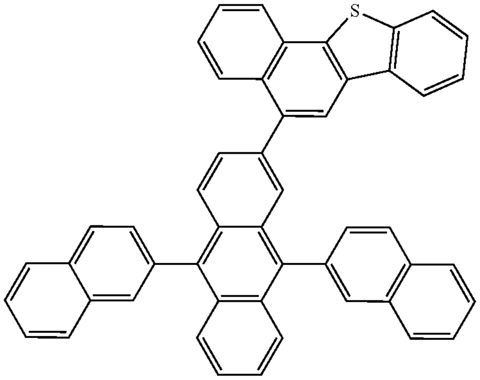

H121

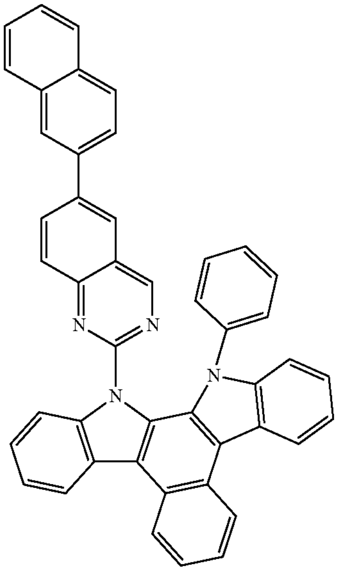

H122

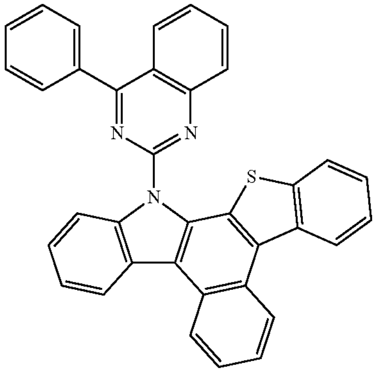

-continued

H123

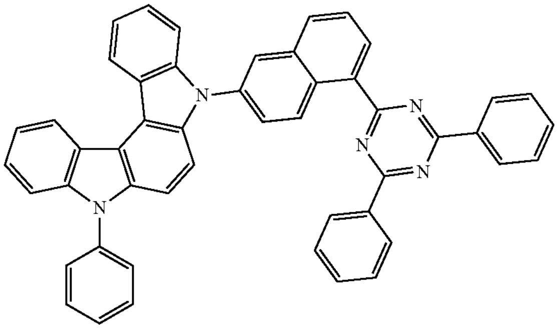

H124

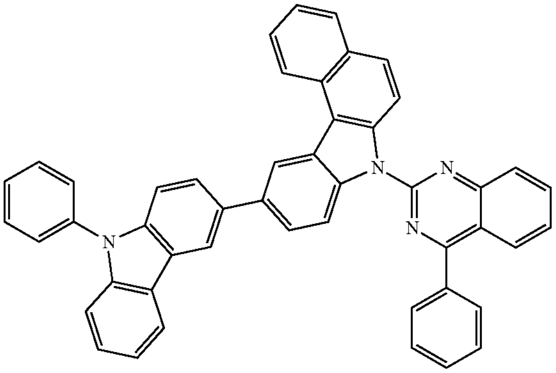

H125

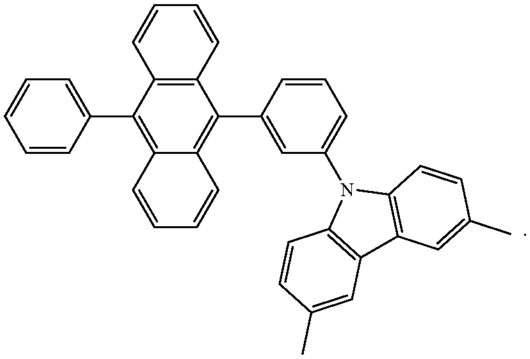

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2} \quad \text{[Formula 401]}$$

[Formula 402]

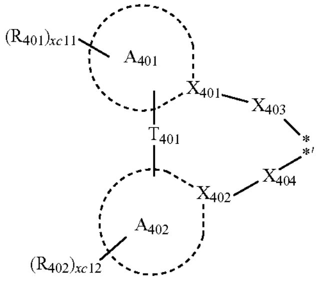

wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer of 0 to 10, and

* and *' in Formula 402 each indicate a binding site to M in Formula 401.

In embodiments, in Formula 402, i) $X_{401}$ may be nitrogen, and $X_{402}$ may be carbon, or ii) each of $X_{401}$ and $X_{402}$ may be nitrogen.

In embodiments, when xc1 in Formula 401 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ may each be the same as described in connection with $T_{401}$.

In Formula 401, $L_{402}$ may be an organic ligand. For example, $L_{402}$ may be a halogen group, a diketone group (for example, an acetylacetonate group), a carboxylic acid group (for example, a picolinate group), —C(=O), an isonitril group, a —CN group, a phosphorus group (for example, a phosphine group or a phosphite group), or any combination thereof.

The phosphorescent dopant may include, for example, one of Compounds PD1 to PD25, or any combination thereof:

PD1

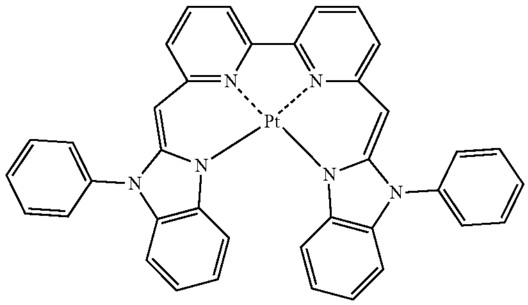

PD2

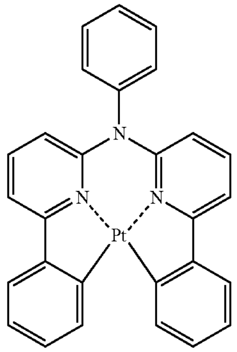

PD3

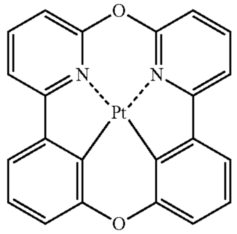

PD4

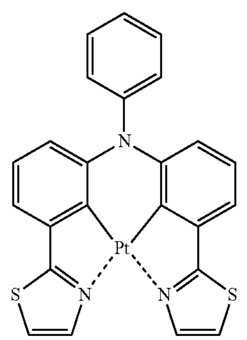

-continued
PD5
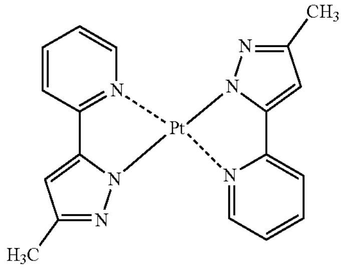
PD6
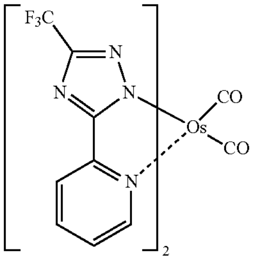
PD7
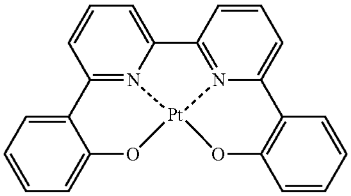
PD8
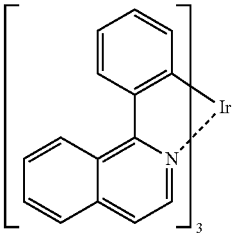
PD9
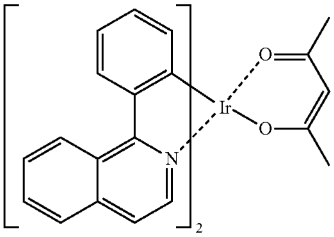
PD10
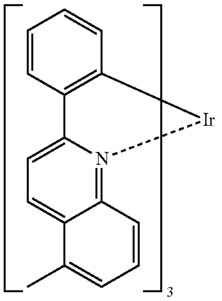
-continued
PD11
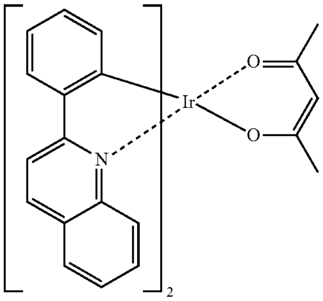
PD12
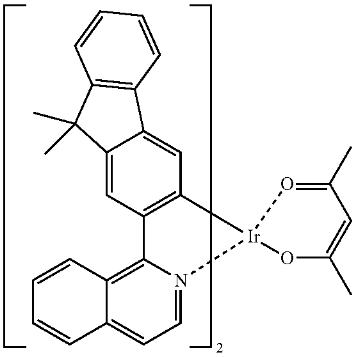
PD13
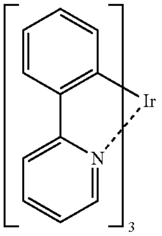
PD14
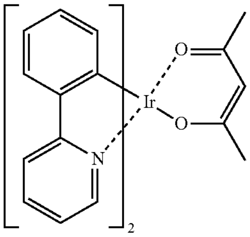
PD15
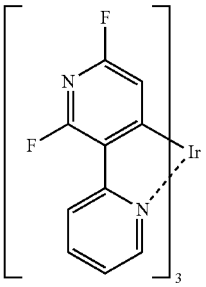

-continued
PD16
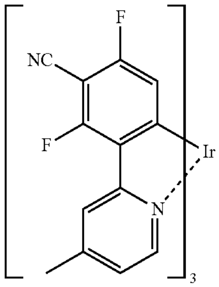
PD17
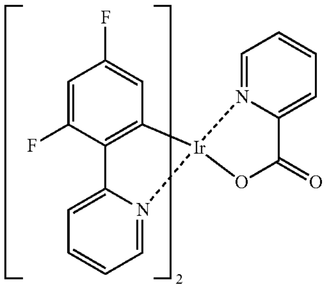
PD18
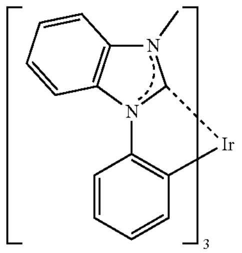
PD19
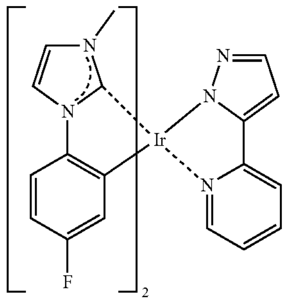
PD20
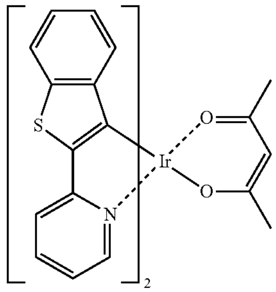
-continued
PD21
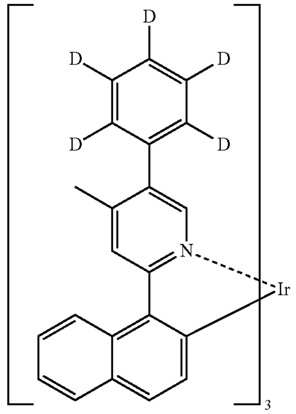
PD22
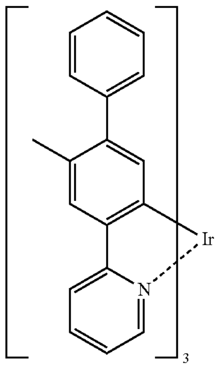
PD23
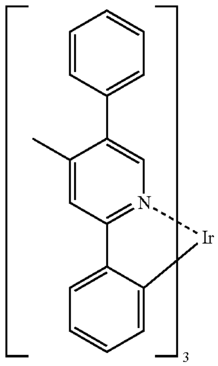
PD24
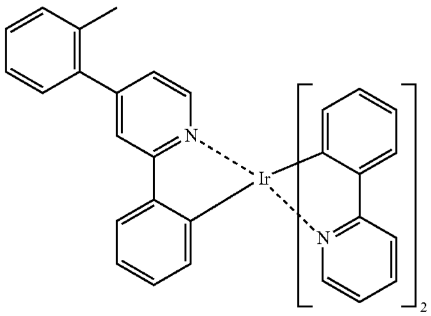

-continued

PD25

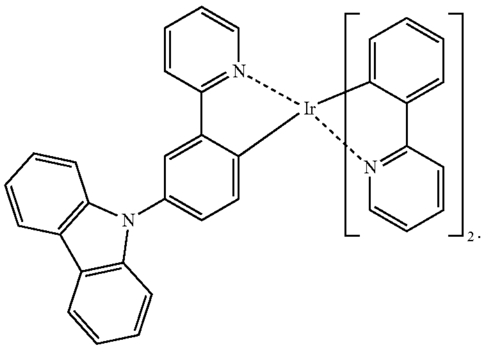

[Fluorescent Dopant]

The fluorescent dopant may include an amine group-containing compound, a styryl group-containing compound, or any combination thereof.

In an embodiment, the fluorescent dopant may include a compound represented by Formula 501:

Formula 501

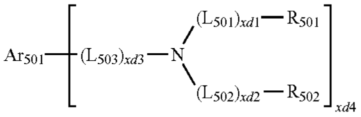

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In embodiments, xd4 in Formula 501 may be 2.

For example, the fluorescent dopant may include one of Compounds FD1 to FD37, DPVBi, DPAVBi, or any combination thereof:

FD1

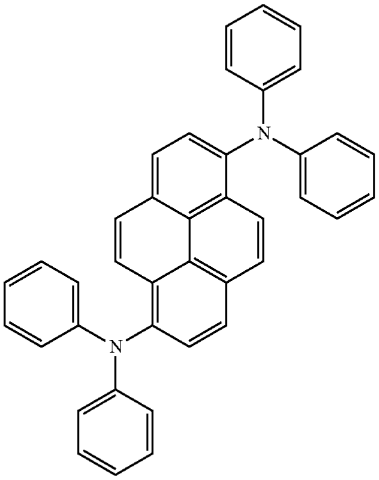

-continued

FD2

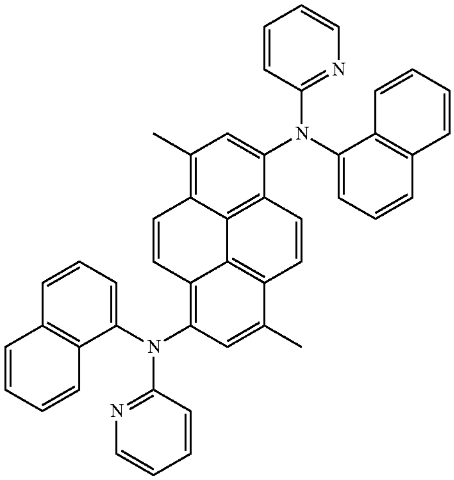

FD3

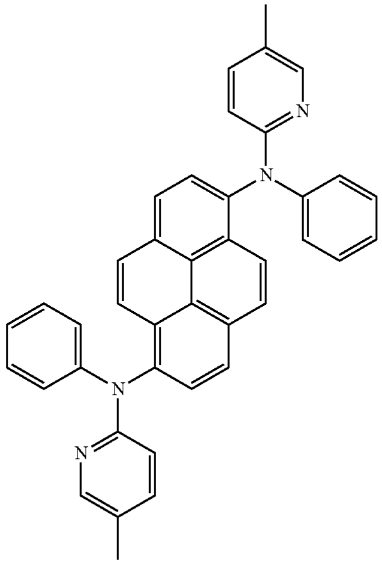

-continued
FD4
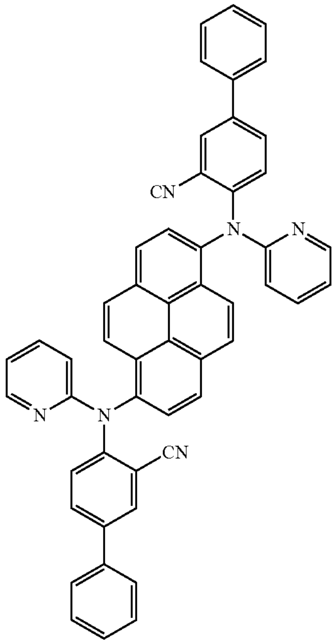
FD5
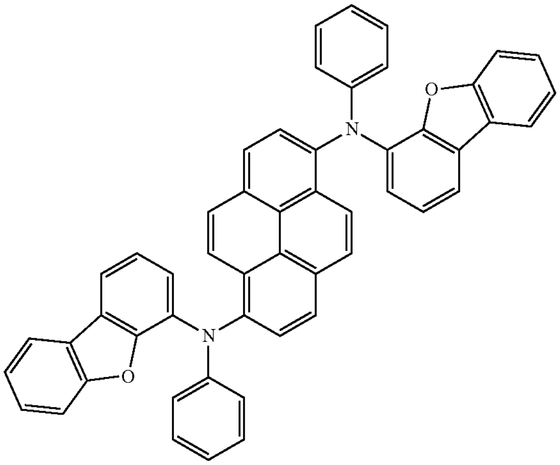
FD6
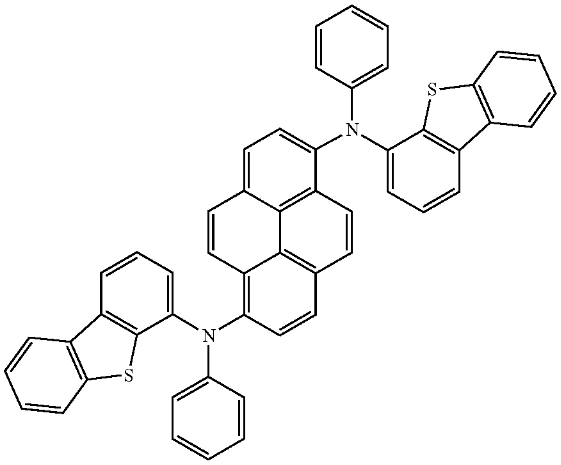
-continued
FD7
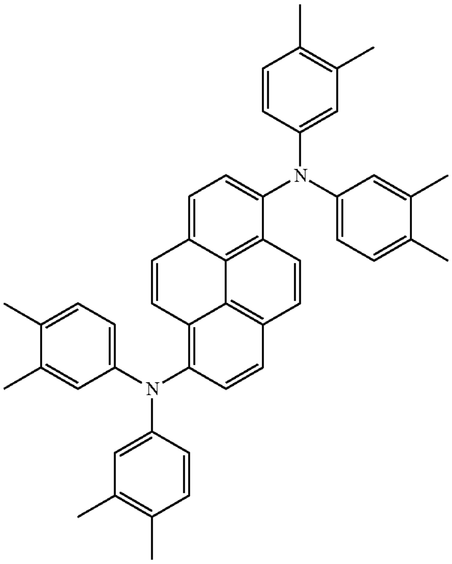
FD8
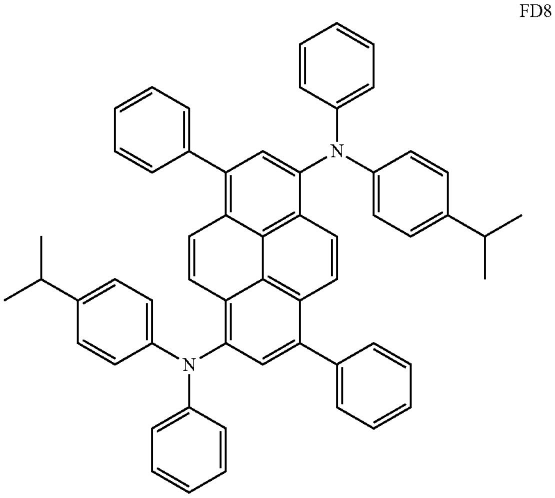
FD9
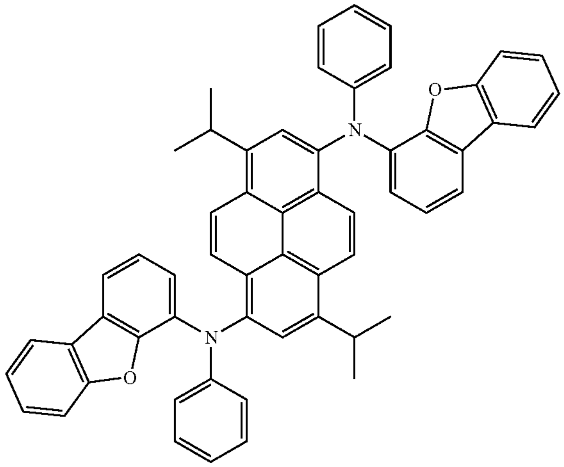

-continued
FD10
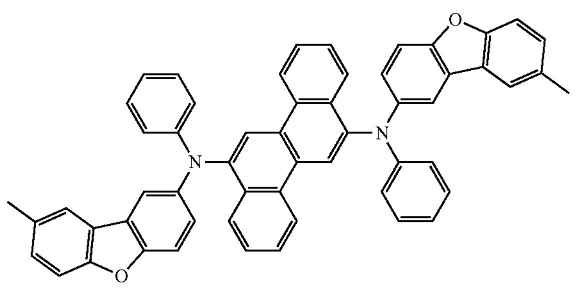
FD11
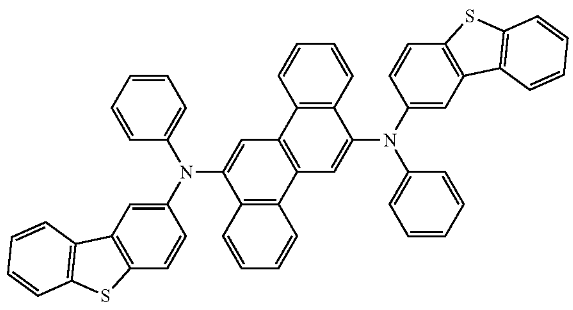
FD12
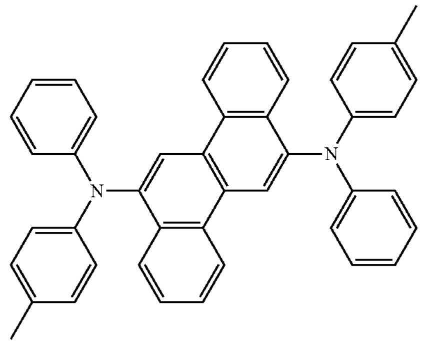
FD13
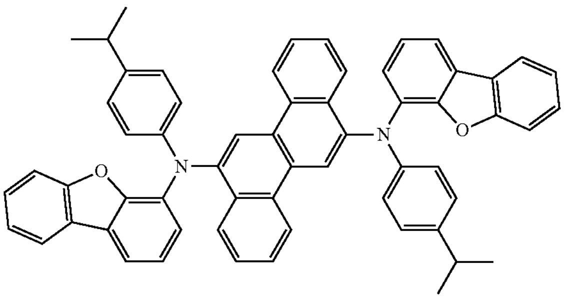
FD14
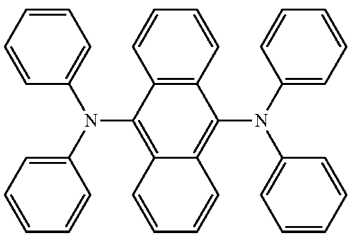
-continued
FD15
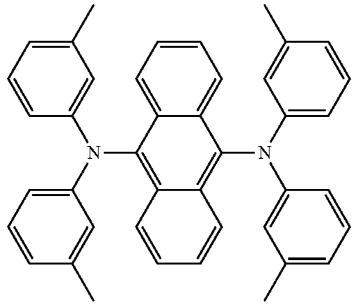
FD16
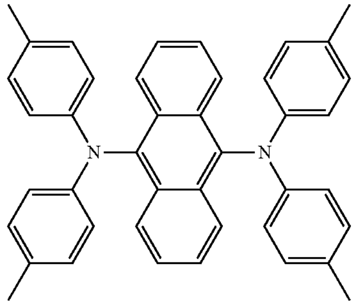
FD17
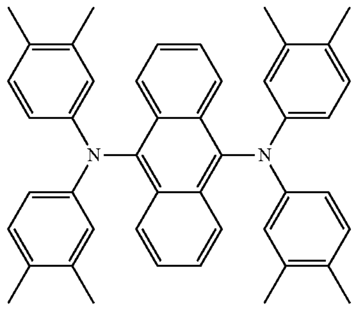
FD18
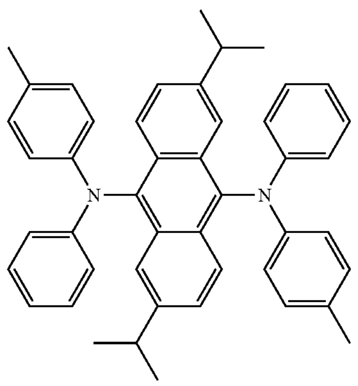

-continued
FD19
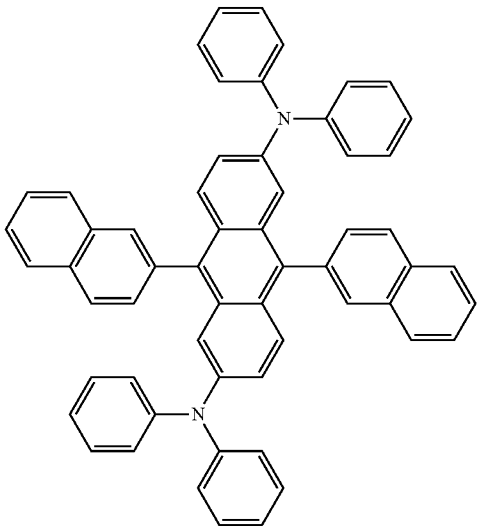
FD20
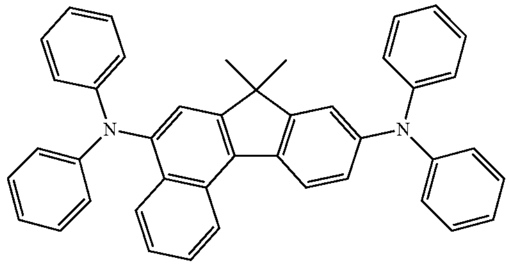
FD21
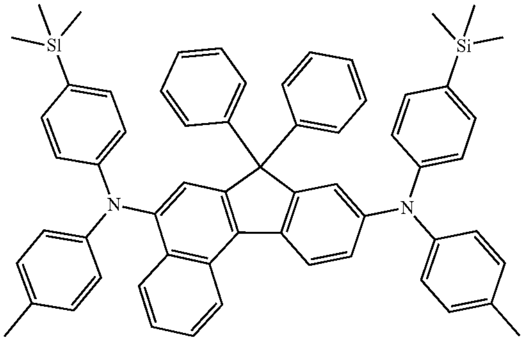
FD22
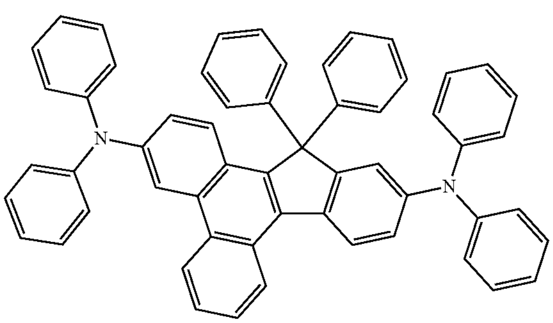
-continued
FD23
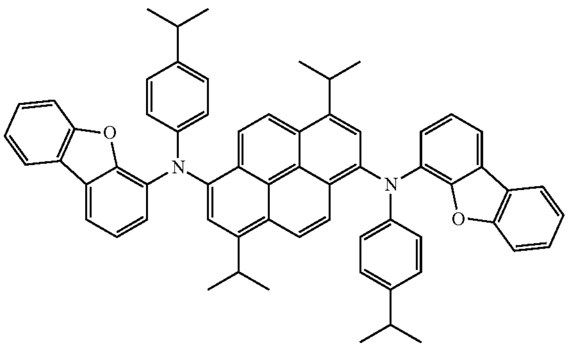
FD24
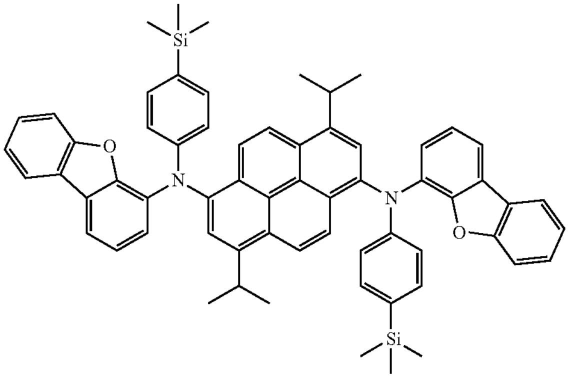
FD25
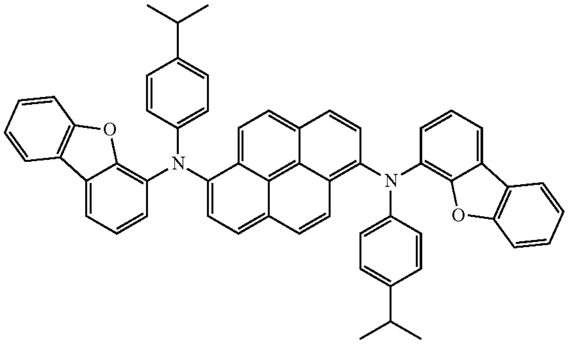
FD26
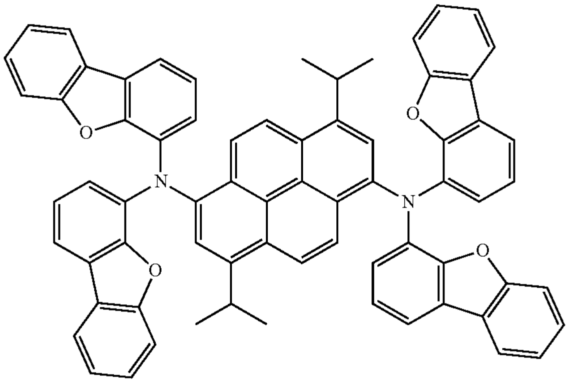

-continued
FD27
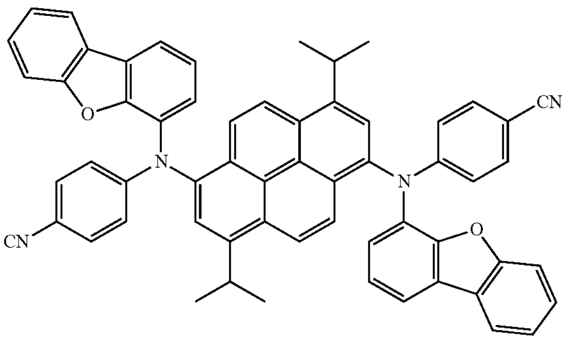
FD28
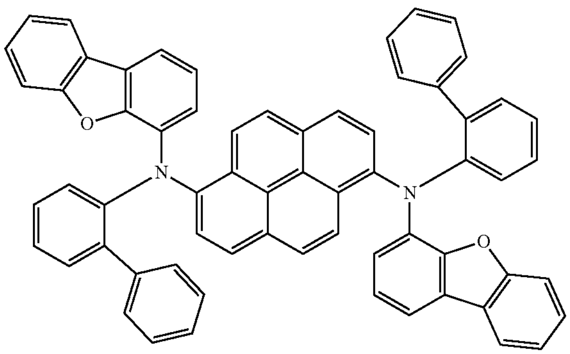
FD29
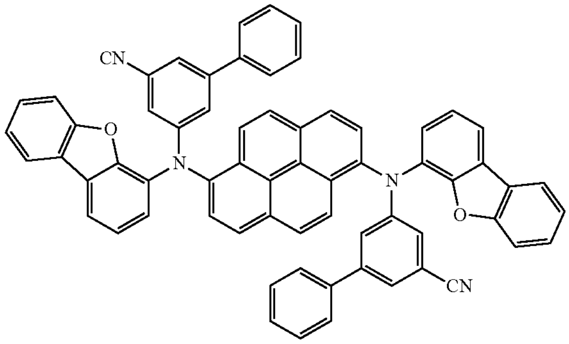
FD30
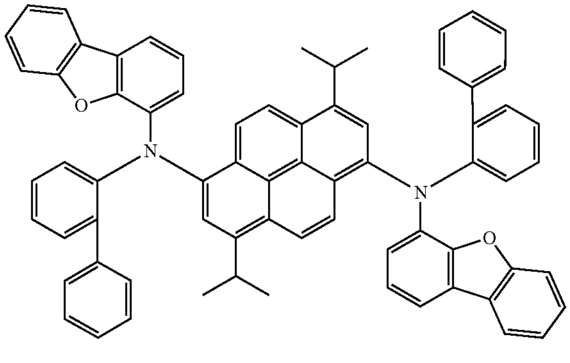
-continued
FD31
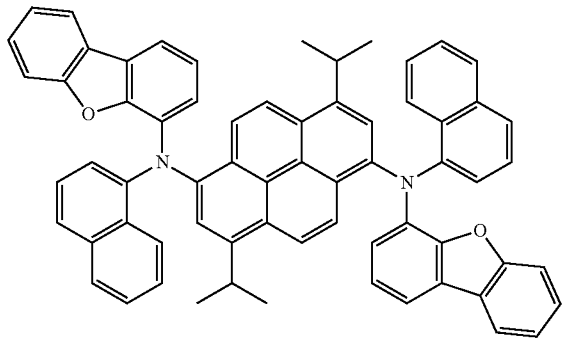
FD32
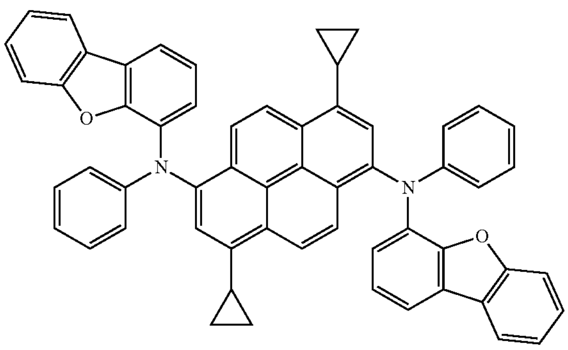
FD33
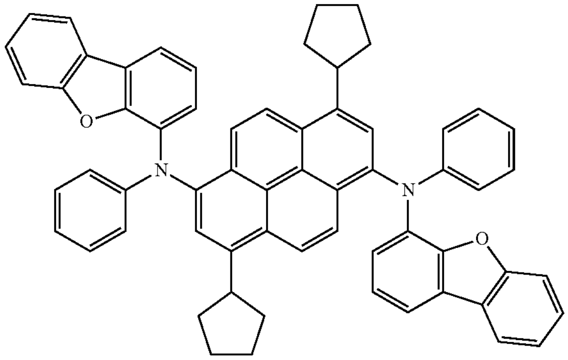
FD34
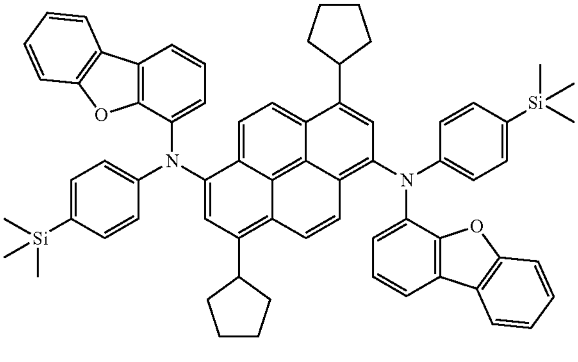

-continued

FD35

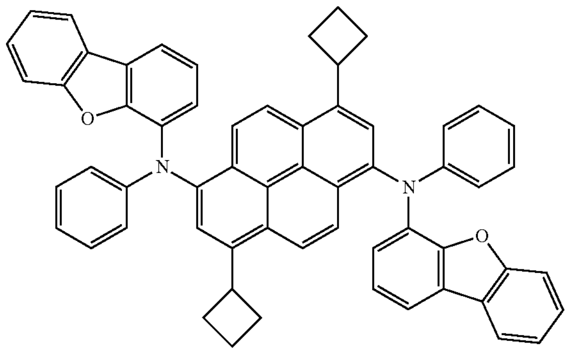

FD36

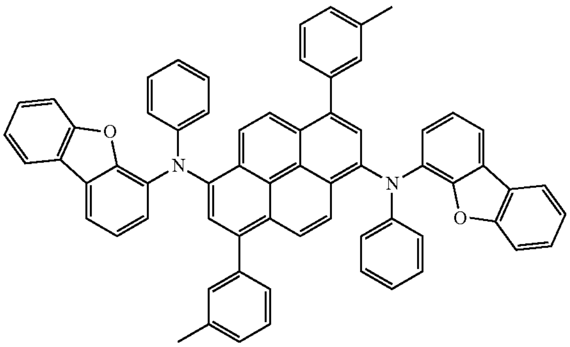

FD37

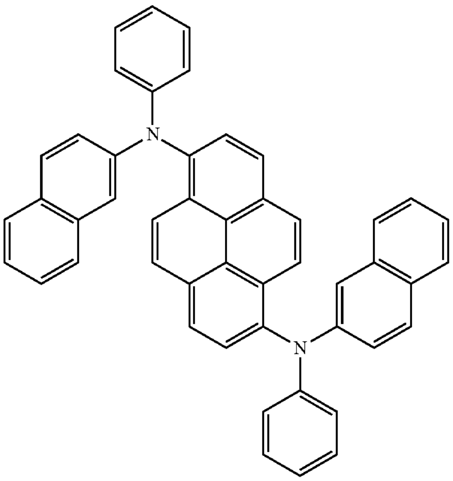

DPVBi

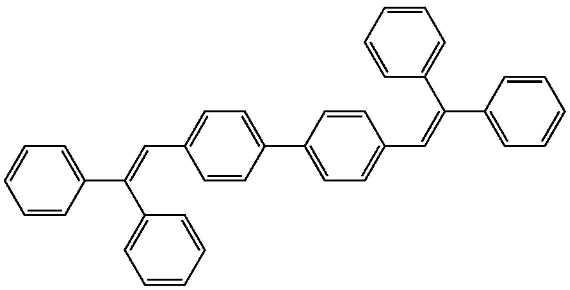

-continued

DPAVBi

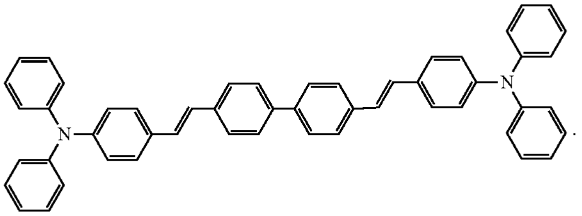

[Delayed Fluorescence Material]

The emission layer 132-1, 132-2, . . . or **132-*m*** may include a delayed fluorescence material.

The delayed fluorescence material as used herein may be any compound that is capable of emitting delayed fluorescence based on a delayed fluorescence mechanism.

The delayed fluorescence material included in the emission layer 132-1, 132-2, . . . or **132-*m* may serve as a host or a dopant, based on the type of other materials included in the emission layer 132-1, 132-2, . . . or 132-*m***.

In an embodiment, a difference between a triplet energy level (eV) of the delayed fluorescence material and a singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material is within the ranges above, up-conversion in which the delayed fluorescence materials transfer from the triplet state to the singlet state may effectively occur, and thus, the light emission efficiency of the light-emitting device 10 may be improved.

For example, the delayed fluorescence material may include i) a material that includes at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), or ii) a material including a $C_8$-$C_{60}$ polycyclic group in which two or more cyclic groups share a boron (B) atom and are condensed with each other.

The delayed fluorescent material may include at least one of compounds DF1 to DF9:

DF1

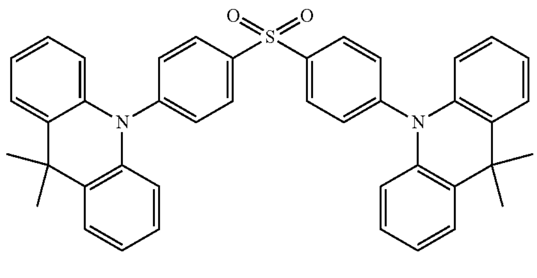

(DMAC-DPS)

DF2
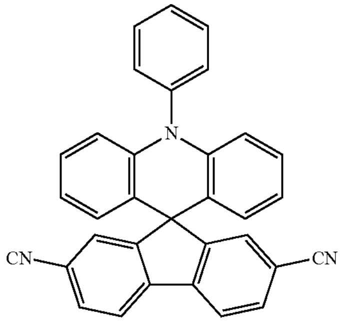
(ACRFLCN)
DF3
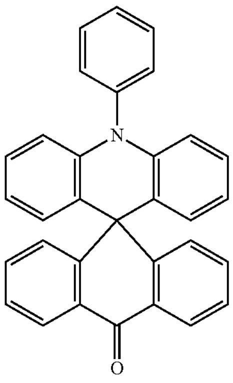
(ACRSA)
DF4
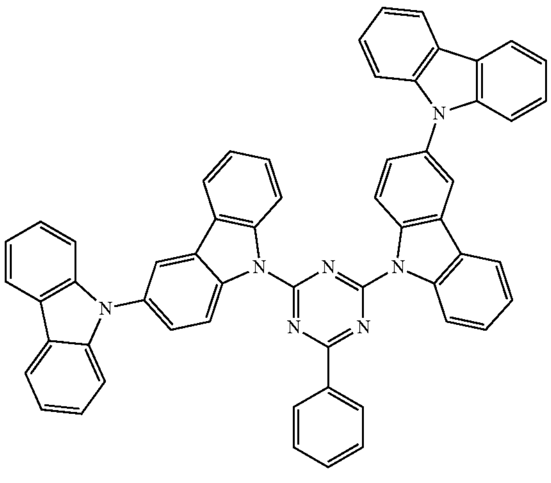
(CC2TA)
DF5
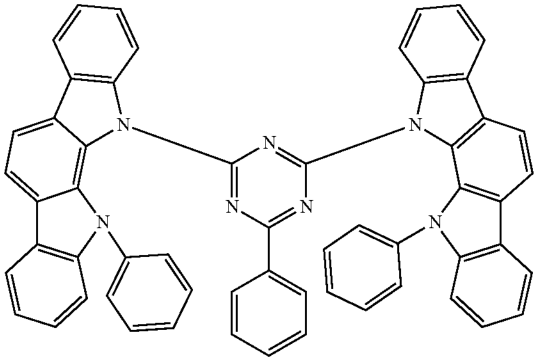
(PIC-TRZ)
DF6
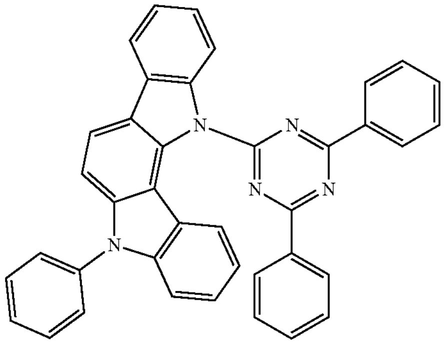
(PIC-TRZ2)
DF7
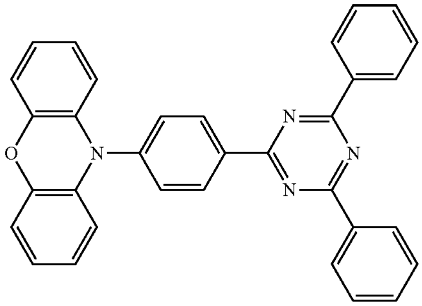
(PXZ-TRZ)
DF8
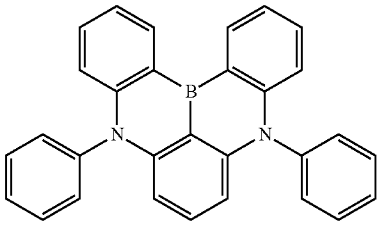
(DABNA-1)

-continued

DF9

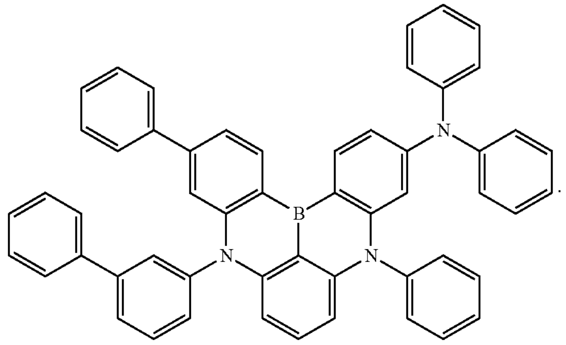

(DABNA-2)

[Quantum Dot]

The emission layer 132-1, 132-2, . . . or **132-*m*** may include quantum dots.

The quantum dot as used herein refers to the crystal of a semiconductor compound, and may include any material that is capable of emitting light of various emission wavelengths depending on the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or a process that is similar to these processes.

The wet chemical process refers to a method in which an organic solvent and a precursor material are mixed, and a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include Groups II-VI semiconductor compounds, Groups III-V semiconductor compounds, Groups III-VI semiconductor compounds, Groups I-III-VI semiconductor compounds, Groups IV-VI semiconductor compounds, a Group IV element or compound; or any combination thereof.

Examples of the Groups II-VI semiconductor compound are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Groups III-V semiconductor compounds are a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. The Groups III-V semiconductor compounds may further include a Group II element. Examples of the Groups III-V semiconductor compounds further including a Group II element are InZnP, InGaZnP, and InAlZnP.

Examples of the Groups III-VI semiconductor compound are a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; or any combination thereof.

Examples of the Groups I-III-VI semiconductor compounds are a ternary compound, such as AgInS, $AgInS_2$, CuInS, $CuInS_2$, $CuGaO_2$, $AgGaO_2$, or $AgAlO_2$; or any combination thereof.

Examples of the Groups IV-VI semiconductor compounds are a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

Examples of the Group IV element or compound are a single element, such as Si or Ge; a binary compound, such as SiC or SiGe; or any combination thereof.

Each element included in the multi-element compound such as the binary compound, a ternary compound, and a quaternary compound may be present, in a particle, at a uniform concentration or a non-uniform concentration.

The quantum dot may have a single structure having a uniform concentration of each element included in the corresponding quantum dot or a dual structure of a core-shell. For example, the material included in the core may be different from the material included in the shell.

The shell of the quantum dot may function as a protective layer for maintaining semiconductor characteristics by preventing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot may be an oxide of metal, metalloid, or non-metal, a semiconductor compound, or any combination thereof. Examples of the oxide of metal, metalloid, or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound are, as described herein, Groups II-VI semiconductor compounds; Groups III-V semiconductor compounds; Groups III-VI semiconductor compounds; Groups I-III-VI semiconductor compounds; Groups IV-VI semiconductor compounds; or any combination thereof. Examples of the semiconductor compound are CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, the FWHM of an emission wavelength spectrum of the quantum dot may be equal to or less than about 40 nm. For example, the FWHM of an emission wavelength spectrum of the quantum dot may be equal to or less than about 30 nm. When the FWHM of the emission wavelength spectrum of the quantum dot is within the ranges above, color purity or color reproduction may be improved. Light emitted through such quantum dots may be irradiated omnidirectionally. Accordingly, a wide viewing angle may be increased.

The quantum dot may be a spherical, a pyramidal, a multi-arm, or a cubic nanoparticle, a nanotube, a nanowire, a nanofiber, or a nanoplate particle.

By adjusting the size of the quantum dot, the energy band gap may also be adjusted, thereby obtaining light of various wavelengths in the quantum dot emission layer. Therefore, by using quantum dots of different sizes, a light-emitting device that emits light of various wavelengths may be implemented. The size of the quantum dot may be selected to emit red, green, and/or blue light. The size of the quantum dot may be adjusted such that light of various colors are combined to emit white light.

[Electron Transport Region 133-1, 133-2, . . . Or **133-*m* in Interlayer 130**]

The electron transport region 133-1, 133-2, . . . or **133-*m*** may each have: i) a single-layered structure consisting of a single layer consisting of a single material, ii) a single-layered structure consisting of a single layer consisting of different materials, or iii) a multi-layered structure including multiple layers including different materials.

The electron transport region 133-1, 133-2, . . . or **133-*m*** may each include a buffer layer, a hole blocking layer, an electron control layer, an electron transport layer, an electron injection layer, or any combination thereof.

For example, the electron transport region 133-1, 133-2, . . . or **133-*m*** may each have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, layers are sequentially stacked on the emission layer.

The electron transport region 133-1, 133-2, . . . or **133-*m*** (for example, the buffer layer, the hole blocking layer, the electron control layer, or the electron transport layer in the electron transport region) may each include a metal-free compound including at least one π electron-deficient nitrogen-containing $C_1$-$C_{60}$ cyclic group.

For example, the electron transport region 133-1, 133-2, . . . or **133-*m*** may include a compound represented by Formula 601:

$$[Ar_{601}]_{xe11}\text{-}[(L_{601})_{xe1}\text{-}R_{601}]_{xe21}$$ [Formula 601]

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In embodiments, $Ar_{601}$ in Formula 601 may be a substituted or unsubstituted anthracene group.

In embodiments, the electron transport region 133-1, 133-2, . . . or **133-*m*** may include a compound represented by Formula 601-1:

[Formula 601-1]

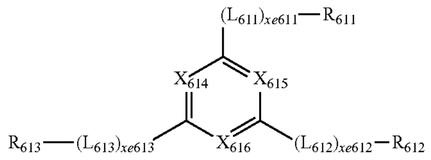

wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region 133-1, 133-2, . . . or **133-*m*** may include one of Compounds ET1 to ET47, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

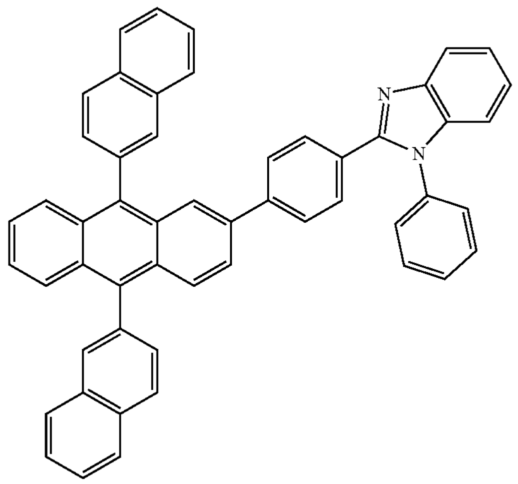

-continued
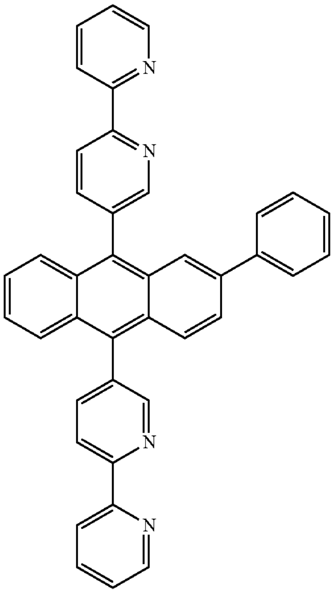
ET2
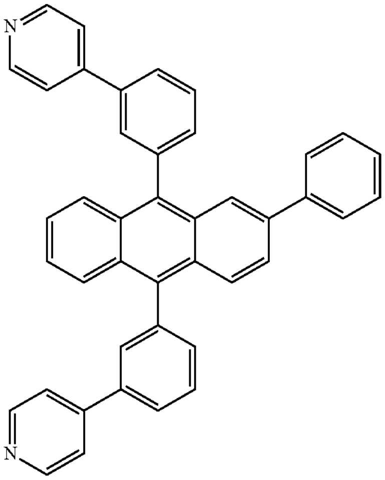
ET3
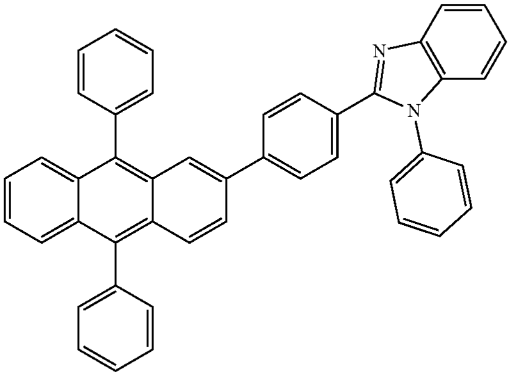
ET4
-continued
ET5
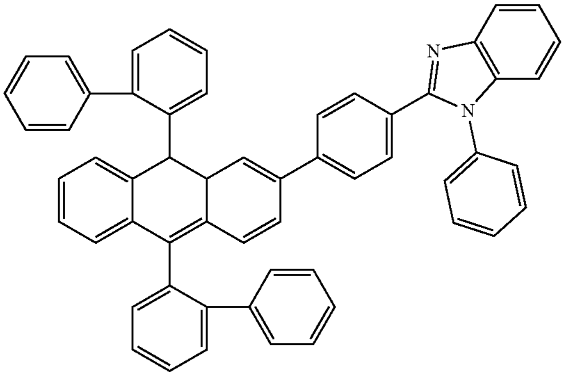
ET6
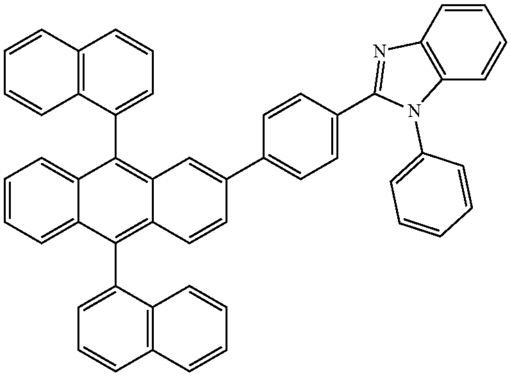
ET7
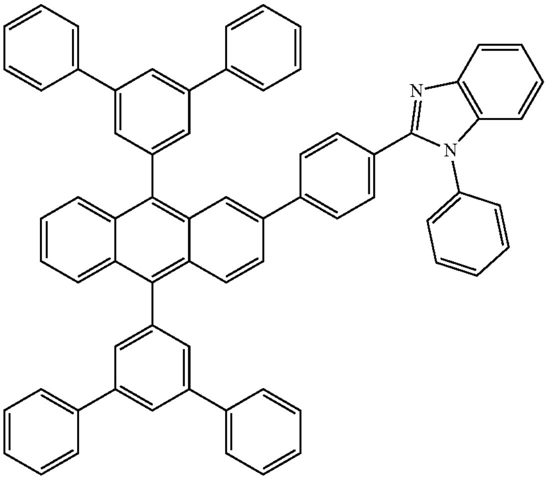

-continued
ET8
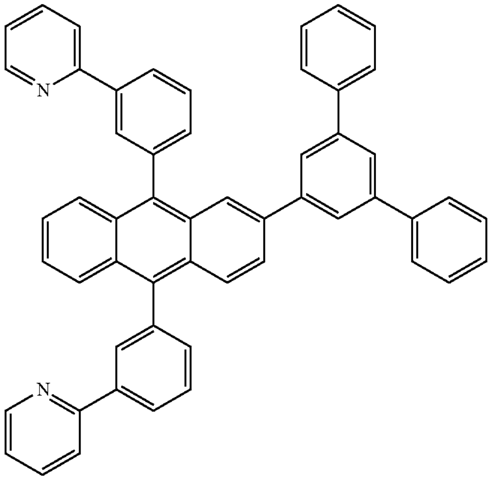
ET9
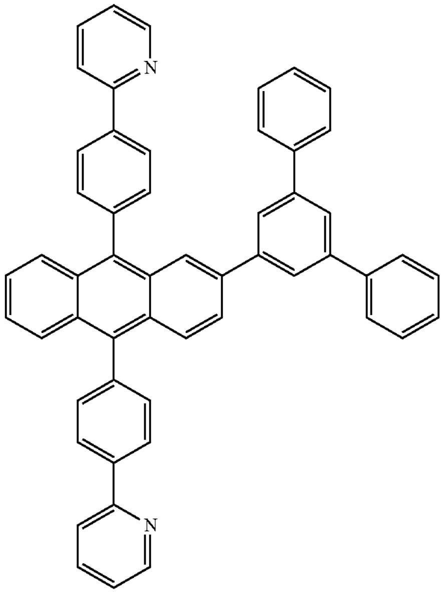
ET10
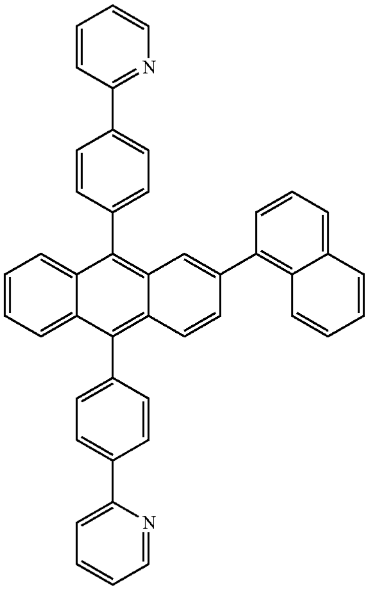
-continued
ET11
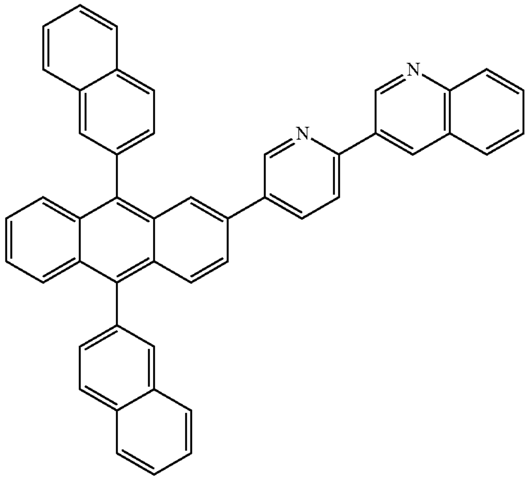
ET12
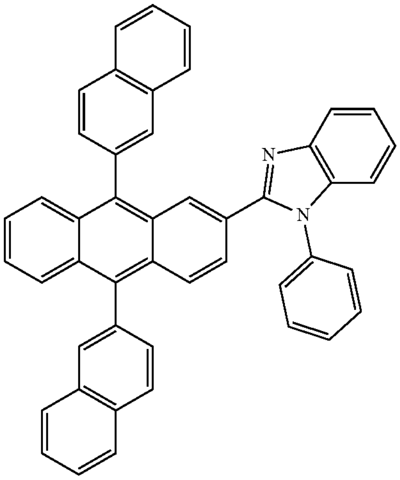
ET13
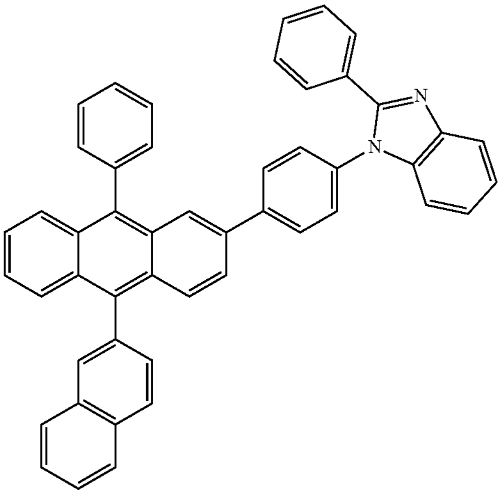

ET14
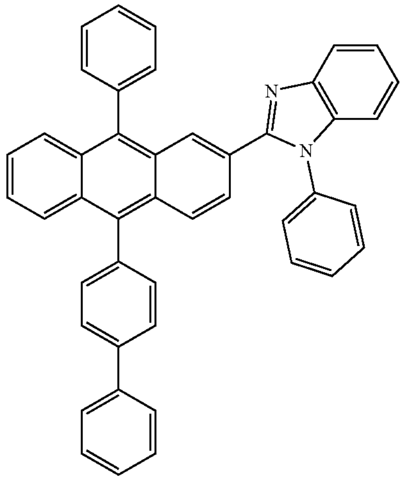
ET15
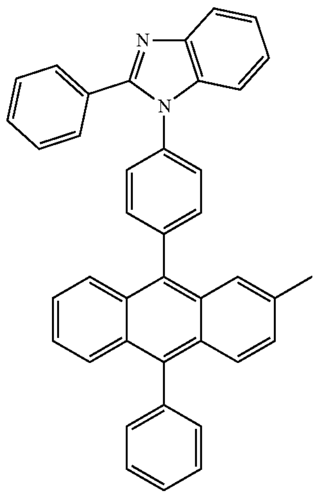
ET16
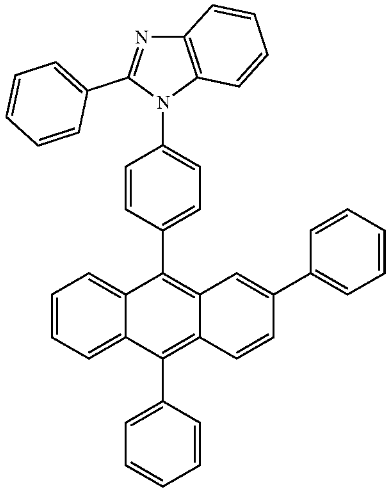
ET17
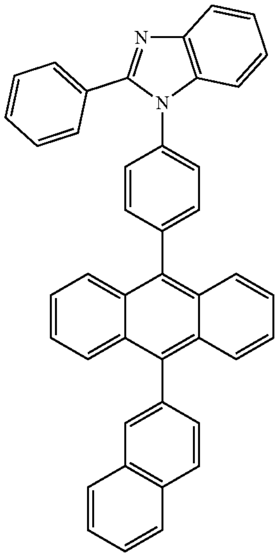
ET18
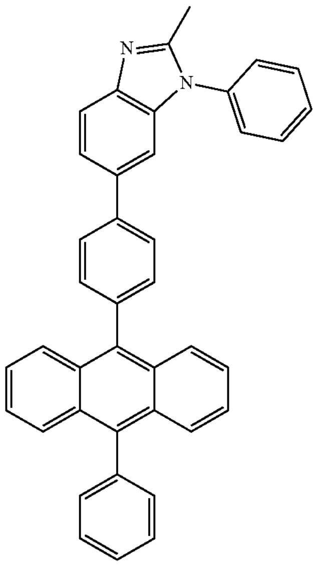
ET19
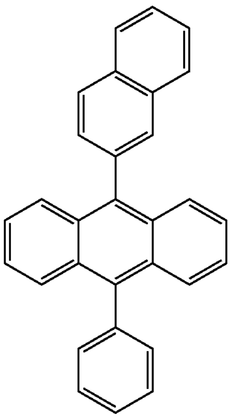

-continued
ET20
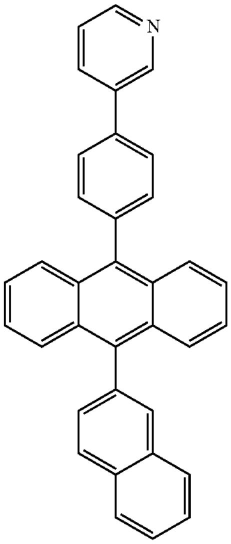
ET21
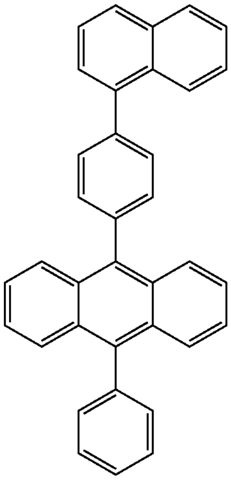
ET22
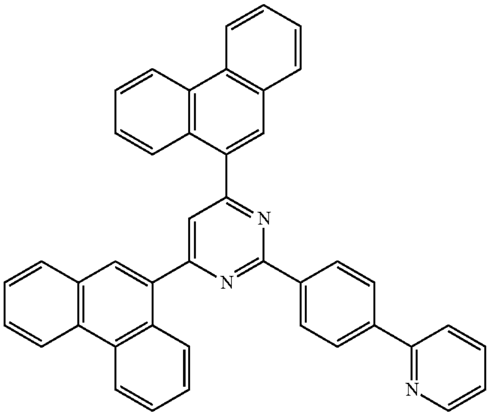
-continued
ET23
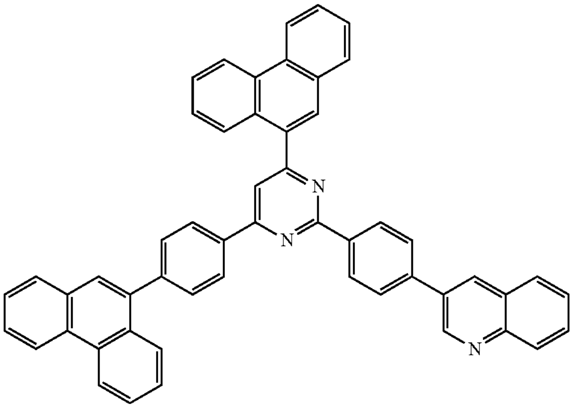
ET24
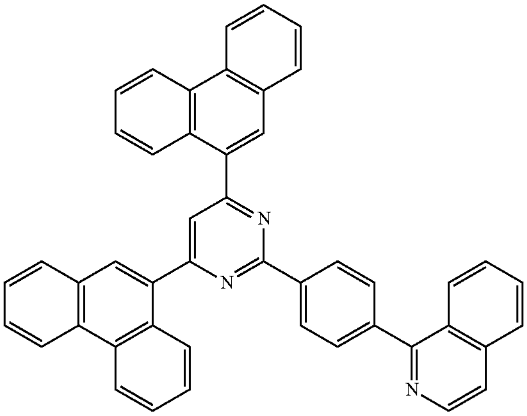
ET25
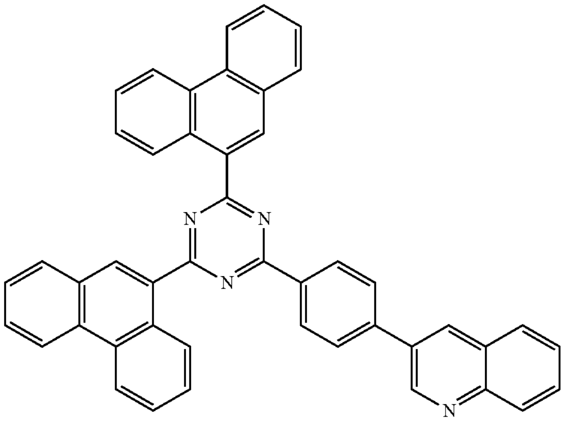

-continued
ET26
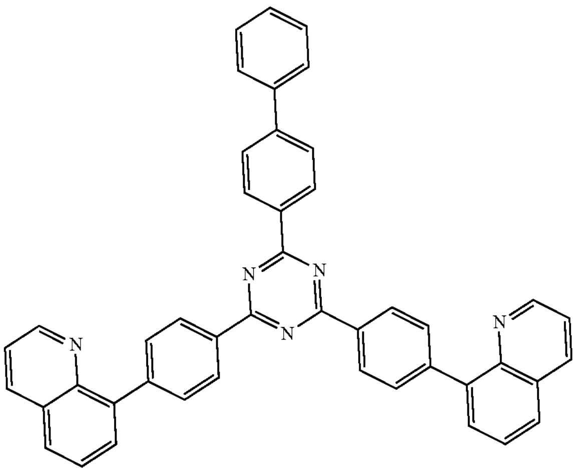
ET27
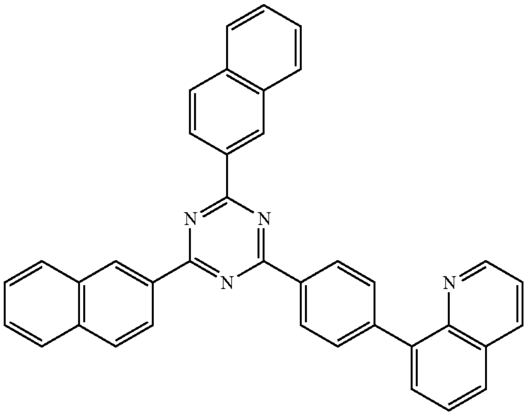
ET28
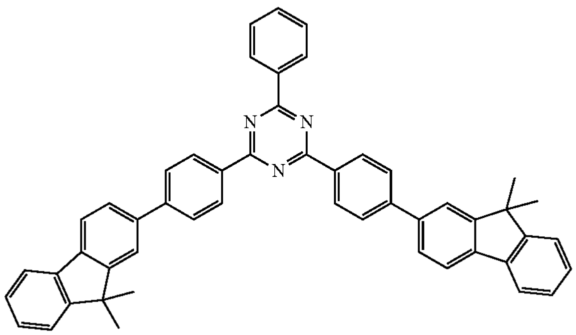
-continued
ET29
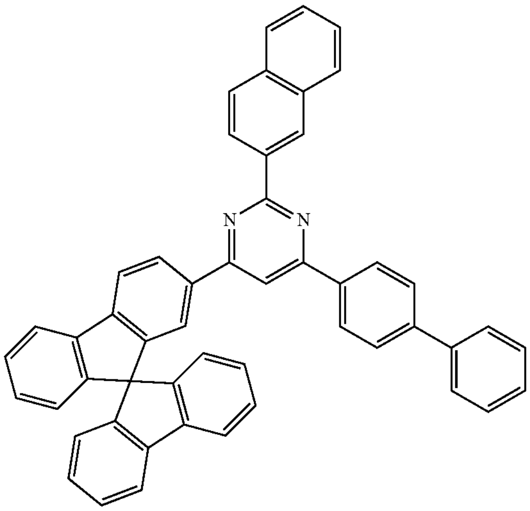
ET30
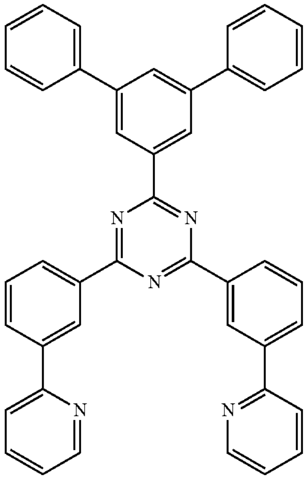
ET31
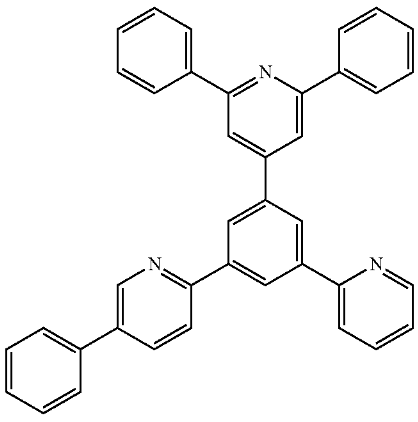

-continued
ET32
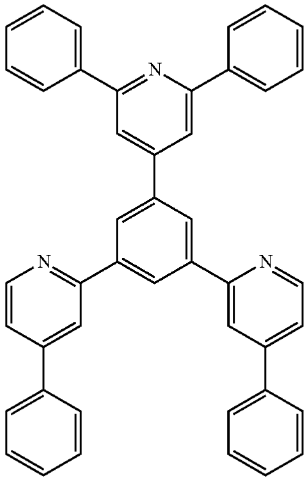
ET33
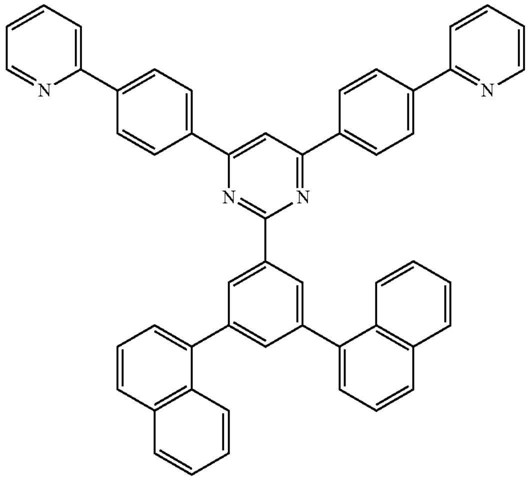
ET34
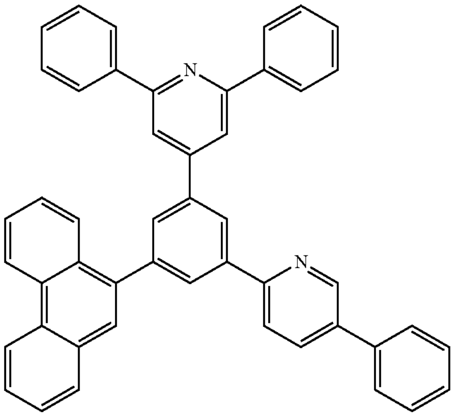
-continued
ET35
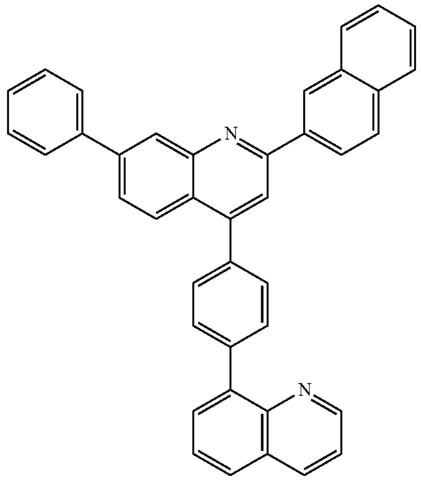
ET36
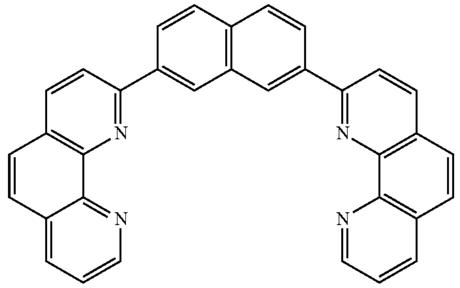
ET37
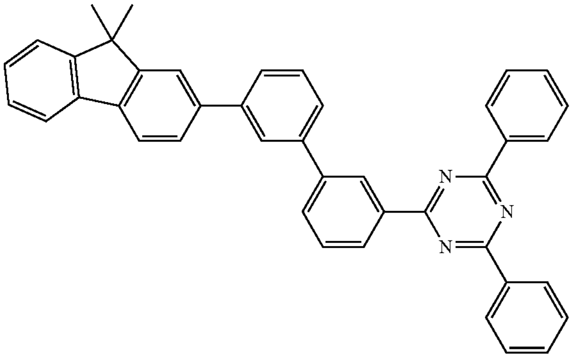
ET38
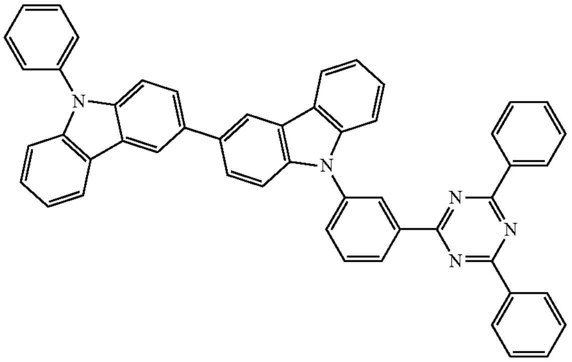

-continued
ET39
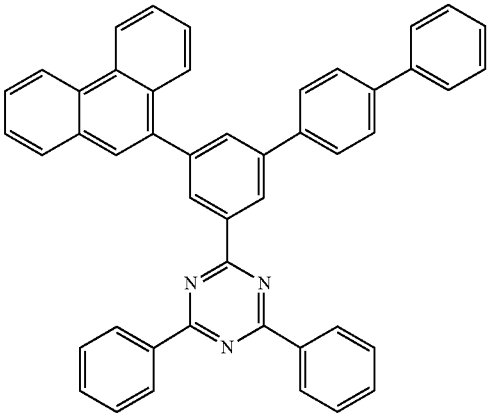
ET40
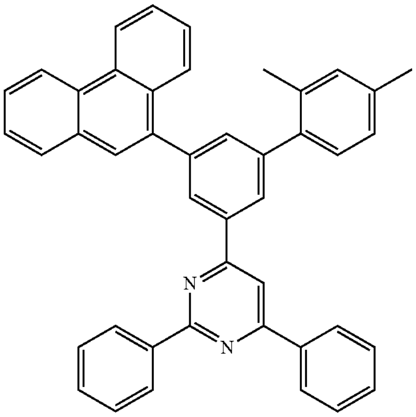
ET41
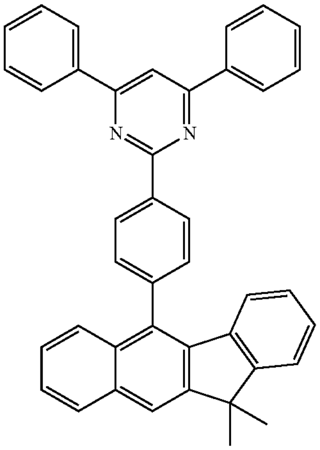
-continued
ET42
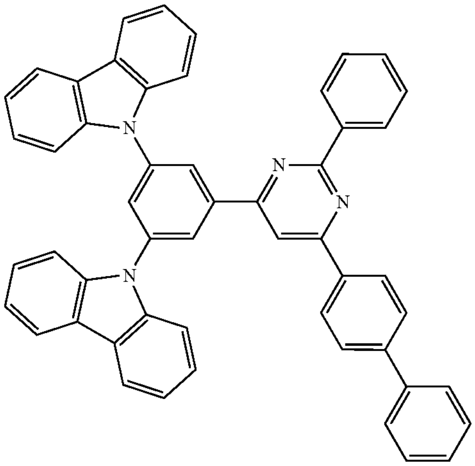
ET43
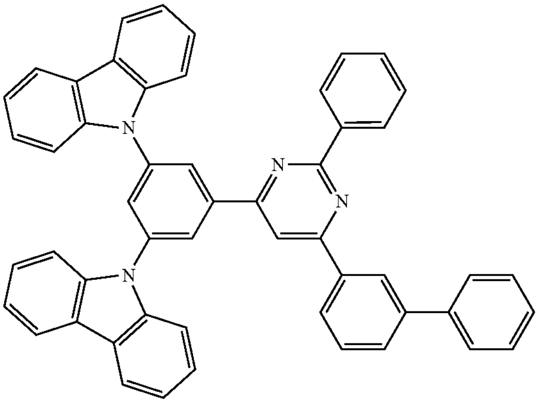
ET44
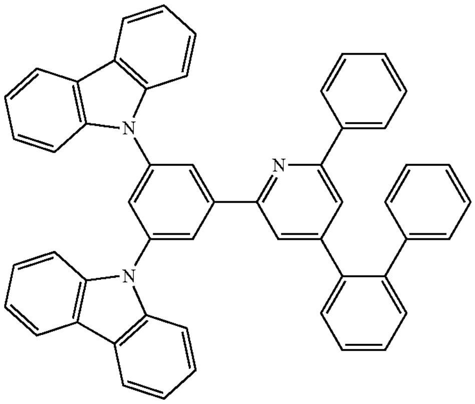
ET45
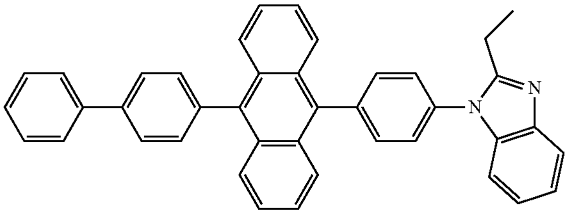

-continued

ET46

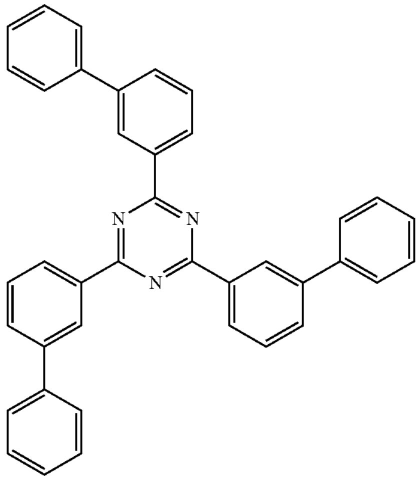

ET47

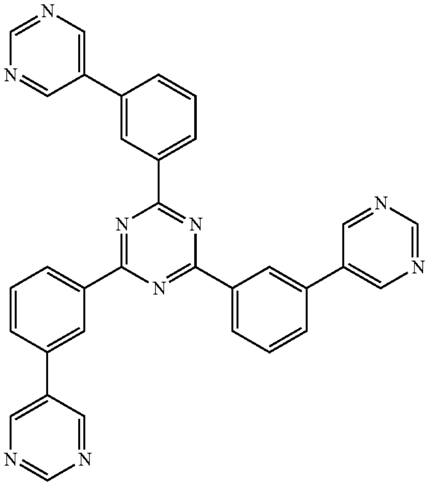

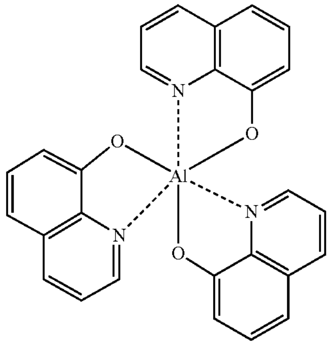

Alq3

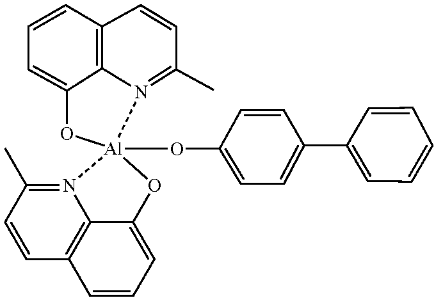

BAlq

-continued

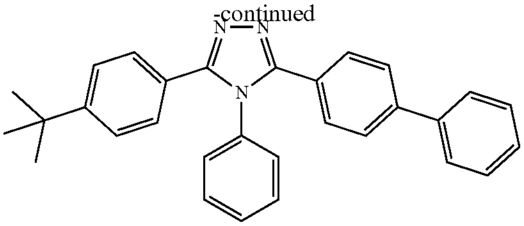

TAZ

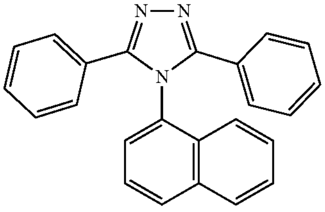

NTAZ

A thickness of the electron transport region 133-1, 133-2, . . . or 133-*m* may each be in a range of about 100 Å to about 5,000 Å. For example, the thickness of the electron transport region 133-1, 133-2, . . . or 133-*m* may each be in a range of about 160 Å to about 4,000 Å. When the electron transport region 133-1, 133-2, . . . or 133-*m* includes a buffer layer, a hole blocking layer, an electron control layer, an electron transport layer, or any combination thereof, a thickness of the buffer layer, the hole blocking layer, or the electron control layer may be in a range of about 20 Å to about 1,000 Å, and a thickness of the electron transport layer may be in a range of about 100 Å to about 1,000 Å. For example, the thickness of the buffer layer, the hole blocking layer, or the electron control layer may be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport region are within these ranges, satisfactory electron transporting characteristics may be obtained without a substantial increase in driving voltage.

The electron transport region 133-1, 133-2, . . . or 133-*m* (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

ET-D1

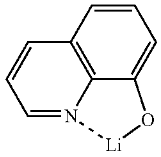

ET-D2

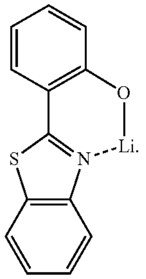

The electron transport region 133-1, 133-2, . . . or **133-*m* may include an electron injection layer that facilitates the injection of electrons from the second electrode 150. The electron injection layer may directly contact the second electrode 150**.

The electron injection layer 133-1, 133-2, . . . or **133-*m*** may have: i) a single-layered structure consisting of a single layer consisting of a single material, ii) a single-layered structure consisting of a single layer consisting of different materials, or iii) a multi-layered structure including multiple layers including different materials.

The electron injection layer 133-1, 133-2, . . . or **133-*m*** may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides and halides (for example, fluorides, chlorides, bromides, or iodides) of the alkali metal, the alkaline earth metal, and the rare earth metal, telluride, or any combination thereof.

The alkali metal-containing compound may be alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal oxide, such as BaO, SrO, CaO, $Ba_xSr_{1-x}O$ (x is a real number that satisfies the condition of $0<x<1$), or $Ba_xCa_{1-x}O$ (x is a real number that satisfies the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may consist of i) an alkali metal-containing compound (for example, an alkali metal halide), or ii) a) an alkali metal-containing compound (for example, an alkali metal halide); and b) alkali metal, alkaline earth metal, rare earth metal, or any combination thereof. In embodiments, the electron injection layer may be a KI:Yb co-deposited layer or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within these ranges, satisfactory electron injection characteristics may be obtained without a substantial increase in driving voltage.

[Second Electrode 150]

The second electrode 150 is located on the interlayer 130 having such a structure. The second electrode 150 may be a cathode, which is an electron injection electrode, and as a material for forming the second electrode 150, a metal, an alloy, an electrically conductive compound, or any combination thereof, each having a low work function, may be used.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, and any combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be disposed outside the first electrode 110, and/or a second capping layer may be disposed outside the second electrode 150. The light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in the emission layer 132-1, 132-2, . . . or 132*m* of the interlayer 130 of the light-emitting device 10 may be emitted toward the outside through the first electrode 110, which is a semi-transmissive electrode or a transmissive electrode, and the first capping layer, and light generated in the emission layer 132-1, 132-2, . . . or 132*m* of the interlayer 130 of the light-emitting device 10 may be emitted toward the outside through the second electrode 150, which is a semi-transmissive electrode or a transmissive electrode, and the second capping layer.

The first capping layer and the second capping layer may increase external light emission efficiency according to the principle of constructive interference. Accordingly, the light emission efficiency of the light-emitting device 10 is increased, so that the light emission efficiency of the light-emitting device 10 may be improved.

Each of the first capping layer and the second capping layer may include a material having a refractive index of equal to or greater than about 1.6 (at a wavelength of 589 nm).

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In embodiments, at least one of the first capping layer and second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, p-NPB, or any combination thereof:

CP1

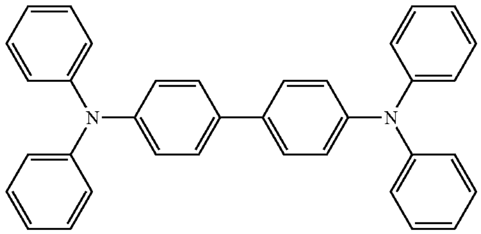

-continued

CP2

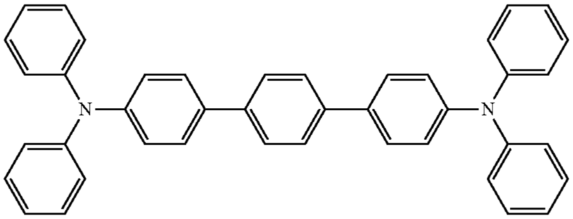

CP3

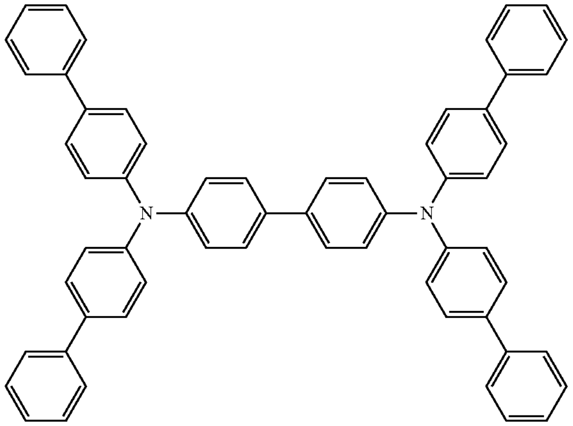

CP4

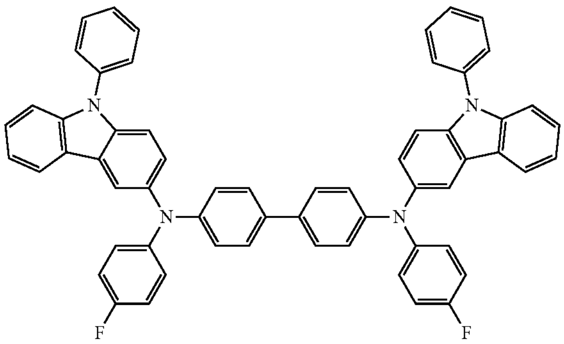

CP5

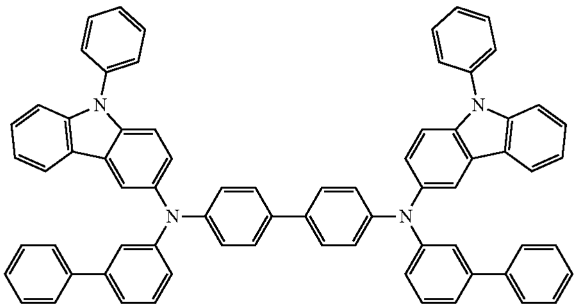

-continued

CP6

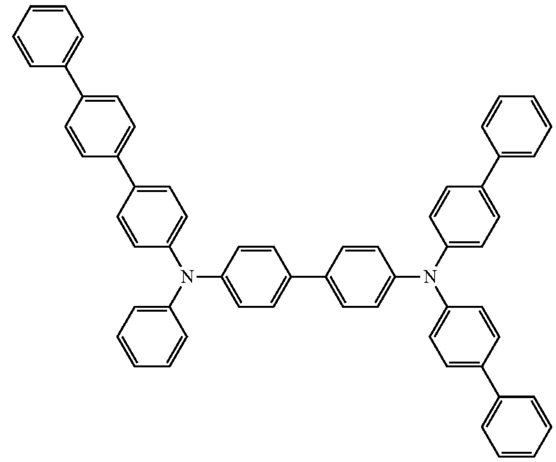

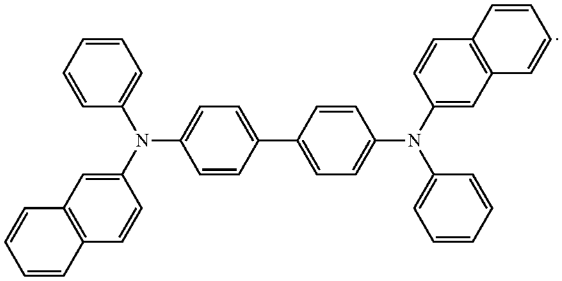

β-NPB

[Electronic Apparatus]

The light-emitting device may be included in various electronic apparatuses. For example, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located between the subpixels to define each of the subpixels.

The color filter may further include the color filter areas and a light-blocking pattern located between adjacent color filter areas of the color filter areas, and the color conversion layer may further include the color conversion areas and a light-blocking pattern located between adjacent color conversion areas of the color conversion areas.

The color filter areas (or the color conversion areas) includes: a first area emitting first-color light; a second area emitting second-color light; and/or a third area emitting third-color light, and the first-color light, the second-color light and/or the third-color light may have different maximum luminescence wavelengths. For example, the first color light may be red light, the second color light may be green light, and the third color light may be blue light. For example, the color filter areas (or the color conversion areas) may include quantum dots. The first area may include a red quantum dot, the second area may include a green quantum dot, and the third area may not include a quantum dot. The quantum dot may be the same as described in the specification. Each of the first area, the second area, and/or the third area may further include a scatter.

For example, the light-emitting device may emit first light, the first area may absorb the first light to emit first first-color light, the second area may absorb the first light to emit second first-color light, and the third area may absorb the first light to emit third first-color light. Here, the first first-color light, the second first-color light, and the third first-color light may have different maximum luminescence wavelengths from one another. The first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein any one of the source electrode and the drain electrode may be electrically connected with any one of the first electrode and the second electrode of the light-emitting device.

The thin-film transistor may further include a gate electrode, a gate insulation layer, or the like.

The active layer may include crystalline silicon, amorphous silicon, organic semiconductor, oxide semiconductor, or the like.

The electronic apparatus may further include a sealing portion for sealing the light-emitting device. The sealing portion may be disposed between the color filter and/or the color conversion layer and the light-emitting device. The sealing portion allows light from the light-emitting device to be emitted to the outside, while simultaneously preventing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin-film encapsulation layer, the electronic apparatus may be flexible.

On the sealing portion, in addition to the color filter and/or color conversion layer, various functional layers may be further disposed according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a fingertip, a pupil, or the like).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement apparatuses, pulse wave measurement apparatuses, electrocardiogram displays, ultrasonic diagnostic apparatuses, or endoscope displays), fish finders, various measuring instruments, meters (for example, meters for a vehicle, an aircraft, and a vessel), projectors, and the like.

Figure 2:
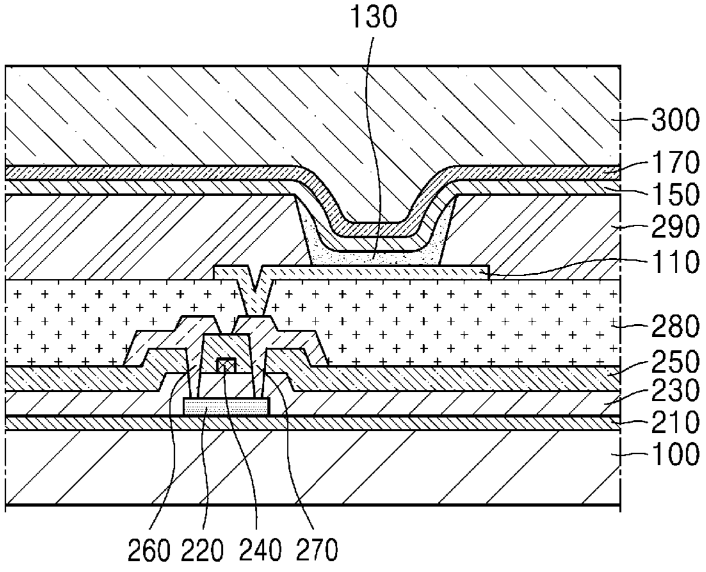
FIG. 2 is a schematic cross-sectional view of a light-emitting apparatus according to an embodiment.
Figure 3:
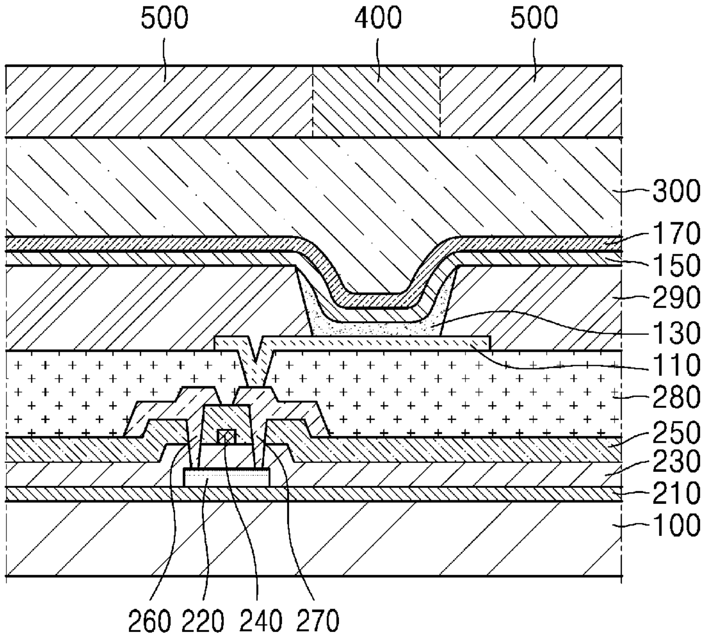
FIG. 3 is a schematic cross-sectional view of a light-emitting apparatus according to another embodiment.

Description of FIGS. 2 and 3

FIG. 2 is a schematic cross-sectional view of a light-emitting apparatus according to an embodiment.

The light-emitting apparatus of FIG. 2 includes a substrate 100, a thin-film transistor (TFT), a light-emitting device, and an encapsulation portion 300 that seals light-emitting device.

The substrate 100 may be a flexible substrate, a glass substrate, or a metal substrate. A buffer layer 210 may be located on the substrate 100. The buffer layer 210 may prevent the penetration of impurities through the substrate 100 and provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be disposed to contact the exposed portions of the source region and the drain region of the active layer 220.

The TFT may be electrically connected with the light-emitting device to drive the light-emitting device, and may be covered by a passivation layer 280. The passivation layer 280 may include an inorganic insulating film, an organic insulating film, or a combination thereof. The light-emitting device may be provided on the passivation layer 280. The light-emitting device includes the first electrode 110, the interlayer 130, and the second electrode 150.

The first electrode 110 may be located on the passivation layer 280. The passivation layer 280 does not completely cover the drain electrode 270 and exposes a portion of the drain electrode 270, and the first electrode 110 may be connected with the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide or polyacryl-based organic film. Although not shown in FIG. 2, at least some layers of the interlayer 130 may extend beyond the upper portion of the pixel defining layer 290 and may thus be disposed in the form of a common layer.

The second electrode 150 may be disposed on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on the light-emitting device and protects the light-emitting device from moisture or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE)), or a combination thereof; or a combination of the inorganic film and the organic film.

FIG. 3 is a schematic cross-sectional view of a light-emitting apparatus according to another embodiment.

The light-emitting apparatus of FIG. 3 is the same as the light-emitting apparatus of FIG. 2, except that a light-blocking pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

[Preparation Method]

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

Definition of Terms

The term "$C_3$-$C_{60}$ carbocyclic group" as used herein refers to a cyclic group that consists of carbon and hydrogen only and has three to sixty carbon atoms (for example 3 to 30, 3 to 24 or 3 to 18 carbon atoms), and the term "$C_1$-$C_{60}$ heterocyclic group" as used herein refers to a cyclic group that has one to sixty carbon atoms (for example 1 to 30, 1 to 24 or 1 to 18 carbon atoms) and further includes, in addition to carbon, a heteroatom (for example, 1 to 5 or 1 to 3, such as 1, 2, 3, 4 or 5 heteroatoms). The $C_3$-$C_{60}$ carbocyclic group and the $C_1$-$C_{60}$ heterocyclic group may each be a monocyclic group that consists of one ring or a polycyclic group in which two or more rings are condensed with each other. For example, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms (for example 3 to 30, 3 to 24 or 3 to 18 carbon atoms) and does not include *—N=*' as a ring-forming moiety, and the term "π electron-deficient nitrogen-containing $C_1$-$C_{60}$ cyclic group" as used herein refers to a heterocyclic group that has one to sixty carbon atoms (for example 1 to 30, 1 to 24 or 1 to 18 carbon atoms) and includes *—N=*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the $\pi$ electron-rich $C_3$-$C_{60}$ cyclic group, or the $\pi$ electron-deficient nitrogen-containing $C_1$-$C_{60}$ cyclic group" as used herein refer to a group that is condensed with a cyclic group, a monovalent group, a polyvalent group (for example, a divalent group, a trivalent group, a tetravalent group, or the like), according to the structure of a formula described with corresponding terms. For example, "a benzene group" may be a benzo group, a phenyl group, a phenylene group, or the like, which may be easily understand by one of ordinary skill in the art according to the structure of a formula including the "benzene group".

For example, the monovalent $C_3$-$C_{60}$ carbocyclic group and the monovalent $C_1$-$C_{60}$ heterocyclic group may each include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_6$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group are a $C_3$-$C_{10}$ cycloalkylene group, a $C_1$-$C_{10}$heterocycloalkylene group, a $C_3$-$C_{10}$ cycloalkenylene group, a $C_1$-$C_{10}$heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. In some embodiments, $C_1$-$C_{60}$ alkyl group may be $C_1$-$C_{30}$ alkyl group, $C_1$-$C_{20}$ alkyl group or $C_1$-$C_{10}$ alkyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. In some embodiments, $C_2$-$C_{60}$ alkenyl group may be $C_2$-$C_{30}$ alkenyl group, $C_2$-$C_{20}$ alkenyl group or $C_2$-$C_{10}$ alkenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group, and a propynyl group. In some embodiments, $C_2$-$C_{60}$ alkynyl group may be $C_2$-$C_{30}$ alkynyl group, $C_2$-$C_{20}$ alkynyl group or $C_2$-$C_{10}$ alkynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by $—OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cycloctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom (for example, 1 to 5 or 1 to 3, such as 1, 2, 3, 4 or 5 heteroatoms) as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom (for example, 1 to 5 or 1 to 3, such as 1, 2, 3, 4 or 5 heteroatoms) as a ring-forming atom, 1 to 10 carbon atoms, and at least one double bond in the cyclic structure thereof. Examples of the $C_1$-$C_{10}$heterocycloalkenyl group are a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. In some embodiments, $C_6$-$C_{60}$ aryl group may be $C_6$-$C_{30}$ aryl group, $C_6$-$C_{24}$ aryl group or $C_6$-$C_{18}$ aryl group. When the $C_6$-$C_{60}$ aryl group and the $C_6$-$C_{60}$ arylene group each include two or more rings, the two or more rings may be condensed to each other.

The term "$C_1$-$C_{60}$ heteroaryl group" as used herein refers to a monovalent group having a heterocyclic aromatic system that has, in addition to a carbon atom, at least one heteroatom (for example, 1 to 5 or 1 to 3, such as 1, 2, 3, 4 or 5 heteroatoms) as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom (for example, 1 to 5 or 1 to 3, such as 1, 2, 3, 4 or 5 heteroatoms) as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. In some embodiments, $C_1$-$C_{60}$ heteroaryl group may be $C_1$-$C_{30}$ heteroaryl group, $C_1$-$C_{24}$ heteroaryl group or $C_1$-$C_{18}$ heteroaryl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having 8 to 60 carbon atoms, such as 8 to 30 or 8 to 24 carbon atoms) having two or more rings condensed with each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms, such as 1 to 30 or 1 to 24 carbon atoms) having two or more rings condensed to each other, at least one heteroatom other than carbon atoms (for example, 1 to 5 or 1 to 3, such as 1, 2, 3, 4 or 5 heteroatoms), as a ring-forming atom, and no aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to $—OA_{102}$ (wherein $A_{102}$ is the $C_6$-$C_{60}$ aryl group), and the term "$C_6$-$C_{60}$ arylthio group" as used herein refers to $—SA_{103}$ (wherein $A_{103}$ is the $C_6$-$C_{60}$ aryl group).

The term "$R_{10a}$" as used may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof, or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$.

In the specification, $Q_1$ to $Q_3$, $Q_{11}$ to $Q_{13}$, $Q_{21}$ to $Q_{23}$ and $Q_{31}$ to $Q_{33}$ may each independently be: hydrogen; deuterium; —F; —CI; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom" as used herein refers to any atom other than a carbon atom and a hydrogen atom. Examples of the heteroatom are O, S, N, P, Si, B, Ge, Se, or any combination thereof.

The term "Ph" as used herein refers to a phenyl group, the term "Me" as used herein refers to a methyl group, the term "Et" as used herein refers to an ethyl group, the term "tert-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a light-emitting device according to embodiments will be described in detail with reference to Examples.

EXAMPLES

Comparative Example 1-1

As a substrate and an anode, a first glass substrate with Corning 15 Ω/cm$^2$ (100 Å) ITO formed thereon, a second glass substrate with (1,000 Å) Ag formed thereon, and a third glass substrate with Corning 15 Ω/cm$^2$ (100 Å) ITO formed thereon were each cut to a size of 50 mm×50 mm×0.7 mm, which were sonicated with isopropyl alcohol and pure water, each for 5 minutes, followed by irradiation with ultraviolet light for 30 minutes and exposure to ozone. The first glass substrate, the second glass substrate, and the third glass substrate were sequentially stacked on a vacuum deposition apparatus.

HAT-CN was deposited on the anode to form a hole injection layer having a thickness of 50 Å, m-MTDATA was deposited on the hole injection layer to form a first hole transport layer having a thickness of 600 Å, and NPB was deposited on the first hole transport layer to form an electron blocking layer having a thickness of 50 Å.

Compound H125 (host) and Compound FD37 (dopant) were co-deposited on the electron blocking layer at a weight ratio of 95:5 to form a first emission layer having a thickness of 200 Å, Compound ET46 (50 Å) was deposited on the first emission layer to form a first buffer layer, and Compound ET47 and LiQ were co-deposited on the first buffer layer at a weight ratio of 5:5 to form a first electron transport layer having a thickness of 300 Å, thereby forming a first emitting unit.

BCP and Li (wherein an amount of Li was 1 wt %) were co-deposited on the first emitting unit to form an n-type charge generation layer having a thickness of 100 Å, and m-MTDATA and Compound P-D1 were deposited on the n-type charge generation layer at a weight ratio of 9:1 to form a p-type charge generation layer having a thickness of 50 Å, thereby forming a first charge generation layer.

m-MTDATA was deposited on the first charge generation layer to form a second hole transport layer having a thickness of 600 Å.

Compound H125 (host) and Compound FD37 (dopant) were co-deposited on the second hole transport layer at a weight ratio of 95:5 to form a second emission layer having a thickness of 200 Å, Compound ET46 (50 Å) was deposited on the second emission layer to form a second buffer layer, and Compound ET47 and LiQ were co-deposited on the second buffer layer at a weight ratio of 5:5 to form a second electron transport layer having a thickness of 300 Å, thereby forming a second emitting unit.

BCP and Li (wherein an amount of Li was 1 wt %) were co-deposited on the second emitting unit to form an n-type charge generation layer having a thickness of 100 Å, and m-MTDATA and Compound P-D1 were deposited on the n-type charge generation layer at a weight ratio of 9:1 to form a p-type charge generation layer having a thickness of 50 Å, thereby forming a second charge generation layer.

m-MTDATA was deposited on the second charge generation layer to form a third hole transport layer having a thickness of 600 Å.

Compound H125 (host) and Compound FD37 (dopant) were co-deposited on the third hole transport layer at a weight ratio of 95:5 to form a third emission layer having a thickness of 200 Å, Compound ET46 (50 Å) was deposited on the third emission layer to form a third buffer layer, and Compound ET47 and LiQ were co-deposited on the third buffer layer at a weight ratio of 5:5 to form a third electron transport layer having a thickness of 300 Å, thereby forming a third emitting unit.

Yb (10 Å) was deposited on the third emitting unit to form an electron injection layer, Ag and Mg (100 Å) were co-deposited on the electron injection layer at a weight ratio of 9:1 to form a cathode, and CP1 (700 Å) was deposited on the cathode, thereby completing the manufacture of a light-emitting device.

Comparative Example 1-2

A light-emitting device was manufactured in the same manner as in Comparative Example 1-1, except that Compound B was used as a host instead of Compound H125.

B

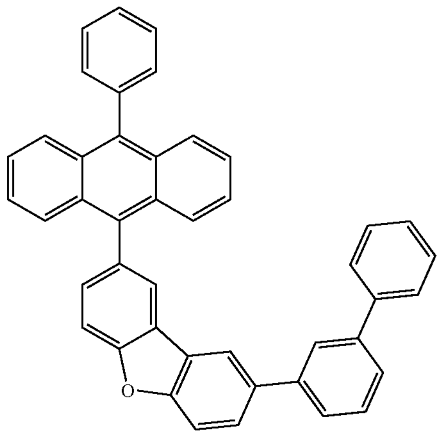

Comparative Example 1-3

A light-emitting device was manufactured in the same manner as in Comparative Example 1-1, except that: Compound H125 and Compound FD37 were co-deposited on the electron blocking layer at a weight ratio of 95:5 to form a bottom emission layer having a thickness of 100 Å, Compound 2 and Compound FD37 were co-deposited at a weight ratio of 95:5 on the bottom emission layer to form a top emission layer having a thickness of 100 Å, thereby forming a first emission layer; a first buffer layer was formed on the first emission layer;

Compound H125 and Compound FD37 were co-deposited on the second hole transport layer at a weight ratio of 95:5 to form a bottom emission layer having a thickness of 100 Å, Compound 2 and Compound FD37 were co-deposited at a weight ratio of 95:5 on the bottom emission layer to form a top emission layer having a thickness of 100 Å, thereby forming a second emission layer; a second buffer layer was formed on the second emission layer, Compound H125 and Compound FD37 were co-deposited on the third hole transport layer at a weight ratio of 95:5 to form a bottom emission layer having a thickness of 100 Å, Compound 2 and Compound FD37 were co-deposited at a weight ratio of 95:5 on the bottom emission layer to form a top emission layer having a thickness of 100 Å, thereby forming a third emission layer; and a third buffer layer was formed on the third emission layer.

Comparative Example 1-4

A light-emitting device was manufactured in the same manner as in Comparative Example 1-3, except that Compound 101 was used instead of m-MTDATA in forming the second hole transport layer and the third hole transport layer:

[Compound 101]

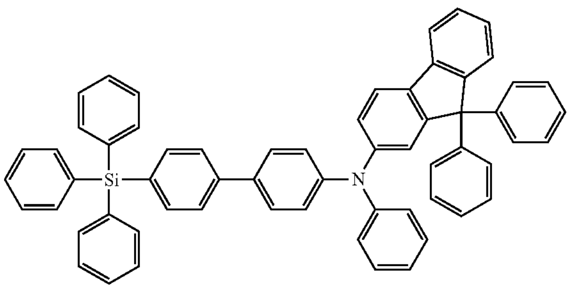

Example 1-1

A light-emitting device was manufactured in the same manner as in Comparative Example 1-3, except that a multi-layered hole transport layer having a sequentially stacked structure in which Compound 101 was used instead of m-MTDATA to form a first non-doped layer having a thickness of 50 Å in forming the second hole transport layer and the third hole transport layer, Compound 101 and Compound P-D1 were co-deposited at a weight ratio of 9:1 to form a doped layer having a thickness of 100 Å, and Compound 101 was used to form a second non-doped layer having a thickness of 50 Å.

Comparative Example 1-5

A light-emitting device was manufactured in the same manner as in Comparative Example 1-3, except that a multi-layered hole transport layer having a sequentially stacked structure in which Compound 101 was used instead of m-MTDATA to form a first non-doped layer having a thickness of 50 Å in forming the first hole transport layer to the third hole transport layer, Compound 101 and Compound P-D1 were co-deposited at a weight ratio of 9:1 to form a doped layer having a thickness of 100 Å, and Compound 101 was used to form a second non-doped layer having a thickness of 50 Å.

Comparative Example 1-6

A light-emitting device was manufactured in the same manner as in Comparative Example 1-3, except that a multi-layered hole transport layer having a sequentially stacked structure in which Compound 101 was used instead of m-MTDATA to form a first non-doped layer having a thickness of 50 Å in forming the first hole transport layer, Compound 101 and Compound P-D1 were co-deposited at a weight ratio of 9:1 to form a doped layer having a thickness of 100 Å, and Compound 101 was used to form a second non-doped layer having a thickness of 50 Å.

Comparative Example 1-7

A light-emitting device was manufactured in the same manner as in Example 1-1, except that Compound H125 (host) and Compound FD37 (dopant) were co-deposited at a weight ratio of 95:5 to form a single emission layer having a thickness of 200 Å in forming the first emission layer to third emission layer.

Evaluation Example 1

Regarding the light-emitting devices manufactured according to Example 1-1 and Comparative Examples 1-1 to 1-7, using a color luminance meter, the Keithley source meter apparatus, and a current clamp meter of measuring lifespan at room temperature, the driving voltage (V) at luminance of 1500 nit, efficiency (cd/A), lifespan ($T_{97}$), and progressive driving voltage ($T_{97}$) were measured. The results are shown in Table 1.

The characteristics, such as driving voltage, efficiency, lifespan, and progressive driving voltage, of the devices of Example 1-1 and Comparative Examples 1-2 to 1-7 were respectively evaluated based on 100% of the driving voltage, efficiency, lifespan, and progressive driving voltage of the Comparative Example 1-1.

TABLE 1

| | First HTL Second HTL Third HTL | Emission layer | Driving voltage (V) | Efficiency (cd/A) | Lifespan ($T_{97}$) | Progressive driving voltage ($T_{97}$) | Luminance (nit) |
|---|---|---|---|---|---|---|---|
| Comparative Example 1-1 | m-MTDATA m-MTDATA m-MTDATA | Single-layered emission layer | 100% | 100% | 100% | 100% (0.70↑) | 1500 |

TABLE 1-continued

| | First HTL Second HTL Third HTL | Emission layer | Driving voltage (V) | Efficiency (cd/A) | Lifespan ($T_{97}$) | Progressive driving voltage ($T_{97}$) | Luminance (nit) |
|---|---|---|---|---|---|---|---|
| Comparative Example 1-2 | m-MTDATA m-MTDATA m-MTDATA | Single-layered emission layer | 120% | 90% | 120% | 120% | 1500 |
| Comparative Example 1-3 | m-MTDATA m-MTDATA m-MTDATA | Double-layered emission layer | 105% | 130% | 250% | 110% | 1500 |
| Comparative Example 1-4 | m-MTDATA 101 101 | Double-layered emission layer | 105% | 130% | 250% | 110% | 1500 |
| Example 1-1 | m-MTDATA 101/101 + P-D1/101 101/101 + P-D1/101 | Double-layered emission layer | 85% | 130% | 250% | 60% | 1500 |
| Comparative Example 1-5 | 101/101 + P-D1/101 101/101 + P-D1/101 101/101 + P-D1/101 | Double-layered emission layer | 125% | 110% | 200% | 150% | 1500 |
| Comparative Example 1-6 | 101/101 + P-D1/101 m-MTDATA m-MTDATA | Double-layered emission layer | 135% | 115% | 200% | 180% | 1500 |
| Comparative Example 1-7 | m-MTDATA 101/101 + P-D1/101 101/101 + P-D1/101 | Single-layered emission layer | | 95% | 105% | 120% | 1500 |

Referring to Table 1, it was confirmed that, compared to the light-emitting devices having a single-layered emission layer structure of Comparative Examples 1-1, 1-2, and 1-7, the light-emitting device of Example 1-1 not only exhibited a significantly low driving voltage, but also showed excellent efficiency and lifespan characteristics.

It was confirmed that, compared to the light-emitting devices of Comparative Examples 1-3 to 1-6 having a double-layered emission layer structure consisting of an emission layer including a deuterium-substituted host and an emission layer including a deuterium-unsubstituted host, the light-emitting device of Example 1-1 exhibited efficiency/lifespan characteristics at a level greater than an equivalent level and had a significantly low driving voltage.

For example, as defined in the disclosure, when a multi-layered hole transport layer was applied only to the emitting unit not adjacent to the anode, compared to the case where a multi-layered hole transport layer was applied to the emitting unit adjacent to the anode, significantly low driving voltage characteristics and the progressive driving voltage characteristics improved by about 40% (0.70 V↑ in Comparative Example 1-1→0.30 V↑ in Example 1-1) were confirmed.

Comparative Example 2-1

A light-emitting device was manufactured in the same manner as in Comparative Example 1-1, except that: BCP and Li (wherein an amount of Li was 1 wt %) were co-deposited on the third emitting unit to form an n-type charge generation layer having a thickness of 100 Å, HAT-CN was deposited on the n-type charge generation layer to form a p-type charge generation layer having a thickness of 50 Å, thereby forming a third charge generation layer;

m-MTDATA(600 Å) was deposited on the third charge generation layer to form a fourth hole transport (HT)-auxiliary layer, TCTA (50 Å) was deposited on the fourth HT-auxiliary layer to form an electron blocking layer, TPBi and PD13 were co-deposited on the electron blocking layer at a weight ratio of 95:5 to form a fourth emission layer having a thickness of 200 Å, ET47 and LiQ were co-deposited on the fourth emission layer at a weight ratio of 5:5 to form a fourth electron transport layer having a thickness of 300 Å, thereby forming a fourth emitting unit; and Yb (10 Å) was deposited on the fourth emitting unit to form an electron injection layer.

Comparative Example 2-2

A light-emitting device was manufactured in the same manner as in Comparative Example 2-1, except that Compound B was used as a host instead of Compound H125.

Comparative Example 2-3

A light-emitting device was manufactured in the same manner as in Comparative Example 2-1, except that: Compound H125 and Compound FD37 were co-deposited on the electron blocking layer at a weight ratio of 95:5 to form a bottom emission layer having a thickness of 100 Å, Compound 2 and Compound FD37 were co-deposited at a weight ratio of 95:5 on the bottom emission layer to form a top emission layer having a thickness of 100 Å, thereby forming a first emission layer; a first buffer layer was formed on the first emission layer;

Compound H125 and Compound FD37 were co-deposited on the second hole transport layer at a weight ratio of 95:5 to form a bottom emission layer having a thickness of 100 Å, Compound 2 and Compound FD37 were co-deposited at a weight ratio of 95:5 on the bottom emission layer to form a top emission layer having a thickness of 100 Å, thereby forming a second emission layer; a second buffer layer was formed on the second emission layer;

Compound H125 and Compound FD37 were co-deposited on the third hole transport layer at a weight ratio of 95:5 to form a bottom emission layer having a thickness of 100 Å, Compound 2 and Compound FD37 were co-deposited at a weight ratio of 95:5 on the bottom emission layer to form a top emission layer having a thickness of 100 Å, thereby forming a third emission layer; and a third buffer layer was formed on the third emission layer.

Comparative Example 2-4

A light-emitting device was manufactured in the same manner as in Comparative Example 2-3, except that Compound 101 was used instead of m-MTDATA in forming the second hole transport layer and the third hole transport layer.

Example 2-1

A light-emitting device was manufactured in the same manner as in Comparative Example 2-3, except that a multi-layered hole transport layer having a sequentially stacked structure in which Compound 101 was used instead of m-MTDATA to form a first non-doped layer having a thickness of 50 Å in forming the second hole transport layer and the third hole transport layer, Compound 101 and Compound P-D1 were co-deposited at a weight ratio of 9:1 to form a doped layer having a thickness of 100 Å, and Compound 101 was used to form a second non-doped layer having a thickness of 50 Å.

Comparative Example 2-5

A light-emitting device was manufactured in the same manner as in Comparative Example 2-3, except that a multi-layered hole transport layer having a sequentially stacked structure in which Compound 101 was used instead of m-MTDATA to form a first non-doped layer having a thickness of 50 Å in forming the first hole transport layer to the third hole transport layer, Compound 101 and Compound P-D1 were co-deposited at a weight ratio of 9:1 to form a doped layer having a thickness of 100 Å, and Compound 101 was used to form a second non-doped layer having a thickness of 50 Å.

Comparative Example 2-6

A light-emitting device was manufactured in the same manner as in Comparative Example 2-3, except that a multi-layered hole transport layer having a sequentially stacked structure in which Compound 101 was used instead of m-MTDATA to form a first non-doped layer having a thickness of 50 Å in forming the first hole transport layer, Compound 101 and Compound P-D1 were co-deposited at a weight ratio of 9:1 to form a doped layer having a thickness of 100 Å, and Compound 101 was used to form a second non-doped layer having a thickness of 50 Å.

Comparative Example 2-7

A light-emitting device was manufactured in the same manner as in Example 2-1, except that Compound H125 (host) and Compound FD37 (dopant) were co-deposited at a weight ratio of 95:5 to form a single emission layer having a thickness of 200 Å in forming the first emission layer to third emission layer.

Evaluation Example 2

Regarding the light-emitting devices manufactured according to Example 2-1 and Comparative Examples 2-1 to 2-7, using a color luminance meter, the Keithley source meter apparatus, and a current clamp meter of measuring lifespan at room temperature, the driving voltage (V) at luminance of 1500 nit, efficiency (cd/y), lifespan ($T_{97}$), and progressive driving voltage ($T_{97}$) were measured. The results are shown in Table 2.

The characteristics, such as driving voltage, efficiency, lifespan, and progressive driving voltage, of the devices of Example 2-1 and Comparative Examples 2-2 to 2-7 were respectively evaluated based on 100% of the driving voltage, efficiency, lifespan, and progressive driving voltage of the Comparative Example 2-1.

TABLE 2

| | First hole transport layer (HTL) Second HTL Third HTL | Emission layer | Driving voltage (V) | Efficiency (cd/A) | Lifespan (T97) | Progressive driving voltage (T97) | Luminance (nit) |
|---|---|---|---|---|---|---|---|
| Comparative Example 2-1 | m-MTDATA m-MTDATA m-MTDATA | Single-layered emission layer | 100% | 100% | 100% | 100% | 1500 |
| Comparative Example 2-2 | m-MTDATA m-MTDATA m-MTDATA | Single-layered emission layer | 125% | 90% | 115% | 125% | 1500 |
| Comparative Example 2-3 | m-MTDATA m-MTDATA m-MTDATA | Double-layered emission layer | 115% | 130% | 260% | 110% | 1500 |
| Comparative Example 2-4 | m-MTDATA 101 101 | Double-layered emission layer | 115% | 130% | 260% | 110% | 1500 |

TABLE 2-continued

| | First hole transport layer (HTL) Second HTL Third HTL | Emission layer | Driving voltage (V) | Efficiency (cd/A) | Lifespan (T97) | Progressive driving voltage (T97) | Luminance (nit) |
|---|---|---|---|---|---|---|---|
| Example 2-1 | m-MTDATA 101/101 + P-D1/101 101/101 + P-D1/101 | Double-layered emission layer | 85% | 130% | 250% | 70% | 1500 |
| Comparative Example 2-5 | 101/101 + P-D1/101 101/101 + P-D1/101 101/101 + P-D1/101 | Double-layered emission layer | 130% | 110% | 200% | 150% | 1500 |
| Comparative Example 2-6 | 101/101 + P-D1/101 m-MTDATA m-MTDATA | Double-layered emission layer | 145% | 110% | 200% | 200% | 1500 |
| Comparative Example 2-7 | m-MTDATA 101/101 + P-D1/101 101/101 + P-D1/101 | Single-layered emission layer | 95% | 95% | 105% | 115% | 1500 |

Referring to Table 2, it was confirmed that, compared to the light-emitting devices having a single-layered emission layer structure of Comparative Examples 2-1, 2-2, and 2-7, the light-emitting device of Example 2-1 not only exhibited a significantly low driving voltage, but also showed excellent efficiency and lifespan characteristics.

It was confirmed that, compared to the light-emitting devices of Comparative Examples 2-3 to 2-6 having a double-layered emission layer structure consisting of an emission layer including a deuterium-substituted host and an emission layer including a deuterium-unsubstituted host, the light-emitting device of Example 2-1 exhibited efficiency/lifespan characteristics at a level greater than an equivalent level and had a significantly low driving voltage.

Thus, as defined in the disclosure, when a multi-layered hole transport layer was applied only to the emitting unit not adjacent to the anode, compared to the case where a multi-layered hole transport layer was applied to the emitting unit adjacent to the anode, significantly low driving voltage characteristics and improved progressive driving voltage characteristics were confirmed.

According to the embodiments, a light-emitting device may have a low driving voltage, high efficiency, and a long lifespan.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the claims.

What is claimed is:

1. A light-emitting device comprising:

an anode;

a cathode facing the anode;

m emitting units disposed between the anode and the cathode; and m−1 charge generation layers disposed between two adjacent ones of the m emitting units and each including an n-type charge generation layer and a p-type charge generation layer, wherein m is an integer of 2 or more, each of the m emitting units comprises a hole transport region, an emission layer, and an electron transport region that are sequentially disposed, at least one emission layer of the m emitting units comprises a first emission layer and a second emission layer that are sequentially disposed between the anode and the cathode, at least one hole transport region adjacent to the p-type charge generation layer of each of the m−1 charge generation layers comprises a multi-layered hole transport layer consisting of a first non-doped layer, a doped layer, and a second non-doped layer that are sequentially stacked, the first non-doped layer and the second non-doped layer each independently consist of a hole transport material, the doped layer comprises a hole transport material and a p-dopant, a hole transport region adjacent to the anode does not comprise the multi-layered hole transport layer, and the p-dopant is a quinone derivative or a cyano group-containing compound.

2. The light-emitting device of claim 1, wherein m is an integer of 3 or more.

3. The light-emitting device of claim 1, wherein each hole transport region comprises a hole injection layer, a hole transport layer, an emission auxiliary layer, an electron blocking layer, or a combination thereof, each electron transport region comprises a buffer layer, a hole blocking layer, an electron transport layer, an electron injection layer, or a combination thereof, and the at least one hole transport region comprising the multi-layered hole transport layer does not comprise an emission auxiliary layer and an electron blocking layer.

4. The light-emitting device of claim 1, wherein a highest occupied molecular orbital (HOMO) energy level of the multi-layered hole transport layer is in a range of about −5.5 eV to about −5.25 eV.

5. The light-emitting device of claim 1, wherein the multi-layered hole transport layer is adjacent to an emission layer.

6. The light-emitting device of claim 5, wherein the emission layer adjacent to the multi-layered hole transport layer comprises the first emission layer and the second emission layer.

7. The light-emitting device of claim 1, wherein an amount of the p-dopant included in the doped layer of the multi-layered hole transport layer is in a range of about 0.1 wt % to about 20 wt % based on the total weight of the doped layer.

8. The light-emitting device of claim 1, wherein a thickness of the doped layer of the multi-layered hole transport layer is less than about 80% of a total thickness of the multi-layered hole transport layer.

9. The light-emitting device of claim 1, wherein the second non-doped layer of the multi-layered hole transport layer is adjacent to an emission layer, and a thickness of the second non-doped layer is equal to or greater than about 20% of a total thickness of the multi-layered hole transport layer.

10. The light-emitting device of claim 1, wherein the hole transport materials included in the first non-doped layer, the doped layer, and the second non-doped layer are identical to or different from each other.

11. The light-emitting device of claim 1, wherein the first emission layer comprises a first compound comprising at least one deuterium, and the second emission layer comprises a second compound that does not comprise deuterium.

12. The light-emitting device of claim 1, wherein the first emission layer comprises a first dopant, the second emission layer comprises a second dopant, and the first dopant and the second dopant are identical to or different from each other.

13. The light-emitting device of claim 1, wherein a maximum luminescence wavelength of light emitted from at least one emitting unit of the m emitting units is different from a maximum luminescence wavelength of light emitted from at least one emitting unit of the remaining emitting units.

14. The light-emitting device of claim 1, wherein light emitted from each of the m emitting units have the same maximum luminescence wavelength.

15. The light-emitting device of claim 1, wherein the at least one emission layer of the m emitting units that comprises the first emission layer and the second emission layer emits blue light having a maximum luminescence wavelength in a range of about 440 nm to about 510 nm.

16. The light-emitting device of claim 1, wherein the emitting unit comprising the multi-layered hole transport layer emits blue light having a maximum luminescence wavelength in a range of about 440 nm to about 510 nm.

17. The light-emitting device of claim 1, further comprising at least one of:

a first capping layer disposed outside the anode; and a second capping layer disposed outside the cathode, wherein at least one of the first capping layer and the second capping layer has a refractive index of greater than or equal to about 1.6 at a wavelength of 589 nm.

18. An electronic apparatus comprising the light-emitting device of claim 1.

19. The electronic apparatus of claim 18, further comprising:

a sealing portion disposed on the light-emitting device; and a touch screen layer, a polarizing layer, a color filter, a color conversion layer, or a combination thereof, disposed on the sealing portion.

20. The electronic apparatus of claim 18, further comprising quantum dots or an optical member comprising the quantum dots, wherein the quantum dots or the optical member comprising the quantum dots are disposed on at least one traveling direction of light emitted from the light-emitting device.

21. The electronic apparatus of claim 18, wherein the electronic apparatus is a display, a light source, lighting, a personal computer, a mobile personal computer, a mobile phone, a digital camera, an electronic organizer, an electronic dictionary, an electronic game machine, a medical instrument, an electronic thermometer, a sphygmomanometer, a blood glucose meter, a pulse measurement apparatus, a pulse wave measurement apparatus, an electrocardiogram display, an ultrasonic diagnostic apparatus, an endoscope display, a fish finder, a measuring instrument, a meter for a vehicle, a meter for an aircraft, a meter for a vessel, or a projector.

* * * * *